(12) United States Patent
Jiang et al.

(10) Patent No.: US 10,833,705 B2
(45) Date of Patent: Nov. 10, 2020

(54) INFORMATION BIT DISTRIBUTION DESIGN FOR POLAR CODES

(71) Applicant: QUALCOMM Incorporated, San Diego, CA (US)

(72) Inventors: Jing Jiang, San Diego, CA (US); Gabi Sarkis, San Diego, CA (US); Yang Yang, San Diego, CA (US); Peter Gaal, San Diego, CA (US); Joseph Binamira Soriaga, San Diego, CA (US); Shrinivas Kudekar, Raritan, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/051,262

(22) Filed: Jul. 31, 2018

(65) Prior Publication Data

US 2019/0044540 A1    Feb. 7, 2019

Related U.S. Application Data

(60) Provisional application No. 62/544,898, filed on Aug. 13, 2017, provisional application No. 62/540,491, filed on Aug. 2, 2017.

(51) Int. Cl.
*H03M 13/00* (2006.01)
*H03M 13/13* (2006.01)
(Continued)

(52) U.S. Cl.
CPC ......... *H03M 13/136* (2013.01); *H03M 13/13* (2013.01); *H03M 13/2796* (2013.01);
(Continued)

(58) Field of Classification Search
CPC ............... H03M 13/136; H03M 13/13; H03M 13/2796; H03M 13/353
See application file for complete search history.

(56) References Cited

U.S. PATENT DOCUMENTS 9,362,950 B2 * 6/2016 Wiley ................. H03M 13/091
10,171,204 B2 * 1/2019 Wu ........................ H04L 1/0068
(Continued)

OTHER PUBLICATIONS

International Search Report and Written Opinion—PCT/US2018/044860—ISA/EPO—dated Nov. 12, 2018.
(Continued)

*Primary Examiner* — Esaw T Abraham
(74) *Attorney, Agent, or Firm* — Michael J. DeHaemer, Jr.

(57) ABSTRACT

A wireless device (e.g., a base station or user equipment (UE)) may encode a codeword using a polar code for transmission over a wireless channel. The device may identify a set of bit locations of the polar code for a set of information bits based on a bit index reliability sequence. The bit index reliability sequence may be based on applying an ordered combination of a universal partial order, an analytical method, and a simulation. The bit index reliability sequence may be determined based on a binary bit weighting for the set of bit channels that applies one or more weighting factors. In some cases, the device may store the bit index reliability sequence in a lookup table for encoding, decoding, or both. A device receiving the transmitted codeword may similarly utilize the bit index reliability sequence to decode the codeword and determine the transmitted information bits.

30 Claims, 37 Drawing Sheets

(51) Int. Cl.
*H04L 1/00* (2006.01)
*H03M 13/35* (2006.01)
*H03M 13/27* (2006.01)
*H04W 72/04* (2009.01)

(52) U.S. Cl.
CPC ........ *H03M 13/353* (2013.01); *H04L 1/0057* (2013.01); *H04L 1/0069* (2013.01); *H04W 72/0466* (2013.01)

(56) References Cited

U.S. PATENT DOCUMENTS

| | | | | |
|---|---|---|---|---|
| 10,193,578 | B2* | 1/2019 | Gross | H03M 13/09 |
| 10,291,264 | B2* | 5/2019 | Zhang | H03M 13/13 |
| 10,312,946 | B2* | 6/2019 | Wang | H04L 1/0071 |

OTHER PUBLICATIONS

LG Electronics: "Discussion of Rate Matching for Polar Codes", 3GPP Draft, R1-1707675 Discussion of Rate Matching for Polar Codes Final, 3rd Generation Partnership Project (3GPP), Mobile Competence Centre, 650, Route Des Lucioles, F-06921 Sophia-Antipolis Cedex, vol. RAN WG1, No. Hangzhou, China, May 15, 2017-May 19, 2017, May 14, 2017 (May 14, 2017), XP051272882, 5 Pages, Retrieved from the Internet: URL:http://www.3gpp.org/ftp/Meetings_3GPP_SYNC/RAN1/Docs/ [retrieved on May 14, 2017].
Nokia et al., "Sequence Design for Polar Codes", 3GPP Draft, R1-1711542 Sequence Design for Polar, 3rd Generation Partnership Project (3GPP), Mobile Competence Centre, 650, Route Des Lucioles, F-06921 Sophia-Antipolis Cedex, France, vol. RAN WG1, No. Qingdao, P.R. China, Jun. 27, 2017-Jun. 30, 2017 Jun. 19, 2017 (Jun. 19, 2017), XP051305709, 13 Pages, Retrieved from the Internet: URL:http://www.3gpp.org/ftp/tsg_ran/WG1_RL1/TSGR1_AH/NR_AH_1706/Docs/ [retrieved on—Jun. 19, 2017].

Hamed H.S., et al., "Universal Polar Codes," IEEE International Symposium on Information Theory, Jun. 29, 2014, pp. 1451-1455, XP032635600.
He G., et al., "β-expansion: A Theoretical Framework for Fast and Recursive Construction of Polar Codes", IEEE Global Communications Conference on Information Theory, Apr. 19, 2017, 7 Pages.
International Search Report and Written Opinion—PCT/US2018/044860—ISA/EPO—Nov. 12, 2018.
LG Electronics: "Discussion of Rate Matching for Polar Codes", 3GPP Draft, R1-1707675 Discussion of Rate Matching for Polar Codes Final, 3rd Generation Partnership Project (3GPP), Mobile Competence Centre, 650, Route Des Lucioles, F-06921 Sophia-Antipolis Cedex, vol. RAN WG1, No. Hangzhou, China, 20170515-20170519, May 14, 2017 (May 14, 2017), XP051272882, 5 Pages, Retrieved from the Internet: URL:http://www.3gpp.org/ftp/Meetings_3GPP_SYNC/RAN1/Docs/ [retrieved on May 14, 2017].
Mondelli M., et al., "Construction of Polar Codes with Sublinear Complexity", IEEE International Symposium on Information Theory, (ISIT), Jun. 25, 2017, XP033140411, pp. 1853-1857, DOI: 10.1109/ISIT.2017.8006850 [retrieved on Aug. 9, 2017].
Nokia et al., "Sequence Design for Polar Codes", 3GPP Draft, R1-1711542 Sequence Design for Polar, 3rd Generation Partnership Project (3GPP), Mobile Competence Centre, 650, Route Des Lucioles, F-06921 Sophia-Antipolis Cedex, France, vol. RAN WG1, No. Qingdao, P.R. China, 20170627-20170630 Jun. 19, 2017 (Jun. 19, 2017), XP051305709, 13 Pages, Retrieved from the Internet: URL:http://www.3gpp.org/ftp/tsg_ran/WG1_RL1/TSGR1_AH/NR_AH_1706/Docs/ [retrieved on Jun. 19, 2017].
Schurch C., "A Partial Order for the Synthesized Channels of a Polar Code", IEEE International Symposium on Information Theory, (ISIT), IEEE, Jul. 10, 2016, XP032940235, pp. 220-224, DOI: 10.1109/ISIT.2016.7541293 [retrieved on Aug. 10, 2016].
Wang W., et al., "Efficient Construction of Polar Codes", 13th International Wireless Communicatins and Mobile Computing Conference (IWCMC), IEEE, Jun. 26, 2017, XP033125473, pp. 1594-1598, DOI: 10.1109/IWCMC.2017.7986522 [retrieved on Jul. 19, 2017].

* cited by examiner

INFORMATION BIT DISTRIBUTION DESIGN FOR POLAR CODES

CROSS REFERENCES

The present application for patent claims the benefit of U.S. Provisional Patent Application No. 62/540,491 by Jiang, et al., entitled "Polar Sequence Design by Reliability Coefficients Optimization and Information Bit Distribution Optimization," filed Aug. 2, 2017 and to U.S. Provisional Patent Application No. 62/544,898 by Jiang, et al., entitled "Information Bit Distribution Optimization for Polar Codes," filed Aug. 13, 2017, assigned to the assignee hereof, and expressly incorporated herein.

BACKGROUND

The following relates generally to wireless communication, and more specifically to polar sequence design based on coefficient reliability and improved information bit distribution.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as a Long Term Evolution (LTE) systems or LTE-Advanced (LTE-A) systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

Wireless communications, however, often involves sending data over a noisy communication channel. To combat noise, a transmitter may encode data in the form of code blocks using error correcting codes to introduce redundancy in the code block so that transmission errors may be detected and/or corrected. Some examples of encoding algorithms with error correcting codes include convolutional codes (CCs), low-density parity-check (LDPC) codes, and polar codes. A polar code is an example of a linear block error correcting code and is constructed using channel polarization techniques. Channel polarization takes independent copies of a transmission channel and transforms the copies into a set of reliable channels and a set of unreliable channels. Information bits are transmitted in the reliable channels and bits known a priori by the transmitter and receiver are transmitted in the unreliable channels. A polar code has been shown to approach the theoretical channel capacity as the code length approaches infinity. Conventional techniques for selecting reliable channels are deficient.

SUMMARY

The described techniques relate to improved methods, systems, devices, apparatuses, or products by processes that support polar sequence design based on coefficient reliability and improved information bit distribution. Generally, the described techniques provide improved techniques for identifying a reliability order for channels of a polar code and information bit distribution design. A transmitter, such as a base station, may determine a bit index reliability sequence for a set of bit channels of a polar code based on a length of the codeword. Some examples described herein determine a reliability order based on hybrid polarization weighting factors. The hybrid polarization weighting factors may be applied using nested sequence generation. Additionally or alternatively, hybrid bit index weighting factors may be applied for a polarization weight function. Additional examples described herein calculate a partial order under a Universal Partial Order (UPO) of an input search sequence for determining a reliability sequence of channels of a polar code.

An order of bit indices in the bit index reliability sequence may be determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders. The transmitter may generate the codeword according to the polar code based on the bit index reliability sequence and a set of information bits encoded using the polar code, and may transmit the codeword over a wireless channel. A receiver, such as a user equipment (UE), may receive the codeword over the wireless channel, select the bit index reliability sequence based on a length of the codeword, and decode the codeword based on the bit index reliability sequence.

A method of wireless communication is described. The method may include receiving a codeword over a wireless channel, where the codeword is based on multiple information bits encoded using a polar code having multiple bit channels, identifying a set of bit locations of the multiple bit channels of the polar code for the multiple information bits based on a bit index reliability sequence, where the bit index reliability sequence is determined based on a binary bit weighting for the multiple bit channels that applies multiple weighting factors, and decoding the received codeword according to the polar code to obtain an information bit vector at the set of bit locations.

An apparatus for wireless communication is described. The apparatus may include means for receiving a codeword over a wireless channel, where the codeword is based on multiple information bits encoded using a polar code having multiple bit channels, means for identifying a set of bit locations of the multiple bit channels of the polar code for the multiple information bits based on a bit index reliability sequence, where the bit index reliability sequence is determined based on a binary bit weighting for the multiple bit channels that applies multiple weighting factors, and means for decoding the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive a codeword over a wireless channel, where the codeword is based on multiple information bits encoded using a polar code having multiple bit channels, identify a set of bit locations of the multiple bit channels of the polar code for the multiple information bits based on a bit index reliability sequence, where the bit index reliability sequence is determined based on a binary bit weighting for the multiple bit channels that applies multiple weighting factors, and decode the received codeword according to the polar code to obtain an information bit vector at the set of bit locations.

A non-transitory computer readable medium for wireless communication is described. The non-transitory computer-readable medium may include instructions operable to cause a processor to receive a codeword over a wireless channel, where the codeword is based on multiple information bits encoded using a polar code having multiple bit channels, identify a set of bit locations of the multiple bit channels of the polar code for the multiple information bits based on a bit index reliability sequence, where the bit index reliability sequence is determined based on a binary bit weighting for the multiple bit channels that applies multiple weighting factors, and decode the received codeword according to the polar code to obtain an information bit vector at the set of bit locations.

In some examples of the method, apparatus, and non-transitory computer-readable medium described above, the bit index reliability sequence may be determined by: performing the binary bit weighting using a first weighting factor to obtain a first reliability sequence for the multiple bit channels. Some examples of the method, apparatus, and non-transitory computer-readable medium described above may further include processes, features, means, or instructions for modifying a subset of the first reliability sequence by performing the binary bit weighting using a second weighting factor to obtain a second reliability sequence for the subset of the first reliability sequence.

In some examples of the method, apparatus, and non-transitory computer-readable medium described above, the bit index reliability sequence may be determined by: modifying a subset of the second reliability sequence by performing the binary bit weighting using a third weighting factor to obtain a third reliability sequence for the subset of the second reliability sequence.

In some examples of the method, apparatus, and non-transitory computer-readable medium described above, the subset of the first reliability sequence includes the multiple bit channels having lowest bit-channel indices in the first reliability sequence.

In some examples of the method, apparatus, and non-transitory computer-readable medium described above, the subset of the first reliability sequence includes the multiple bit channels having highest bit-channel indices in the first reliability sequence.

In some examples of the method, apparatus, and non-transitory computer-readable medium described above, the bit index reliability sequence may be determined by: performing the binary bit weighting using a first weighting factor for a first subset of bit indices and a second weighting factor for a second subset of bit indices.

In some examples of the method, apparatus, and non-transitory computer-readable medium described above, the bit index reliability sequence may be determined by: performing the binary bit weighting using a third weighting factor for a third subset of bit indices.

A method of wireless communication is described. The method may include identifying multiple information bits for encoding using a polar code having multiple bit channels, identifying a set of bit locations of the multiple bit channels of the polar code for the multiple information bits based on a bit index reliability sequence, where the bit index reliability sequence is determined based on a binary bit weighting for the multiple bit channels that applies multiple weighting factors, generating a codeword according to the polar code based on the bit index reliability sequence and the multiple information bits, and transmitting the codeword.

An apparatus for wireless communication is described. The apparatus may include means for identifying multiple information bits for encoding using a polar code having multiple bit channels, means for identifying a set of bit locations of the multiple bit channels of the polar code for the multiple information bits based on a bit index reliability sequence, where the bit index reliability sequence is determined based on a binary bit weighting for the multiple bit channels that applies multiple weighting factors, means for generating a codeword according to the polar code based on the bit index reliability sequence and the multiple information bits, and means for transmitting the codeword.

Another apparatus for wireless communication is described. The apparatus may include a processor, memory in electronic communication with the processor, and instructions stored in the memory. The instructions may be operable to cause the processor to identify multiple information bits for encoding using a polar code having multiple bit channels, identify a set of bit locations of the multiple bit channels of the polar code for the multiple information bits based on a bit index reliability sequence, where the bit index reliability sequence is determined based on a binary bit weighting for the multiple bit channels that applies multiple weighting factors, generate a codeword according to the polar code based on the bit index reliability sequence and the multiple information bits, and transmit the codeword.

A non-transitory computer readable medium for wireless communication is described. The non-transitory computer-readable medium may include instructions operable to cause a processor to identify multiple information bits for encoding using a polar code having multiple bit channels, identify a set of bit locations of the multiple bit channels of the polar code for the multiple information bits based on a bit index reliability sequence, where the bit index reliability sequence is determined based on a binary bit weighting for the multiple bit channels that applies multiple weighting factors, generate a codeword according to the polar code based on the bit index reliability sequence and the multiple information bits, and transmit the codeword.

In some examples of the method, apparatus, and non-transitory computer-readable medium described above, the bit index reliability sequence may be determined based on performing the binary bit weighting using a first weighting factor to obtain a first reliability sequence for the multiple bit channels. Some examples of the method, apparatus, and non-transitory computer-readable medium described above may further include processes, features, means, or instructions for modifying a subset of the first reliability sequence by performing the binary bit weighting using a second weighting factor to obtain a second reliability sequence for the subset of the first reliability sequence.

In some examples of the method, apparatus, and non-transitory computer-readable medium described above, the bit index reliability sequence may be determined based on modifying a subset of the second reliability sequence by performing the binary bit weighting using a third weighting factor to obtain a third reliability sequence for the subset of the second reliability sequence.

In some examples of the method, apparatus, and non-transitory computer-readable medium described above, the subset of the first reliability sequence includes the multiple bit channels having lowest bit-channel indices in the first reliability sequence.

In some examples of the method, apparatus, and non-transitory computer-readable medium described above, the subset of the first reliability sequence includes the multiple bit channels having highest bit-channel indices in the first reliability sequence.

In some examples of the method, apparatus, and non-transitory computer-readable medium described above, the bit index reliability sequence may be determined based on performing the binary bit weighting using a first weighting factor for a first subset of bit indices and a second weighting factor for a second subset of bit indices.

In some examples of the method, apparatus, and non-transitory computer-readable medium described above, the bit index reliability sequence may be determined based on performing the binary bit weighting using a third weighting factor for a third subset of bit indices.

A method of wireless communication is described. The method may include receiving a codeword over a wireless channel, where the codeword is based on multiple information bits encoded using a polar code having multiple bit channels, selecting a bit index reliability sequence for the multiple bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, and decoding the codeword based on the bit index reliability sequence.

An apparatus for wireless communication is described. The apparatus may include means for receiving a codeword over a wireless channel, where the codeword is based on multiple information bits encoded using a polar code having multiple bit channels, means for selecting a bit index reliability sequence for the multiple bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, and means for decoding the codeword based on the bit index reliability sequence.

Another apparatus for wireless communication is described. The apparatus may include a processor, memory in electronic communication with the processor, and instructions stored in the memory. The instructions may be operable to cause the processor to receive a codeword over a wireless channel, where the codeword is based on multiple information bits encoded using a polar code having multiple bit channels, select a bit index reliability sequence for the multiple bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, and decode the codeword based on the bit index reliability sequence.

A non-transitory computer readable medium for wireless communication is described. The non-transitory computer-readable medium may include instructions operable to cause a processor to receive a codeword over a wireless channel, where the codeword is based on multiple information bits encoded using a polar code having multiple bit channels, select a bit index reliability sequence for the multiple bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, and decode the codeword based on the bit index reliability sequence.

A memory of an apparatus for wireless communication is described. Instructions may be stored in the memory and operable, when executed by a processor of the apparatus, to cause the apparatus to receive, over a wireless channel, a codeword that is based on a set of information bits encoded using a polar code having a set of bit channels, select a bit index reliability sequence for the set of bit channels based on a length of the codeword, and decode the codeword based on a bit index reliability sequence, wherein an order of bit indices in the bit index reliability sequence is determined by a process that includes applying a UPO to an input search sequence to obtain a partial order, applying an analytical method to obtain calculated relative orders of bit indices not ordered in the partial order, and applying a simulation to refine an order of at least two bit indices selected based on the calculated relative orders.

In some examples of the method, apparatus, non-transitory computer-readable medium, and memory of an apparatus described above, decoding the codeword includes: applying successive cancellation list decoding algorithm to a signal that includes the codeword.

In some examples of the method, apparatus, non-transitory computer-readable medium, and memory of an apparatus described above, the simulation may be based on a list size applied by the successive cancellation list decoding algorithm.

In some examples of the method, apparatus, non-transitory computer-readable medium, and memory of an apparatus described above, the simulation may be a link-level performance simulation.

In some examples of the method, apparatus, non-transitory computer-readable medium, and memory of an apparatus described above, the analytical method may be an index polarization weight rule, or a Reed-Muller rule, or a density evolution (DE) rule, or a mutual information-DE (MI-DE) rule, or any combination thereof.

In some examples of the method, apparatus, non-transitory computer-readable medium, and memory of an apparatus described above, the order of bit indices in the reliability sequence may be determined based on: selecting a bit index from the input search sequence based on the partial order. Some examples of the method, apparatus, non-transitory computer-readable medium, and memory of an apparatus described above may further include processes, features, means, or instructions for adding the selected bit index to the bit index reliability sequence.

Some examples of the method, apparatus, non-transitory computer-readable medium, and memory of an apparatus described above may further include processes, features, means, or instructions for removing the selected bit index from the input search sequence to generate an input search subsequence. Some examples of the method, apparatus, non-transitory computer-readable medium, and memory of an apparatus described above may further include processes, features, means, or instructions for calculating a second partial order under the UPO of the input search subsequence. Some examples of the method, apparatus, non-transitory computer-readable medium, and memory of an apparatus described above may further include processes, features, means, or instructions for selecting a bit index from the input search subsequence based on the second partial order.

In some examples of the method, apparatus, non-transitory computer-readable medium, and memory of an apparatus described above, the UPO includes a first property and a second property, where the calculated relative orders of bit indices violates at least one of the first property or the second property.

Some examples of the method, apparatus, non-transitory computer-readable medium, and memory of an apparatus described above may further include processes, features, means, or instructions for modifying a portion of the bit index reliability sequence using a second sequence to generate a modified bit index reliability sequence, where decoding the codeword includes: decoding the codeword based on the modified bit index reliability sequence.

A method of wireless communication is described. The method may include determining a bit index reliability sequence for multiple bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, generating the codeword according to the polar code based on the bit index reliability sequence and multiple information bits encoded using the polar code, and transmitting the codeword.

An apparatus for wireless communication is described. The apparatus may include means for determining a bit index reliability sequence for multiple bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, means for generating the codeword according to the polar code based on the bit index reliability sequence and multiple information bits encoded using the polar code, and means for transmitting the codeword.

Another apparatus for wireless communication is described. The apparatus may include a processor, memory in electronic communication with the processor, and instructions stored in the memory. The instructions may be operable to cause the processor to determine a bit index reliability sequence for multiple bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, generate the codeword according to the polar code based on the bit index reliability sequence and multiple information bits encoded using the polar code, and transmit the codeword.

A non-transitory computer readable medium for wireless communication is described. The non-transitory computer-readable medium may include instructions operable to cause a processor to determine a bit index reliability sequence for multiple bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, generate the codeword according to the polar code based on the bit index reliability sequence and multiple information bits encoded using the polar code, and transmit the codeword.

In some examples of the method, apparatus, and non-transitory computer-readable medium described above, the simulation may be a link-level performance simulation.

In some examples of the method, apparatus, and non-transitory computer-readable medium described above, the analytical method includes an index polarization weight rule, or a Reed-Muller rule, or a DE rule, or an MI-DE rule, or any combination thereof.

In some examples of the method, apparatus, and non-transitory computer-readable medium described above, the order of bit indices in the bit index reliability sequence is further determined based on selecting a bit index from the input search sequence based on the partial order. Some examples of the method, apparatus, and non-transitory computer-readable medium described above may further include processes, features, means, or instructions for adding the selected bit index to the bit index reliability sequence.

Some examples of the method, apparatus, and non-transitory computer-readable medium described above may further include processes, features, means, or instructions for removing the selected bit index from the input search sequence to generate an input search subsequence, calculating a second partial order under the UPO of the input search subsequence, and selecting a bit index from the input search subsequence based on the second partial order.

In some examples of the method, apparatus, and non-transitory computer-readable medium described above, the UPO includes a first property and a second property, where the calculated relative orders of bit indices violates at least one of the first property or the second property.

Some examples of the method, apparatus, and non-transitory computer-readable medium described above may further include processes, features, means, or instructions for modifying a portion of the bit index reliability sequence using a second sequence to generate a modified bit index reliability sequence, where generating the codeword includes generating the codeword based on the modified bit index reliability sequence.

Described techniques improve bit allocation at a quantization boundary. Bit channels of a polar code may be recursively partition at one or more polarization stages of the polar code using a baseline rate allocation rule. The baseline rate allocation rule may have ceiling and floor operations that control the number of information bits to allocate to a partition. At the quantization boundary, a bit may be allocated to one of multiple partitions. One or more quantization rules may be applied for determining whether to assign a number of bits to a bit channel partition to a fixed value. In some examples, assigning information bits to a partition may be adjusted to be compliant with a UPO.

In some examples, a transmitter, such as a base station or a user equipment, may identify a set of bit locations of a polar code for a set of information bits. The set of bit locations may be determined based on a recursive partitioning of a set of bit channels of the polar code for at least a subset of polarization stages of the polar code. For each partition of the at least the subset of the polarization stages of the polar code, portions of a number of the information bits of each partition may be assigned to bit channel sub-partitions. In some examples, at least one quantization rule may be applied for determining whether to assign a first number of the information bits of a first bit channel sub-partition of the bit channel sub-partitions to a fixed value. In some examples, assigning portions of a number of the information bits of each partition to bit channel sub-partitions may include adjusting the information bit allocation derived based on the recursive partitioning to be compliant with a UPO. The transmitter may encode a codeword according to the polar code based on the set of bit locations, and transmit the encoded codeword over the wireless channel. A receiver, such as a base station or a user equipment, may receive the codeword over the wireless channel, identify the set of bit locations of the polar code for a set of information bits, and decode the received codeword according to the polar code to obtain an information bit vector at the set of bit locations.

A method of wireless communication is described. The method may include encoding a codeword using a polar code for a transmission over a wireless channel, where the codeword includes an information bit vector including multiple information bits, identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel sub-partition of the bit channel sub-partitions to a fixed value, and transmitting the encoded codeword over the wireless channel according to the polar code based on the set of bit locations.

An apparatus for wireless communication is described. The apparatus may include means for encoding a codeword using a polar code for a transmission over a wireless channel, where the codeword includes an information bit vector including multiple information bits, means for identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel sub-partition of the bit channel sub-partitions to a fixed value, and means for transmitting the encoded codeword over the wireless channel according to the polar code based on the set of bit locations.

Another apparatus for wireless communication is described. The apparatus may include a processor, memory in electronic communication with the processor, and instructions stored in the memory. The instructions may be operable to cause the processor to encode a codeword using a polar code for a transmission over a wireless channel, where the codeword includes an information bit vector including multiple information bits, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel sub-partition of the bit channel sub-partitions to a fixed value, and transmit the encoded codeword over the wireless channel according to the polar code based on the set of bit locations.

A non-transitory computer readable medium for wireless communication is described. The non-transitory computer-readable medium may include instructions operable to cause a processor to encode a codeword using a polar code for a transmission over a wireless channel, where the codeword includes an information bit vector including multiple information bits, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel sub-partition of the bit channel sub-partitions to a fixed value, and transmit the encoded codeword over the wireless channel according to the polar code based on the set of bit locations.

In some examples of the method, apparatus, and non-transitory computer-readable medium described above, a first quantization rule of the at least one quantization rule sets the first number to the fixed value as a function of a capacity of the first bit channel sub-partition.

In some examples of the method, apparatus, and non-transitory computer-readable medium described above, the first quantization rule applies a threshold that may be dependent on a number of bit channels of each partition.

In some examples of the method, apparatus, and non-transitory computer-readable medium described above, the threshold may be selected to maintain a UPO of the bit channels of each partition.

In some examples of the method, apparatus, and non-transitory computer-readable medium described above, a first quantization rule of the at least one quantization rule sets the first number to the fixed value as a function of a code rate of each partition.

In some examples of the method, apparatus, and non-transitory computer-readable medium described above, the function may be selected to maintain a UPO of the bit channels of each partition.

In some examples of the method, apparatus, and non-transitory computer-readable medium described above, the fixed value may be a function of a number of bit channels of each partition.

In some examples of the method, apparatus, and non-transitory computer-readable medium described above, the fixed value may be equal to a number of bit channels of each partition.

Some examples of the method, apparatus, and non-transitory computer-readable medium described above may further include processes, features, means, or instructions for assigning, for a second partition of the each partitions, a second number of information bits of the second partition a second bit channel sub-partition of the second partition based on a baseline allocation rule.

In some examples of the method, apparatus, and non-transitory computer-readable medium described above, the baseline allocation rule applies a floor operation to a result of a function of a capacity of the second bit channel sub-partition and a number of bit channels in the second bit channel sub-partition when the second number of information bits may be less than or equal to the number of bit channels in sub-partitions of the second partition.

In some examples of the method, apparatus, and non-transitory computer-readable medium described above, the baseline allocation rule applies a ceiling operation to a result of a function of a capacity of the second bit channel sub-partition and a number of bit channels in the second bit channel sub-partition when the second number of information bits may be greater than the number of bit channels in sub-partitions of the second partition.

A method of wireless communication is described. The method may include encoding a codeword using a polar code for a transmission over a wireless channel, where the codeword includes an information bit vector including multiple information bits, identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and transmitting the encoded codeword over the wireless channel according to the polar code based on the set of bit locations.

An apparatus for wireless communication is described. The apparatus may include means for encoding a codeword using a polar code for a transmission over a wireless channel, where the codeword includes an information bit vector including multiple information bits, means for identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and means for transmitting the encoded codeword over the wireless channel according to the polar code based on the set of bit locations.

Another apparatus for wireless communication is described. The apparatus may include a processor, memory in electronic communication with the processor, and instructions stored in the memory. The instructions may be operable to cause the processor to encode a codeword using a polar code for a transmission over a wireless channel, where the codeword includes an information bit vector including multiple information bits, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and transmit the encoded codeword over the wireless channel according to the polar code based on the set of bit locations.

A non-transitory computer readable medium for wireless communication is described. The non-transitory computer-readable medium may include instructions operable to cause a processor to encode a codeword using a polar code for a transmission over a wireless channel, where the codeword includes an information bit vector including multiple information bits, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and transmit the encoded codeword over the wireless channel according to the polar code based on the set of bit locations.

In some examples of the method, apparatus, and non-transitory computer-readable medium described above, the adjusting the information bit allocation includes: constructing a sequence for each partition that may be compliant with the UPO. Some examples of the method, apparatus, and non-transitory computer-readable medium described above may further include processes, features, means, or instructions for generating a bit vector for assigning the number of the information bits according to a mutual information (MI) recursion equation. Some examples of the method, apparatus, and non-transitory computer-readable medium described above may further include processes, features, means, or instructions for comparing an order resulting from the bit vector to the UPO.

Some examples of the method, apparatus, and non-transitory computer-readable medium described above may further include processes, features, means, or instructions for determining, for a value of the bit vector for at least one of the each partitions, that the order resulting from the value of the bit vector violates the UPO. Some examples of the method, apparatus, and non-transitory computer-readable medium described above may further include processes, features, means, or instructions for swapping the value of the bit vector with an adjacent value of the bit vector based on the identifying that the value violates the UPO.

In some examples of the method, apparatus, and non-transitory computer-readable medium described above, the sequence may be determined based on a binary bit weighting for the bit channels of each partition that applies multiple weighting factors.

A method of wireless communication is described. The method may include receiving a codeword over a wireless channel, where the codeword is based on multiple information bits encoded using a polar code having multiple bit channels, identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel partition of the bit channel partitions to a fixed value, and decoding the received codeword according to the polar code to obtain an information bit vector at the set of bit locations.

An apparatus for wireless communication is described. The apparatus may include means for receiving a codeword over a wireless channel, where the codeword is based on multiple information bits encoded using a polar code having multiple bit channels, means for identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel partition of the bit channel partitions to a fixed value, and means for decoding the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive a codeword over a wireless channel, where the codeword is based on multiple information bits encoded using a polar code having multiple bit channels, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel partition of the bit channel partitions to a fixed value, and decode the received codeword according to the polar code to obtain an information bit vector at the set of bit locations.

A non-transitory computer readable medium for wireless communication is described. The non-transitory computer-readable medium may include instructions operable to cause a processor to receive a codeword over a wireless channel, where the codeword is based on multiple information bits encoded using a polar code having multiple bit channels, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions, where at least one quantization rule is applied for determining whether to assign a first number of the information bits of a first bit channel partition of the bit channel partitions to a fixed value, and decode the received codeword according to the polar code to obtain an information bit vector at the set of bit locations.

In some examples of the method, apparatus, and non-transitory computer-readable medium described above, a first quantization rule of the at least one quantization rule sets the first number to the fixed value as a function of a capacity of the first bit channel partition.

In some examples of the method, apparatus, and non-transitory computer-readable medium described above, the first quantization rule applies a threshold that may be dependent on a number of bit channels of each partition.

In some examples of the method, apparatus, and non-transitory computer-readable medium described above, the threshold may be selected to maintain a UPO of the bit channels of each partition.

In some examples of the method, apparatus, and non-transitory computer-readable medium described above, a first quantization rule of the at least one quantization rule sets the first number to the fixed value as a function of a code rate of each partition.

In some examples of the method, apparatus, and non-transitory computer-readable medium described above, the function may be selected to maintain a UPO of the bit channels of each partition.

In some examples of the method, apparatus, and non-transitory computer-readable medium described above, the fixed value may be a function of a number of bit channels of each partition.

In some examples of the method, apparatus, and non-transitory computer-readable medium described above, the fixed value may be equal to a number of bit channels of each partition.

In some examples of the method, apparatus, and non-transitory computer-readable medium described above, for a second partition of each partitions, a second number of information bits of the second partition may be assigned to a second bit channel sub-partition of the second partition based on a baseline allocation rule.

In some examples of the method, apparatus, and non-transitory computer-readable medium described above, the baseline allocation rule applies a floor operation to a result of a function of a capacity of the second bit channel sub-partition and a number of bit channels in the second bit channel sub-partition when the second number of information bits may be less than or equal to the number of bit channels in sub-partitions of the second partition.

In some examples of the method, apparatus, and non-transitory computer-readable medium described above, the baseline allocation rule applies a ceiling operation to a result of a function of a capacity of the second bit channel sub-partition and a number of bit channels in the second bit channel sub-partition when the second number of information bits may be greater than the number of bit channels in sub-partitions of the second partition.

A method of wireless communication is described. The method may include receiving a codeword over a wireless channel, where the codeword is based on multiple information bits encoded using a polar code having multiple bit channels, identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and decoding the received codeword according to the polar code to obtain an information bit vector at the set of bit locations.

An apparatus for wireless communication is described. The apparatus may include means for receiving a codeword over a wireless channel, where the codeword is based on multiple information bits encoded using a polar code having multiple bit channels, means for identifying a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and means for decoding the received codeword according to the polar code to obtain an information bit vector at the set of bit locations.

Another apparatus for wireless communication is described. The apparatus may include a processor, memory in electronic communication with the processor, and instructions stored in the memory. The instructions may be operable to cause the processor to receive a codeword over a wireless channel, where the codeword is based on multiple information bits encoded using a polar code having multiple bit channels, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and decode the received codeword according to the polar code to obtain an information bit vector at the set of bit locations.

A non-transitory computer readable medium for wireless communication is described. The non-transitory computer-readable medium may include instructions operable to cause a processor to receive a codeword over a wireless channel, where the codeword is based on multiple information bits encoded using a polar code having multiple bit channels, identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of each partition to bit channel sub-partitions by adjusting the information bit allocation derived based on the recursive partitioning to be compliant with a UPO, and decode the received codeword according to the polar code to obtain an information bit vector at the set of bit locations.

In some examples of the method, apparatus, and non-transitory computer-readable medium described above, the adjusting the information bit allocation includes: constructing a sequence for each partition that may be compliant with the UPO. Some examples of the method, apparatus, and non-transitory computer-readable medium described above may further include processes, features, means, or instructions for generating a bit vector for assigning the number of the information bits according to an MI recursion equation. Some examples of the method, apparatus, and non-transitory computer-readable medium described above may further include processes, features, means, or instructions for comparing an order resulting from the bit vector to the UPO.

Some examples of the method, apparatus, and non-transitory computer-readable medium described above may further include processes, features, means, or instructions for determining, for a value of the bit vector for at least one of the each partitions, that the order resulting from the value of the bit vector violates the UPO. Some examples of the method, apparatus, and non-transitory computer-readable medium described above may further include processes, features, means, or instructions for swapping the value of the bit vector with an adjacent value of the bit vector based on the identifying that the value violates the UPO.

In some examples of the method, apparatus, and non-transitory computer-readable medium described above, the sequence may be determined based on a binary bit weighting for the bit channels of each partition that applies multiple weighting factors.

DETAILED DESCRIPTION

Figure 1:
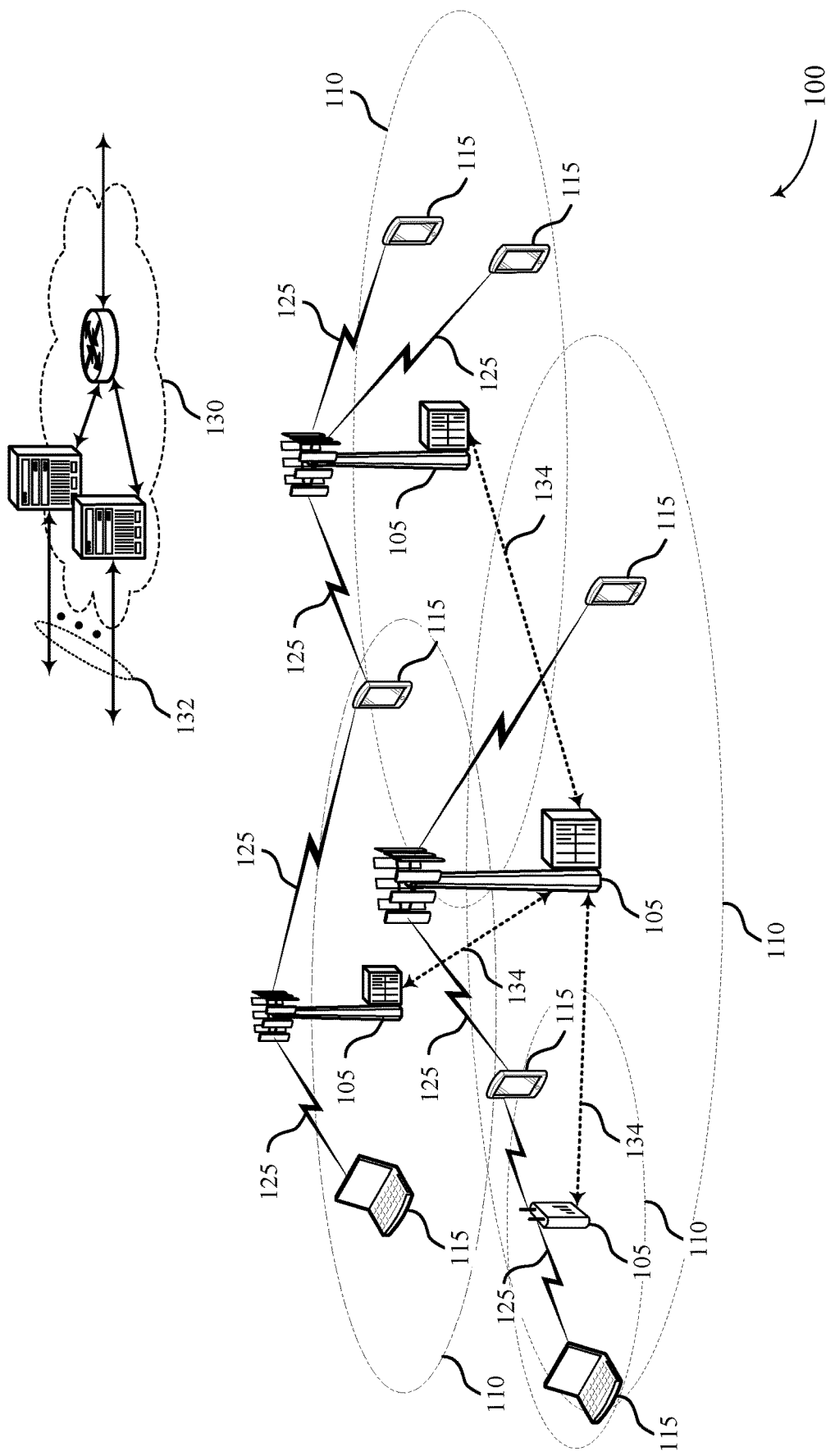
FIG. 1 illustrates an example of a wireless communications system that supports information bit distribution design in accordance with aspects of the present disclosure.

The described techniques relate to improved methods, systems, devices, apparatuses, or products by processes that support polar sequence design based on coefficient reliability and improved information bit distribution for polar codes. Generally, the described techniques may provide improved techniques for information bit distribution design and/or may improve bit allocation at a quantization boundary.

In some examples, bit channels of a polar code may be determined by a universal partial order (UPO). However, some bit channels ordered by a UPO may have the same order and may not be comparable under current UPO rules. The techniques described herein may be applied by a device or module (e.g., a transmitter, a receiver, an encoder, a decoder, a process for creating a lookup table, or any combination of these) for selecting between at least two bit channel indices having a same order under the UPO. For instance, an analytical method or a simulation may be applied to the two indices. Additionally or alternatively, the device or module may determine bit channels of a polar code based on a bit index reliability sequence determined using hybrid polarization weighting factors. For instance, the device or module may generate a sequence and weight the entire sequence or a portion of the sequence by a certain factor. In some cases, the device or module may further weight a subset of the sequence to produce the bit index reliability sequence.

In some examples, bit channels of a polar code may be recursively partitioned at one or more polarization stages of the polar code using a baseline rate allocation rule. The baseline rate allocation rule may have ceiling and floor operations that control the number of information bits to allocate to a partition. At the quantization boundary, a bit may be allocated to one of multiple partitions. One or more quantization rules may be applied for determining whether to assign a number of bits of a bit channel partition to a fixed value. In some examples, assigning information bits to a partition may be adjusted to be compliant with a UPO.

A polar code may be composed of multiple channels having different levels of reliability. Channel reliability may represent a capacity of the channel to carry information as part of the encoded codeword. Channels of a polar code having higher reliabilities are used to encode information bits and the remaining channels are used to encode frozen bits. A frozen bit is a bit having a known value to a decoder and is generally set as '0'. For N channels, K information bits may be loaded into the K most reliable channels and N−K frozen bits may be loaded into the N−K least reliable channels, where, in some cases, K<N.

A transmitter, such as a base station or a user equipment (UE), may determine a bit index reliability sequence for a set of bit channels of a polar code based on a length of the codeword. An encoder (e.g., an encoder working in conjunction with the transmitter, a device generating a lookup table for reliability sequences, etc.) may determine an order of bit indices in the bit index reliability sequence based on hybrid polarization weighting factors. The encoder may apply the hybrid polarization weighting factors using nested sequence generation. For example, a first sequence may be generated for a given polar code length (e.g., $N_1$) using a first polarization weighting factor (e.g., $\beta_1$), and a subset of the sequence values may be replaced with a sequence of a second length (e.g., $N_2$, where $N_2 < N_1$) that is generated using a second polarization weighting factor (e.g., $\beta_2$). The subset of the sequence values may correspond to the lowest (e.g., the lowest $N_2$) sequence values or the highest (e.g., the highest $N_2$) sequence values in the first sequence. The encoder may nest additional sequences using additional polarization weighting factors. Additionally or alternatively, the encoder may apply hybrid bit index weighting factors for a polarization weight function. For example, for a polar code having m bit positions (e.g., where $N=2^{m-1}$), a first weighting factor may be applied for a first subset of the bit positions and a second weighting factor may be applied for a second subset of the bit positions.

In some examples, an encoder may determine an order of bit indices in a bit index reliability sequence based on applying a UPO to an input search sequence to obtain a partial order. The encoder may additionally apply an analytical method to obtain calculated relative orders of bit indices not ordered in the partial order, and may apply a simulation to refine an order of at least two bit indices selected based on the calculated relative orders. The transmitter or encoder may generate the codeword according to the polar code based on the bit index reliability sequence and a set of information bits encoded using the polar code, and the transmitter may transmit the codeword over a wireless channel. A receiver, such as a UE or base station, may receive the codeword over the wireless channel, select the bit index reliability sequence based on a length of the codeword, and decode the codeword based on the bit index reliability sequence.

In some examples, a transmitter, such as a base station or a UE, may identify a set of bit locations of a polar code for a set of information bits based on recursive partitioning for at least a subset of polarization stages of the polar code. For each partition of the subset of polarization stages of the polar code, portions of a number of the information bits of each partition may be assigned to bit channel sub-partitions. In some examples, at least one quantization rule may be applied for determining whether to assign a first number of the information bits of a first bit channel sub-partition of the bit channel sub-partitions to a fixed value. In some examples, assigning portions of a number of the information bits of each partition to bit channel sub-partitions may include adjusting the information bit allocation derived based on the recursive partitioning to be compliant with a UPO. The transmitter may encode a codeword according to the polar code based on the set of bit locations, and may transmit the encoded codeword over the wireless channel. A receiver, such as a base station or a UE, may receive the codeword over the wireless channel, identify the set of bit locations of the polar code for a set of information bits, and decode the received codeword according to the polar code to obtain an information bit vector at the set of bit locations.

Aspects of the disclosure are initially described in the context of a wireless communications system. The wireless communications system may identify a reliability order for channels of a polar code. The wireless communications system may also identify a number of information bits for each partition at each stage of polarization. Aspects of the disclosure are further illustrated by and described with reference to apparatus diagrams, system diagrams, and flowcharts that relate to information bit distribution design.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions, from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap and overlapping geographic coverage areas 110 associated with different technologies may be supported by the same base station 105 or by different base stations 105. The wireless communications system 100 may include, for example, a heterogeneous LTE/LTE-A or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P)

or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at multiple antenna elements of an antenna array, or by processing received signals according to different receive beamforming weight sets applied to signals received at multiple antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based on listening according to different receive beam directions (e.g., a beam direction determined to have a highest signal strength, highest signal-to-noise ratio, or otherwise acceptable signal quality based on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100 and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or DFT-s-OFDM).

The organizational structure of the carriers may be different for different radio access technologies (e.g., LTE, LTE-A, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems 100 such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

Wireless communications system 100 may support polar coding for reliable codeword transmissions. For example, a transmitting device (e.g., a base station 105 or UE 115) may determine a bit index reliability sequence for bit channels of a polar code (e.g., based on a length of the codeword). In a first example, the device may determine an order of bit indices in the bit index reliability sequence based on applying a UPO to an input search sequence to obtain a partial order and applying an analytical method to obtain calculated relative orders of bit indices not ordered in the partial order. The device may apply a simulation to refine an order of bit indices selected based on the calculated relative orders. In a second example, the device may determine the order of bit indices in the reliability sequence based on a lookup table, where the lookup table was generated or determined based on a process similar to that described above. The device may generate the codeword for a set of information bits according to the polar code based on the bit index reliability sequence, and may transmit the codeword to a receiving device (e.g., a UE 115 or base station 105).

The receiving device may receive the codeword over the wireless channel (e.g., an uplink or downlink channel), and may decode the codeword according to the bit index reliability sequence. For example, the receiving device may select the bit index reliability sequence based on the length of the codeword. In a first example, the receiving device may determine an order of bit indices in the reliability sequence based on applying a UPO to an input search sequence to obtain a partial order, applying an analytical method to obtain calculated relative orders of bit indices not ordered in the partial order, and applying a simulation to refine an order of bit indices selected based on the calculated relative orders. In a second example, the receiving device may select the bit index reliability sequence from a lookup table based on the length of the codeword, where the lookup table is generated or determined based on the above described steps.

Figure 2:
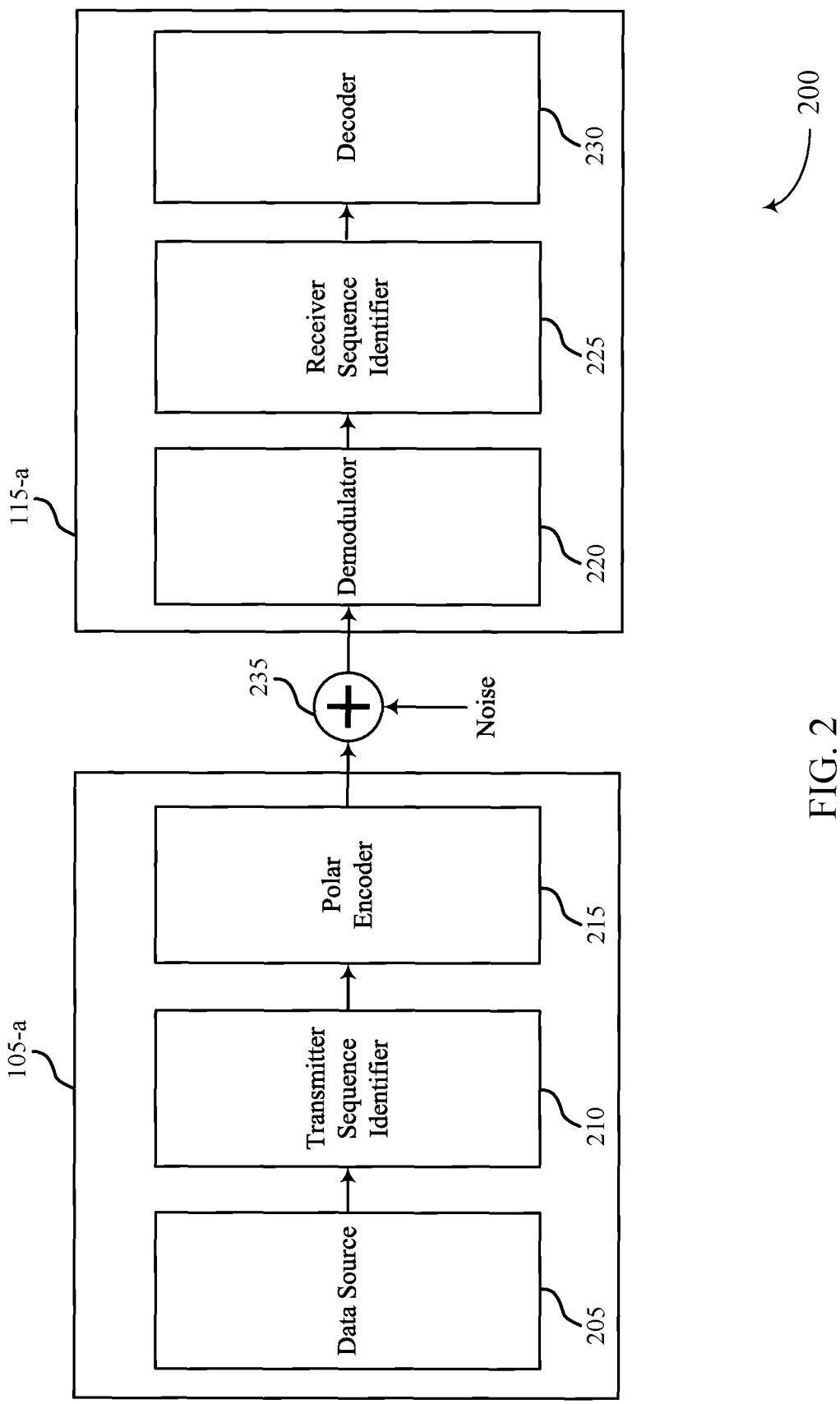
FIG. 2 illustrates an example of a wireless communications system that supports information bit distribution design in accordance with aspects of the present disclosure.

FIG. 2 illustrates an example of a wireless communications system 200 that supports information bit distribution design in accordance with various aspects of the present disclosure. In some examples, wireless communications system 200 may implement aspects of wireless communications system 100. In the example of FIG. 2, base station 105-a may use polar encoding to encode information bits for transmission to UE 115-a, which may be an example of a corresponding UE 115 as described with reference to FIG. 1, via a communication channel 235. In some examples, UE 115-a may encode data for transmission to base station 105-a, which may be an example of a corresponding base station 105 as described with reference to FIG. 1, or another UE 115 using these same techniques. In further examples, base station 105-a may encode data for transmission to another base station 105 using these same techniques. Moreover, devices other than base station 105-a and UE 115-a may use the techniques described herein for decoding a codeword encoded using a polar code.

In the depicted example, base station 105-a may include a data source 205, a transmitter sequence identifier 210, and a polar encoder 215. The data source 205 may provide an information vector of k information bits to be encoded and transmitted to UE 115-a. The data source 205 may be coupled to a network, a storage device, or the like. The data source 205 may output the information vector to the sequence identifier 210. The transmitter sequence identifier 210 may select a length N in bits of a codeword and a bit index reliability sequence corresponding to the selected length N. The transmitter sequence identifier 210 may output the k information bits, the length N, and the bit index reliability sequence to the polar encoder 215 for polar encoding.

In some examples, the transmitter sequence identifier 210 identifies a bit index reliability sequence that is determined based on hybrid polarization weighting factors. The hybrid polarization weighting factors may be applied using nested sequence generation. For example, a first sequence may be generated for a given polar code length (e.g., $N_1$) using a first polarization weighting factor (e.g., $\beta_1$) and then a subset of the sequence values may be replaced with a sequence of a second length (e.g., $N_2$, where $N_2 < N_1$) that is generated using a second polarization weighting factor (e.g., $\beta_2$). The subset of the sequence values may correspond to the lowest (e.g., the lowest $N_2$) sequence values or the highest (e.g., the highest $N_2$) sequence values in the first sequence. Additional sequences may be nested using additional polarization weighting factors. Additionally or alternatively, hybrid bit index weighting factors may be applied for a polarization weight function. For example, for a polar code having m bit positions (e.g., where $N=2^{m-1}$), a first weighting factor may be applied for a first subset of the bit positions and a second weighting factor may be applied for a second subset of the bit positions.

In other examples, the transmitter sequence identifier 210 identifies a bit index reliability sequence determined based on a UPO. Determining the bit index reliability sequence may involve an initial input search sequence, which may also be known as an input sequence, containing all or a subset of the bit channel indices. The transmitter sequence identifier 210 may calculate the partial order under UPO of the input search sequence and pick the most reliable bit-index under UPO. If the picked bit-index is not the same order as another bit-index in the input search sequence, it may be added to the bit index reliability sequence. Elsewise, analytical methods (e.g., index weighting by the Reed-Muller rule), simulations, or both, which may select the index that maximizes link-level performance, may be used to select the most reliable bit-index of that order, and that bit may be added to the bit index reliability sequence. The selected bit may be removed from the input search sequence and the method described above may be repeated until all (or a target number) of the input bit indices are selected. Parts of the resulting bit index reliability sequence may be modified using other sequences for index locations where those other sequences have better performance (e.g., by using the hybrid bit index weighting factors described above) as determined by simulations, estimated values, historical data, or some combination of these or other performance determining processes. It should be noted that the above method, in some examples, may construct the bit index reliability sequence by picking the least reliable bit. It is also possible that the bits may be ordered by a single UPO property (e.g., property 1 as described below), which may result in violations of the other properties (e.g., violation of property 2 arising as a result of the construction method).

Figure 3:
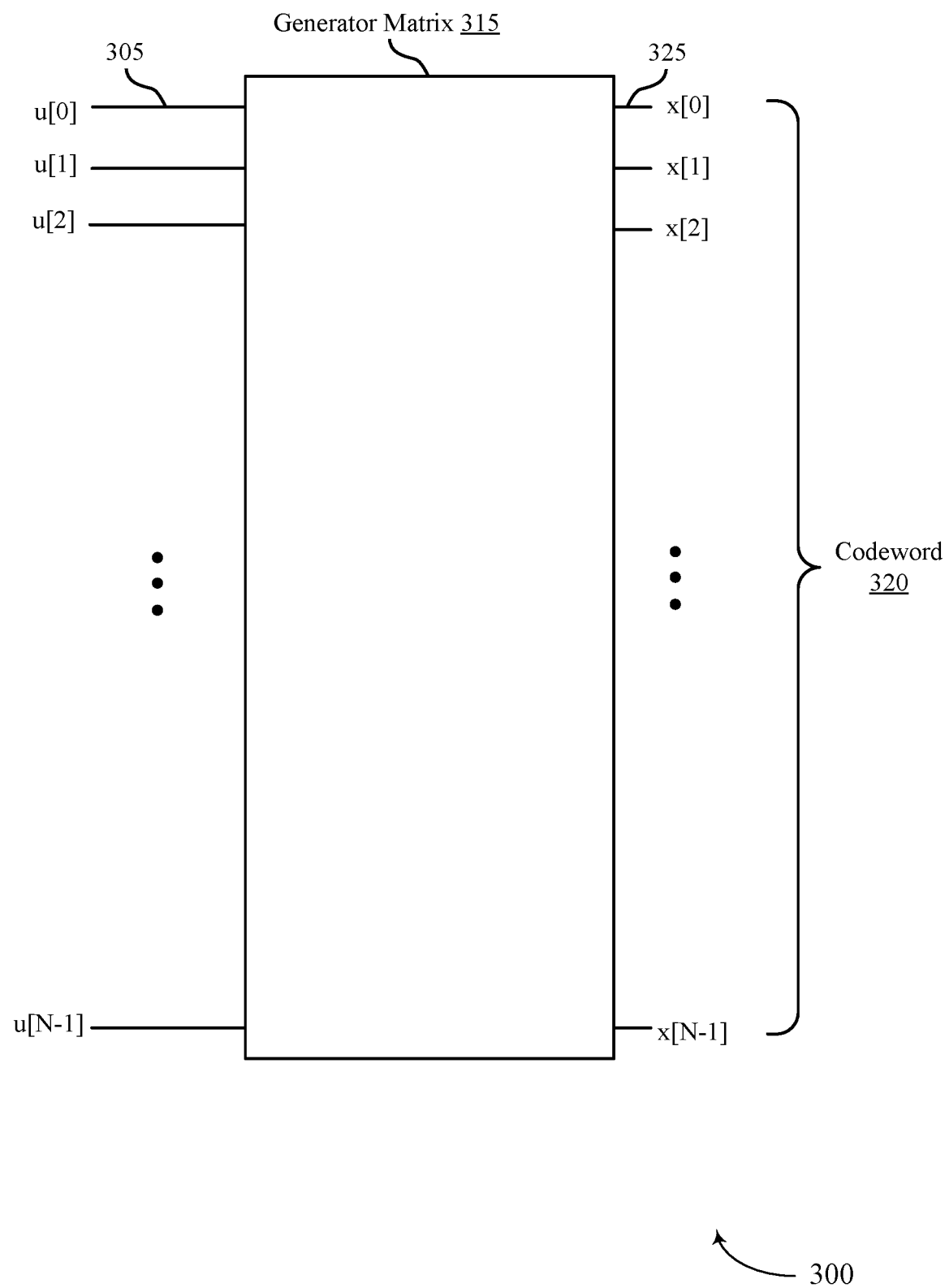
FIG. 3 illustrates an example of a polar encoder that supports information bit distribution design in accordance with aspects of the present disclosure.

FIG. 3 illustrates an example of diagram 300 of a polar code that supports information bit distribution design in accordance with various aspects of the present disclosure. In some examples, diagram 300 may implement aspects of wireless communications system 100.

Diagram 300 depicts a polar code that includes N channels for generating a polar-encoded codeword 320 with channel 0 illustrated on top, followed by channel 1, and proceeding sequentially to channel N−1. Channels u[0: N−1] 305 may represent bits to be encoded and codeword channels x[0: N−1] 325 may represent the bits once they are encoded. A generator matrix 315 may be used (e.g., by multiplying the generator matrix 315 by channels u[0: N−1] 305) by an encoder to encode information bits input to the channels u[0: N−1] 305 to generate codeword channels x[0: N−1] 325, and may be used (e.g., by multiplying codeword channels x[0: N−1] 325 by the inversion of the generator matrix 315 or by another matrix derived from the generator matrix 315) by a decoder to decode information received on codeword channels x[0: N−1] 325 to obtain a representation of the information bits and frozen bits on channels u[0: N−1] 305. The location of any particular channel may depend on its reliability relative to other channels of the polar code.

The polar encoder 215, as discussed above with reference to FIG. 2, may allocate the most reliable channels of a polar code to information bits (e.g., k information bits) and the least reliable channels of the polar code to frozen bits (e.g., N−k frozen bits). The transmitter sequence identifier 210 may generate a bit index reliability sequence of length N to inform the polar encoder 215 of the order in which to load bits into the channels u[0: N−1] 305 (e.g., which k bit channels to select of the N bit channels of channels u[0: N−1] 305 for loading information bits).

Figure 4:
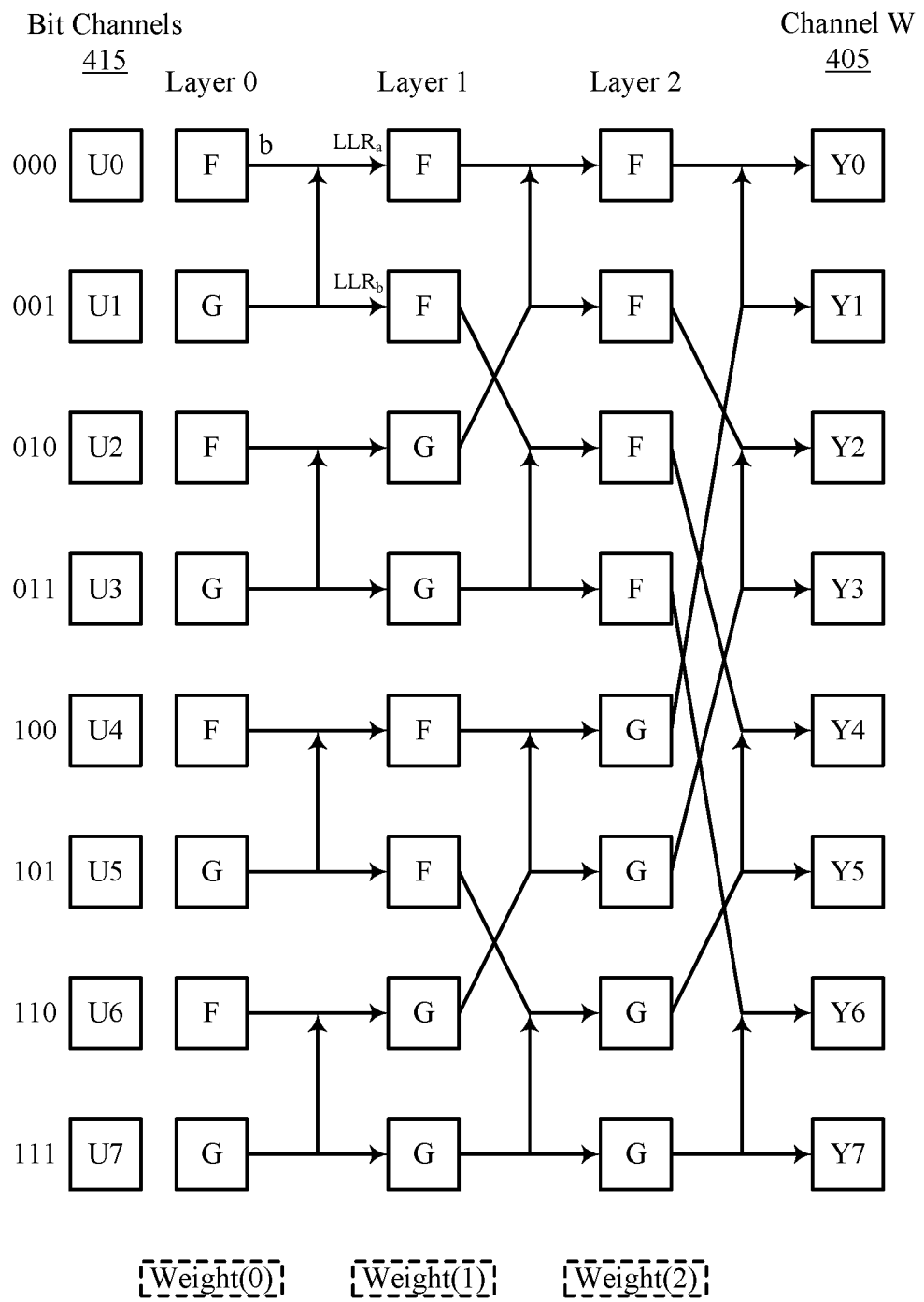
FIG. 4 illustrates an example of a polar coding scheme that supports information bit distribution design in accordance with aspects of the present disclosure.

FIG. 4 illustrates an example of a polar coding scheme 400 that supports information bit distribution design in accordance with various aspects of the present disclosure. In some examples, polar coding scheme 400 may implement aspects of wireless communications system 100.

In some cases, a transmitting device (e.g., a base station 105 or a UE 115) may identify information for a transmission to a receiving device over a channel 'W' 405. In some examples, the polar coding scheme 400 may be used to generate N=8 coded bits for the transmission from k information bits. As shown in polar coding scheme 400, an encoding process would proceed from left to right, while polarization may be understood as occurring in polarization stages proceeding from right to left (e.g., bits transmitted over the channel 'W' 405 may be understood as unpolarized, while bit channels 415 in the 'U' domain (e.g., 'U' channels) are polarized bit channels having different reliability or capacity). Polar coding scheme 400 may include a set of F and G operations that are functions of logarithmic likelihood ratios (LLRs). In an example of a polar code LLR calculation:

$$F(LLR_a, LLR_b) = \text{Sign}(LLR_a) * \text{Sign}(LLR_b) * \min(|LLR_a|, |LLR_b|)$$

$$G(LLR_a, LLR_b) = LLR_b + LLR_a \text{ if } b=0$$

$$G(LLR_a, LLR_b) = LLR_b - LLR_a \text{ if } b=1$$

The transmitting device may locate the information bits on bit-channel instances (or sub-channels) of the polar code associated with the highest reliability (e.g., a higher place in a bit index reliability sequence). For instance, the bit index reliability sequence of the bit channels 415 may be [7, 6, 5, 3, 4, 2, 1, 0] where N=8 and the reliability increases in ascending order. If there are 6 frozen bits and 2 information bits, then the information bits may be loaded into channel 111 (e.g., 'U7'), which may be associated with the value 7, and channel 110 (e.g., 'U6'), which may be associated with the value 6, and the frozen bits may be transmitted on the other channels, which may have less reliability according to the bit index reliability sequence.

The bit-channel reliability may be determined according to a polarization weight that is associated with the number of repetition operations for a given bit-channel 415 and may represent a weight experienced by the bit channel 415. The polarization weight may generally be given by:

$$W_i = \Sigma_{j=0}^{m-1} B_j \cdot \text{weight}(j)$$

where: $i = \text{binary}(B_{m-1}, B_{m-2}, \ldots B_0)$ and $\text{weight}(j) = 2^{j/4}$. $B_j$ may be associated with the $j^{th}$ bit of a bit representation of a bit channel 415, where the bit representation may have m bits. For instance, bit channel 'U5' of FIG. 4 may have a bit representation of 101 and m may be equal to 3. When i=5, then $B_2$ may equal 1, $B_1$ may equal 0, and $B_0$ may equal 1. The weighting factor weight(j) may be understood as applying a β factor, where β is given by the value of weight(1). Thus, β for weight(j)=$2^{j/4}$ may be equal to approximately 1.189 (e.g., if β is optimized for a code length of N=4096, N=8192, etc.). However, a given β factor optimized for a long code length (e.g., N=4096 or greater) may limit performance when applied for shorter code lengths (e.g., N=64, 128, etc.). As such, different functions may be used to define weight(j) for different code lengths. In this way, the β factor for a shorter code length (e.g., β=1.17000 for N=512) may be different than the β factor for a longer code length (e.g., β=1.189 for N=4096) if different optimizations for weight(j) are utilized.

The reliability may be determined according to a polarization weight with hybrid polarization weighting factors. The hybrid polarization weighting factors may be applied using nested sequence generation. For example, sequences may be generated using different beta values for different sequence lengths N. In one example, a first sequence $S_1$ is generated for N=4096, 8192, using $\beta_1$=1.189, a second sequence $S_2$ is generated for N=1024, 2048 using $\beta_2$=1.17667, and a third sequence $S_3$ is generated for N=64, 128, 256, 512 using $\beta_3$=1.17000.

Figure 5:
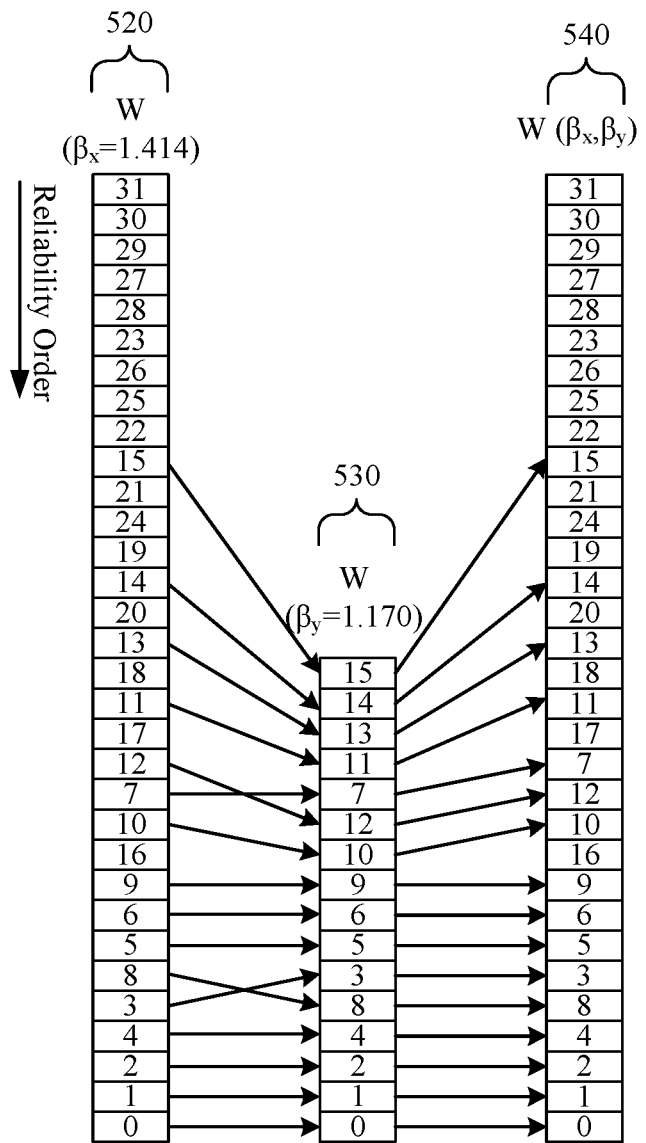
FIG. 5 illustrates an example of polar code bit sequence generation that supports information bit distribution design in accordance with aspects of the present disclosure.

FIG. 5 illustrates an example of a polar code bit sequence generation 500 that supports information bit distribution design in accordance with various aspects of the present disclosure. In some examples, polar code bit sequence generation 500 may implement aspects of wireless communications system 100. A first sequence 520 (e.g., with the reliability order of bit channels shown from top to bottom) may be generated for a given polar code length (e.g., $N_x$=32) using a first polarization weighting factor (e.g., $\beta_x$=1.414). A subset of the sequence values may be replaced with a sequence 530 of a second length (e.g., $N_y$=16) that is generated using a second polarization weighting factor (e.g., $\beta_y$=1.170). The polar code bit sequence generation 500 may replace the bit locations within the first sequence 520 corresponding to the lowest bit indices (e.g., 0-15) with the nested sequence 530 to generate the final bit sequence 540. Although not illustrated, additional nesting may be performed using additional nested sequences. In some examples, the highest bit indices (e.g., 16-31) may be replaced instead of the lowest bit indices for a given nesting operation. In some examples, a final sequence generated by nesting sequences generated with multiple polarization weighting factors may be used for multiple code lengths by using the order of the sequence values for a given code length N. For example, a sequence of length N=8192 generated using the nested sequence generation may be used for a code length of N=128 by applying the order of the highest or lowest reliability bit channels (e.g., the order of bit channels 8191, 8190, . . . , 8064 or the order of bit channels 127, 126, . . . , 0) within the N=8192 sequence. In this way, one sequence may be used to determine bit orders for multiple different code lengths.

Additionally or alternatively, hybrid bit index weighting factors may be applied for a polarization weight function. For example, for a polar code having m bit positions (e.g., $N=2^{m-1}$) a first weighting factor may be applied for a first subset of the bit positions and a second weighting factor may be applied for a second subset of the bit positions. Thus, weight(j) may be given by $\Pi_{k=0}^{j-1}(\beta(k))^{j/4}$. For example, where a polar code has length 4096 (e.g., m=12), $\beta(k)$ may be given by $\beta_1$ for k=11, $\beta_2$ for k=10, 9, and $\beta_3$ for k=8, . . . , 0, where $\beta_1=1.189$, $\beta_2=1.17667$, and $\beta_3=1.17000$.

Figure 6:
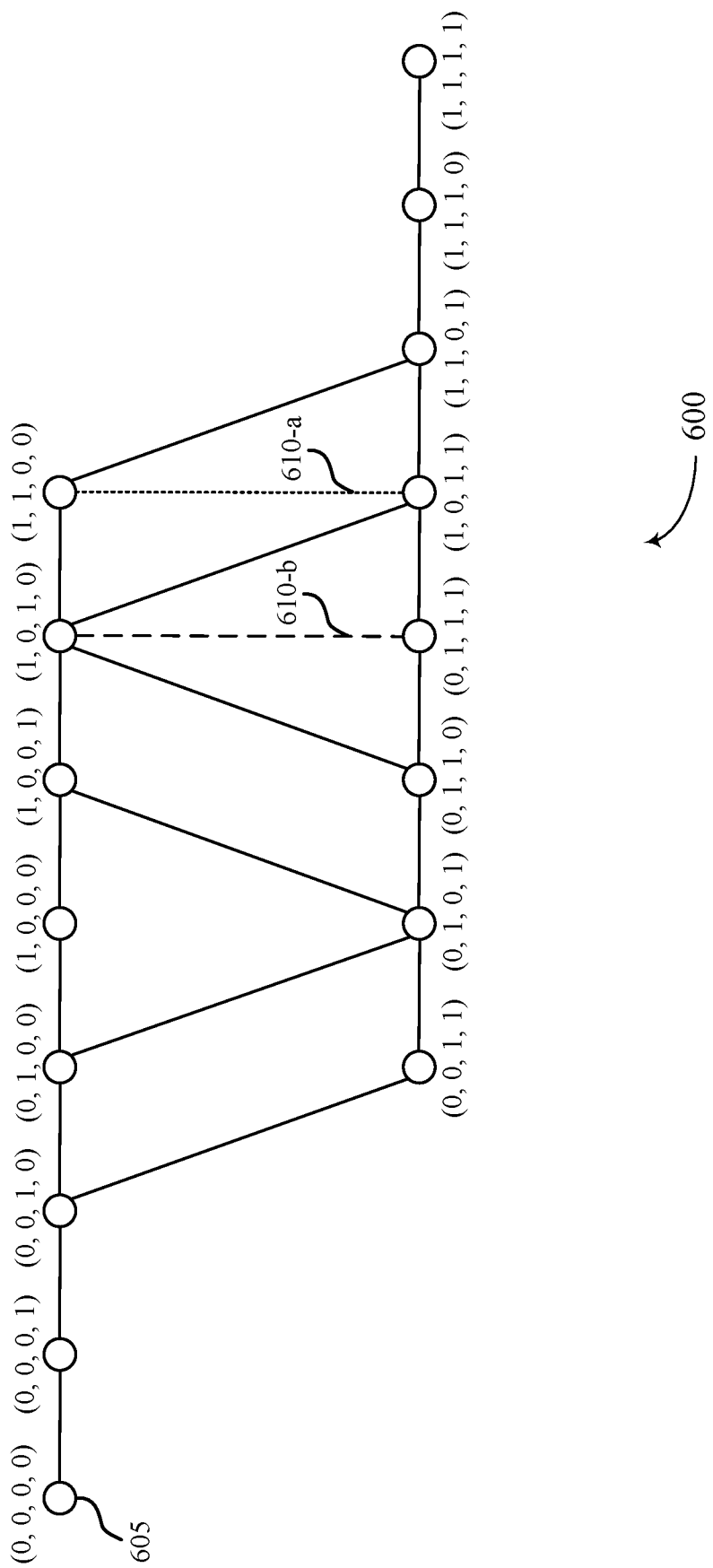
FIG. 6 illustrates an example of a Hasse diagram that supports information bit distribution design in accordance with aspects of the present disclosure.

FIG. 6 illustrates an example of Hasse diagram 600 that supports information bit distribution design in accordance with various aspects of the present disclosure. In some examples, Hasse diagram 600 may implement aspects of wireless communications system 100.

In some examples, with reference again to FIG. 2, the polar encoder 215 may allocate the most reliable channels of a polar code to information bits and the least reliable channels of the polar code to frozen bits. The transmitter sequence identifier 210 may generate a bit index reliability sequence of length N to inform the polar encoder 215 of the order in which to load bits into the channels. In an example, the bit index reliability sequence of length N may specify reliability in descending order, and each bit index may correspond to a particular channel.

Initially, the transmitter sequence identifier 210 may determine an input search sequence that includes all or a subset of N bit indices [0, N−1]. The transmitter sequence identifier 210 may apply a UPO to an input search sequence to obtain a partial order. The UPO may define a partial order on bit reliability based on one or more properties. For example, a first property of the UPO may dictate that a bit-index i has the same or higher reliability (e.g., under successive cancellation and/or maximum likelihood decoding) than a bit-index j if the binary representation of i has 1's at least in all the locations that the index j has 1's. A second property may dictate that a bit-index i, generated from a bit-index j by moving a 1 in the binary representation of j to a more significant location, has higher reliability than index j (e.g., under successive cancellation decoding). In an example for N=8, i=3 (011) is more reliable than i=2 (010) under Property 1, and i=4 (100) is more reliable than i=2 (010) under Property 2. However, i=3 (011) and i=4 (100) are not comparable under either property.

Depicted in Hasse diagram 600 are a set of connected nodes 605, where each node 605 corresponds to a particular bit index. The values of the bit indices of the nodes 605 may correspond to an input search sequence. The Hasse diagram 600 may represent an ordering of the bit indices into a bit index reliability sequence based on applying a UPO to an input search sequence. Nodes 605 on the left (that is, where (0, 0, 0, 0) is on the far left and (1, 1, 1, 1) is on the far right) of the Hasse diagram 600 may correspond to bit indices that are less reliable than bit indices on the right. The bit index reliability may be determined by selecting the most reliable bit-index under the UPO. In the depicted Hasse diagram, the bit index (1, 1, 1, 1) is the most reliable bit index.

In some instances, the UPO may be unable to order some bit indices relative to others. For example, the UPO does not indicate a relative reliability of bit index (1, 1, 0, 0) and bit index (1, 0, 1, 1). As can be seen, the Hasse diagram 600 depicts bit index (1, 1, 0, 0) in a different branch than bit index (1, 0, 1, 1). The Hasse diagram 600 depicts other instances of bit indices that are not ordered relative to one another, such as bit index (1, 0, 0, 0) and bit index (0, 0, 1, 1). Such indices may be considered to have a same order under the UPO (e.g., these bit indices may be treated as equally reliable or approximately equally reliable under the UPO).

If the UPO does not identify a single bit index as being more reliable than another, the techniques described herein may be applied for selecting between at least two indices having a same order under the UPO. In one example, an analytical method may be applied to the partial order to obtain calculated relative orders of bit indices not ordered in the partial order. Dashed line 610-a may represent a situation where the UPO does not provide an order between bit index (1, 1, 0, 0) and bit index (1, 0, 1, 1), so these indices may not be ordered relative to one another in the partial order. Dashed line 610-b is another example where the UPO may not provide an order between bit index (1, 0, 1, 0) and bit index (0, 1, 1, 1) that are not ordered relative to one another in the partial order.

An analytical method may be applied to obtain calculated relative orders of bit indices not ordered in the partial order. For example, the analytical method may include applying a Reed-Muller rule, an index polarization weight rule, a density evolution (DE) rule, a mutual information-DE (MI-DE) rule, or any combination thereof, for selecting which of the at least two indices (e.g., bit indices (1, 1, 0, 0) and (1, 0, 1, 1)) is the most reliable. In some cases, the analytical method may be utilized to determine relative reliabilities for more than two bit indices (e.g., for a Hasse diagram 600 with more than two branches).

In some examples, the calculated relative orders of the at least two bit indices may violate at least one of the first property or the second property of the UPO. In some examples, satisfying property 1 of the UPO may lead to a better sequence (e.g., more reliable than using an absolute order rule alone), but violating property 2 may sometimes improve the performance under list decoding, maximum-likelihood decoding, or the like. In some instances, the property 2 violation may occur as a result of a construction method such as some versions of MI-DE. For example, only a single property (e.g., property 1) of the UPO may be applied to an input search sequence to generate a partial order, and an analytical method may be used to evaluate reliability relationships between bit indices not ordered (or of seemingly equal order) in the partial order. The analytical method may be applied to obtain calculated relative orders of bit indices not ordered in the partial order. In some examples, the calculated relative orders of the at least two bit indices may violate at least one property of the UPO (e.g., the calculated relative orders may violate property 2). A bit index reliability sequence generated in such a manner may thus include at least some bit indices placed in an order in the reliability sequence that violates a property of the UPO. Alternatively, both properties of the UPO may be applied to the input search sequence to generate the partial order, and selected bit indices may be rearranged based on results of an analytical method (e.g., where an analytical method shows a large benefit to rearranging bit indices).

In some examples, a simulation may be applied to refine an order of the at least two bit indices selected based on the calculated relative orders. For example, link-level performance simulation may be used for selecting which of the at least two indices is more reliable (e.g., the index with higher link-level performance may be chosen). In some examples, the simulation may be based on a list size applied by a successive cancellation list decoding algorithm for decoding the codeword. In an example, the analytical method may determine a reliability for each bit index not ordered in the partial order. When comparing two bit indices, the analytical method may determine a difference in the reliabilities for the two bit indices. If the difference satisfies a threshold (e.g., is greater than or equal to the reliability difference threshold), the two bit indices may be added to the bit index reliability sequence in an order corresponding to the determined reliabilities. In some examples, one of the two bit indices (e.g., the more reliable bit index) may be added to the bit reliability sequence and the other may remain in an input search sequence. If, however, the difference does not satisfy the threshold (e.g., is less than the threshold), simulation may be used to determine the relative orders between the two bit indices in the bit index reliability sequence. Thus, the subset of bit indices for which the partial order does not resolve bit index ordering may be further reduced using the analytical method, with bit indices having similar bit reliabilities as given by the analytical method being simulated to determine the performance difference between different orderings for the bit indices. In this manner, simulation time may be reduced by simulating only those bit-channel index order pairs for which the UPO and analytical methods do not indicate a strong preference (e.g., based on reliability) in the bit-channel index order.

Once a particular bit index from the input search space (i.e., the input search sequence) pace is added to the reliability sequence, the particular bit index may be removed from the input search space. The process may be repeated to generate a bit sequence reliability order for a desired length of N. Based on the description above, to generate a reliability sequence of length N (in descending reliability order), an input search sequence may be to all or a subset of the bit indices in [0, N-1], and a partial order under UPO of the input search sequence may be calculated. The most reliable bit-index under UPO may be selected. If multiple bit indices under the UPO have a same order, select from among the multiple bit indices using an index selection criterion. The index selection criterion may be another analytical method to select from the bit indices or selecting the bit index that maximizes link-level performance via simulation. The selected bit index may be added to the output bit index reliability sequence, and may be removed from the input search sequence to generate an input search subsequence. The process may be repeated using the input search subsequence until all (or a target number) of the input bit indices are selected for the bit index reliability sequence.

The following are example bit index reliability sequences determined for N=128, N=256, and N=512 using the techniques described above.

N=128 Sequence:
[127, 126, 125, 123, 119, 111, 124, 95, 122, 121, 118, 63, 117, 110, 115, 109, 94, 107, 93, 62, 103, 120, 91, 116, 61, 87, 114, 59, 108, 79, 113, 55, 106, 92, 47, 105, 102, 31, 90, 101, 89, 60, 86, 99, 58, 85, 78, 112, 57, 54, 83, 77, 104, 53, 46, 75, 100, 51, 45, 71, 88, 30, 98, 43, 84, 29, 97, 39, 27, 56, 82, 76, 23, 52, 15, 81, 74, 44, 50, 73, 70, 42, 49, 69, 28, 96, 41, 67, 38, 26, 37, 25, 22, 80, 35, 21, 72, 14, 48, 19, 13, 68, 40, 11, 7, 66, 36, 24, 65, 34, 20, 33, 18, 12, 17, 10, 9, 6, 64, 5, 3, 32, 16, 8, 4, 2, 1, 0]

N=256 Sequence:
[255, 254, 253, 251, 247, 239, 252, 223, 250, 249, 246, 191, 245, 238, 243, 237, 127, 222, 235, 221, 248, 190, 231, 219, 244, 189, 215, 242, 126, 187, 236, 207, 241, 125, 234, 183, 220, 233, 123, 230, 175, 218, 229, 119, 159, 214, 217, 111, 188, 227, 186, 213, 95, 206, 240, 185, 211, 182, 124, 205, 203, 232, 181, 63, 174, 122, 228, 179, 199, 121, 173, 216, 158, 118, 226, 117, 171, 212, 110, 157, 225, 115, 167, 184, 204, 109, 155, 210, 94, 180, 107, 151, 209, 202, 93, 143, 178, 62, 172, 103, 201, 61, 198, 120, 177, 91, 170, 197, 87, 116, 156, 195, 114, 169, 79, 59, 166, 224, 108, 154, 113, 165, 55, 153, 106, 208, 150, 92, 163, 47, 102, 149, 200, 105, 90, 142, 31, 101, 176, 147, 89, 141, 196, 86, 60, 99, 139, 168, 85, 58, 194, 78, 135, 57, 164, 83, 112, 54, 77, 152, 193, 46, 53, 162, 104, 75, 148, 51, 100, 71, 45, 161, 30, 146, 140, 88, 43, 98, 29, 145, 138, 84, 39, 97, 27, 137, 82, 56, 76, 23, 134, 192, 133, 52, 15, 81, 74, 50, 44, 131, 73, 70, 160, 42, 49, 69, 28, 144, 41, 67, 26, 38, 96, 136, 37, 25, 22, 132, 35, 80, 21, 14, 72, 130, 19, 13, 48, 68, 11, 129, 40, 7, 66, 36, 24, 65, 34, 20, 33, 18, 12, 17, 10, 128, 6, 9, 5, 64, 3, 32, 16, 8, 4, 2, 1, 0]

A portion (e.g., the bit indices with the higher reliabilities) of the N=512 Sequence:
[511, 510, 509, 507, 503, 495, 508, 479, 506, 505, 502, 447, 501, 494, 499, 493, 383, 478, 491, 477, 504, 487, 475, 446, 500, 255, 445, 471, 498, 492, 443, 497, 382, 463, 490, 439, 381, 476, 489, 486, 379, 474, 431, 485, 473, 254, 444, 375, 470, 483, 253, 415, 442, 469, 496, 367, 462, 251, 441, 467, 438, 380, 461, 247, 351, 488, 430, 459, 239, 437, 378, 319, 435, 484, 223, 429, 455, 377, 472, 374, 414, 482, 252, 427, 373, 191, 468, 366, 413, 466, 423, 250, 481, 371, 440, 365, 411, 460, 249, 350, 246, 436, 407, 349, 458, 465, 363, 238, 399, 127, 434, 428, 245, 359, 454, 318, 457, 376, 347, 243, 433, 237, 426, 453, 222, 343, 372, 412, 317, 235, 425, 451, 370, 315, 422, 221, 480, 364, 335, 410, 231, 190, 369, 421, 311, 409, 219, 248, 464, 362, 406, 348, 419, 189, 244, 303, 358, 215, 405, 456, 361, 398, 126, 242, 346, 187, 236, 403, 357, 316, 432, 207, 287, 397, 452, 342, 125, 345, 234, 241, 123, 355, 395, 424, 183, 314, 341, 220, 450, 233, 391, 334, 230, 420, 175, 313, 218, 119, 339, 368, 310, 408, 229, 333, 449, 214, 159, 217, 309, 360, 331, 418, 188, 227, 302, 404, 111, 213, 307]

In the N=512 sequence, in some examples, fewer than 201 information bits may be included, and the portion of the bit index reliability sequence shown above may correspond to the payload range of interest, and the rest of the bit index reliability sequence may be constructed using another method.

The proposed techniques can may be altered to generate the bit index reliability sequence in ascending order. Moreover, in some examples, portions of the resulting bit index reliability sequence may be modified using at least one other sequence at selected index locations where those sequences are determined to have better performance.

With reference to FIG. 2, the polar encoder 215 may generate a codeword of length N based on the bit index reliability sequence and a set of k information bits received from the data source 205. With reference to FIG. 3, the k information bits may be loaded into the most reliable channels determined from the bit index reliability sequence, and the encoder may apply a generator matrix 315 to the input information bits and frozen bits (e.g., channels u[0: N-1] 305) in order to output a codeword 320. The polar encoder 215 may pass the encoded bits of the codeword 320 to a rate-matcher (not shown) to rate-match the encoded bits to a set of resources for the transmission to a receiving device (e.g., a UE 115). When rate-matching is employed, a subset of the N bits may be transmitted or a subset of the N bits may be repeated in the transmission. In some examples, channel reliability is computed for each M: N: K combination, where M is the number of the N bits of the codeword 320 that are transmitted, and M may be less than (puncturing) or greater than (repetition) N. The rate matcher may then input the rate-matched bits to a modulator (not shown) for modulation prior to the transmission (e.g., to UE 115-*a*). The transmitting device (e.g., base station 105-*a*) may then transmit the rate-matched codeword to the receiving device (e.g., UE 115-*a*) over communication channel 235.

UE 115-*a* may identify a candidate codeword based on a candidate hypothesis (e.g., decoded resources, one or more M: N: K hypotheses, etc.). For example, UE 115-*a* may employ a blind decoding process in which multiple candidate hypotheses within a search space are tested to determine if a successful decoding is performed for any of the candidate hypotheses. Demodulator 220 may demodulate the candidate codeword, which may include demapping received symbols associated with a set of resources to obtain a representation of the codeword 320. Demodulator 220 may then pass the representation of the codeword to a receiver sequence identifier 225. The receiver sequence identifier 225 may determine a length of the codeword 320 and may select a bit index reliability sequence corresponding to the determined length. The receiver sequence identifier 225 may output the bit index reliability sequence and the representation of the codeword to decoder 230 to identify the most likely candidate path or paths for the information bits obtained from the codeword. The demodulated signal may be, for example, a sequence of logarithmic-likelihood ratio (LLR) values representing a probability value of a received bit being a '0' or a '1.' The decoder may perform a list decoding algorithm on the LLR values (e.g., successive cancellation list decoding, maximum likelihood decoding) and may provide an output. If the decoder is able to decode the codeword successfully, the decoder may output a bit sequence of the information vector (e.g., the k information bits) for use, storage, communication to another device, or the like.

Advantageously, the techniques described herein may merge benefits from different construction methods and identify channels having improved link-level performance. In some examples, an absolute order rule may be followed, and a UPO rule may be selectively applied. Beneficially, the examples described herein may provide techniques for identifying a reliability order for channels of a polar code.

The techniques described herein may further improve bit allocation at a quantization boundary. Bit channels of a polar code may be recursively partitioned at one or more polarization stages of the polar code using a baseline rate allocation rule. The baseline rate allocation rule may have ceiling and floor operations that control the allocation of bits at quantization boundaries (e.g., because of the allocation of integer numbers of information bits to each partition). One or more quantization rules may be applied for determining whether to assign a number of bits of a bit channel partition to a fixed value. In some examples, assigning information bits to a partition may be adjusted to be compliant with a UPO.

Figure 7:
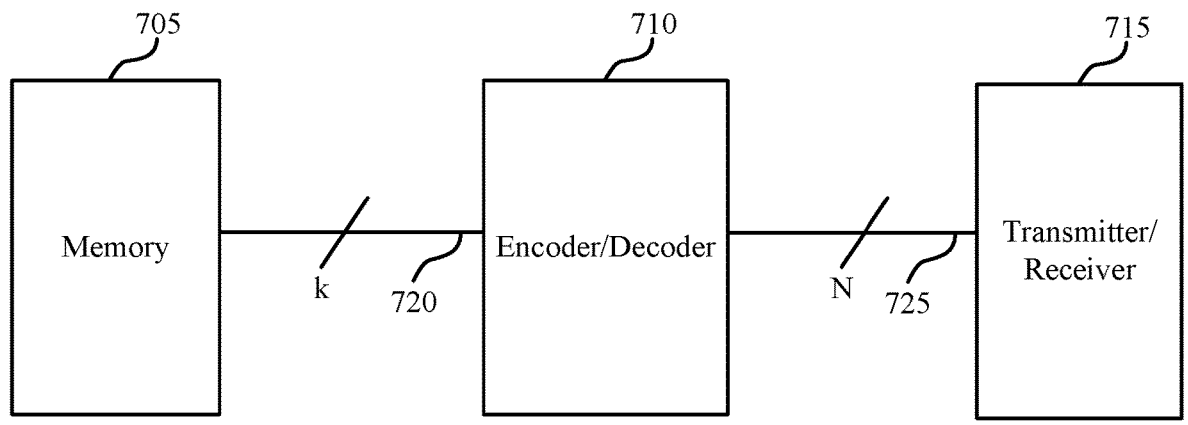
FIG. 7 illustrates an example of a wireless communications system that supports information bit distribution design in accordance with aspects of the present disclosure.

FIG. 7 illustrates an example of a wireless communications device 700 that supports information bit distribution design in accordance with various aspects of the present disclosure. In some examples, device 700 may implement aspects of wireless communications system 100. In some cases, device 700 may be a UE 115 or a base station 105 as described with reference to FIG. 1.

Device 700 may include memory 705, encoder/decoder 710, and transmitter/receiver 715. Bus 720 may connect memory 705 and encoder/decoder 710, and bus 725 may connect encoder/decoder 710 and transmitter/receiver 715. In some instances, device 700 may have data stored in memory 705 to be transmitted to another device, such as, a UE 115 or a base station 105. To initiate data transmission, device 700 may retrieve the data, including information bits, from memory 705 for the transmission. The k information bits included in memory 705 may be passed on to encoder/decoder 710 via bus 720. After the information bits are encoded (e.g., along with a set of N−k frozen bits), a resulting codeword, which may have a length N or greater (e.g., when containing parity bits), may be passed on to transmitter/receiver 715 via bus 725. The number of information bits may be represented as a value k, as shown.

Encoder/decoder 710, acting as an encoder, may encode the k information bits and output a codeword having a length N, where k<N. Parity bits may be used in some forms of outer codes to provide redundancy to protect information bits, and frozen bits may be denoted by a given value (0, 1, etc.) known to both the encoder and the decoder (i.e., the encoder encoding information bits at a transmitter of a first device 700, and the decoder decoding the codeword received at a receiver of a separate device 700). From a transmitting device perspective, device 700 may encode information bits to produce a codeword, and the codeword may be transmitted via transmitter 715. From a receiving device perspective, device 700 may receive encoded data (e.g., a codeword) via receiver 715 and may decode the encoded data using decoder 710 to obtain the information bits.

Device 700 may generate a codeword of length N and dimensionality k (e.g., corresponding to the number of information bits) using a polar code. A polar code is an example of a linear block error correcting code that has been shown to approach channel capacity as the block length N increases. Implementing polar codes may increase the probability of a successful transmission. During encoding, a set of unpolarized bit channels may be transformed into polarized bit channels (e.g., channel instances or sub-channels) that may each be associated with a reliability metric. A reliability metric of a polarized bit channel may approximate the ability of the polarized bit channel to successfully convey an information bit to a receiver. Each polarized bit channel may then be loaded with an information bit or non-information bit (e.g., a frozen bit, parity bit, etc.) for a transmission based on the reliability metrics of different polarized bit channels.

In some cases, reliability metrics may be determined based on a recursive partitioning of bit locations (e.g., channel instances or sub-channels) of the polar code. In a first polarization stage, a set of unpolarized bit channels may be polarized, and the resulting polarized bit channels may each be associated with a reliability metric determined based on the reliability metric (or mutual information (MI)) of the unpolarized bit channels. The polarized bit channels may then be partitioned into sectors or groups based on the determined reliability metrics of the different polarized bit channels. For example, the bit channels corresponding to the single parity check operation may be partitioned into a first, lower reliability group, while the bit channels corresponding to a repetition operation may be partitioned into a second, higher reliability group. The polarization process may continue recursively until each partition reaches a given size.

A device 700 may identify a number of information bits (e.g., of an information bit vector) for transmission, and the transmitting device may allocate or distribute the information bits to different groups of polarized bit channels during the recursive partitioning based on a capacity of the different groups. Since the capacity of the different groups may be based on the reliability metric of different polarized bit channels, subsets of the information bits may be distributed or allocated to different groups of polarized channels based on the reliability metrics associated with the different groups of polarized channels. The information bits may then be assigned to specific polarized bit channels within a group based on a polarization metric (e.g., a polarization weight, a density evolution (DE), etc.). Assigning information bits within each group may be based on a predetermined ranking of bit channels within the groups. As such, the information bits may be loaded on the polarized bit channels associated with the highest reliability metrics, and the remaining bits (e.g., parity bits, frozen bits, or both) may be loaded on the remaining polarized bit channels.

In some cases, however, the capacity of the unpolarized bit channels may not be the same (e.g., due to puncturing). In such cases, if a polar code does not account for punctured bits, the information bits may not be allocated or distributed to the most favorable bit locations (i.e., bit locations associated with the highest reliability). Accordingly, a wireless device may experience reduced throughput. Device 700 may support efficient techniques for facilitating puncturing in a polar coding scheme. Specifically, the recursive partitioning of bit channels into polarized bit channels may be based on the overall capacity for a transmission adjusted based on the number of bits punctured. The capacity of different sectors and groups of polarized bit channels may thus be altered according to the adjusted polarized bit capacity, and a device may be able to allocate or distribute information bits to the most favorable bit locations.

In some examples, the device 700 may map coded bits of a polar code to different groups of bit channels of a certain size 'S' (e.g., 64 bit channels at a third stage of polarization 805-*c*, as described below with reference to FIG. 8).

Figure 8:
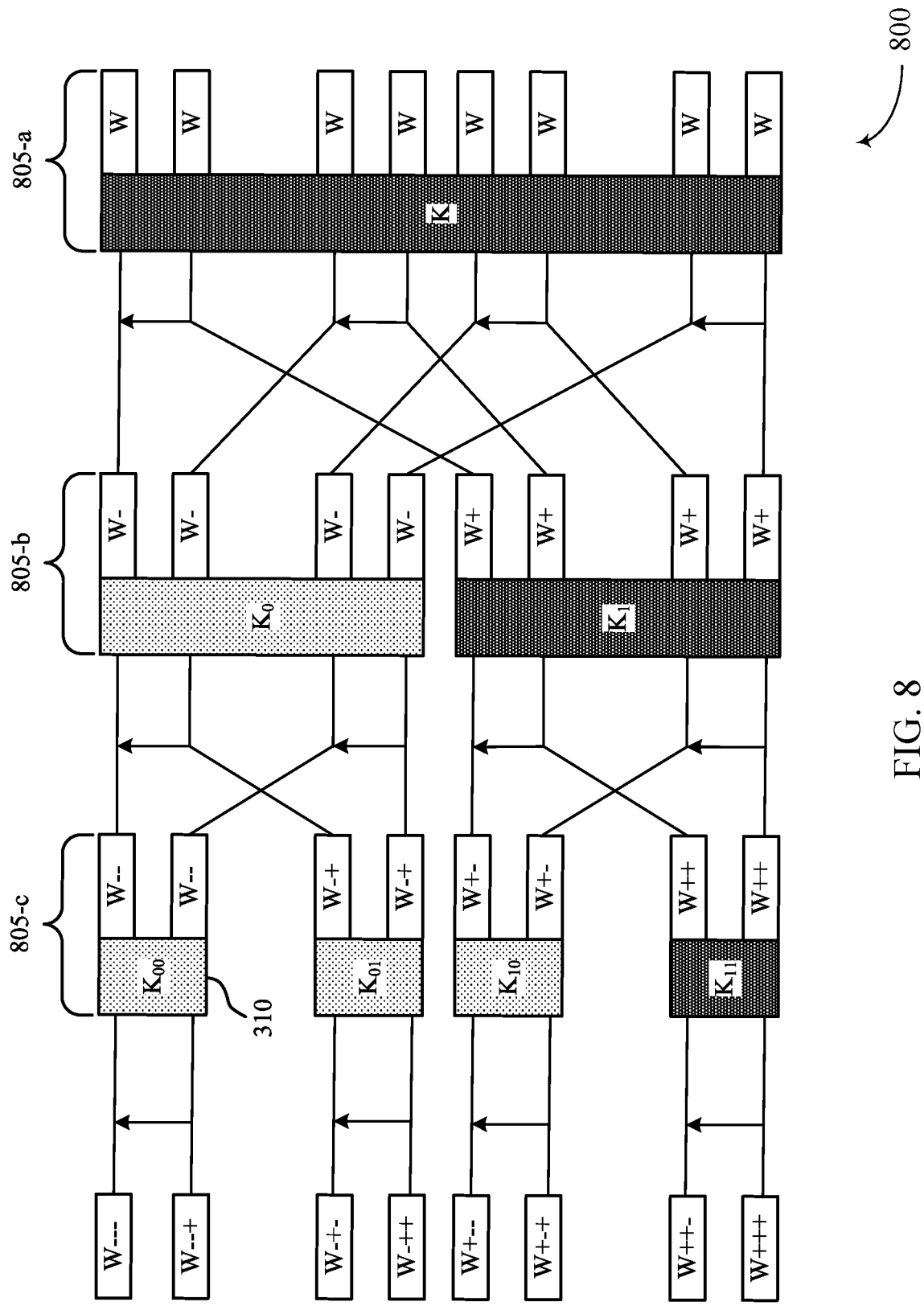
FIG. 8 illustrates an example of a polar code construction scheme that supports information bit distribution design in accordance with aspects of the present disclosure.

FIG. 8 illustrates an example of a polar code construction scheme 800 that supports information bit distribution design in accordance with various aspects of the present disclosure. In some examples, polar code construction scheme 800 may be implemented by aspects of wireless communications system 100 (e.g., a UE 115, base station 105, etc.).

The depicted example is a fractally enhanced kernel (FRANK) polar code construction scheme, which is an iterative polar code construction scheme. The recursion in the iterative polar code construction scheme may be terminated when a specific block size is reached (e.g., a block size equal to or smaller than a certain block size threshold). For example, if the size of a nested polar code is equal to $N_t$, then one or more pre-calculated sequences of length $N_t$ may be used to determine an allocation of information bits within each nested polar code. The one or more pre-calculated sequences may be derived using, for example, polarization-weight techniques, DE techniques, MI techniques, or the like. For example, the pre-calculated sequence may be an example of a bit index reliability sequence described with respect to FIG. 6.

The coded bits may be mapped to bit channels in a group using a fixed sequence that is based on a polarization metric (e.g., polarization weight, DE, etc.). The fixed sequence may be described using $S*\log_2 S$ bits, where 'S' corresponds to the number of bit channels. Additionally, the group that includes each coded bit of the polar code may be described using $$\log_2 \frac{N}{S} \text{bits,}$$

and the groups that include all bits of the polar code may be described using $$N * \log_2 \frac{N}{S} \text{bits.}$$

Thus, the number of bits used to describe the bit locations of all bits in the polar code may be equal to $$S * \log_2 S + N * \log_2 \frac{N}{S} \text{bits.}$$

This may use fewer bits than in the case of using an explicit ordering of bit channels.

As described herein, the bit locations for information bits for a polar code used to encode a codeword to be transmitted or used to decode a received codeword may be efficiently described using recursive partitioning and binary partition assignment vectors. Specifically, bit channels for one or more stages of polarization may be recursively partitioned, and the information bits for each stage of polarization may be assigned to sub-partitions based on a binary partition assignment vector. Each bit of the binary partition assignment vector may determine that an information bit, if present for the partition, is assigned to a first sub-partition (e.g., a higher reliability partition) or a second sub-partition (e.g., a lower reliability partition). As an example, for an information bit of the K information bits in FIG. 8, the wireless device may determine that a binary partition assignment vector at stage 805-*a* indicates that the information bit is loaded onto a bit channel in a lower group of bit channels ($K_1$). The wireless device may then partition the bit channels of the $K_1$ information bits—including the information bit—and determine that a binary partition assignment vector at stage 805-*b* indicates that the information bit is loaded onto a bit channel in a lower group of bit channels ($K_{11}$).

At the third stage of polarization 805-*c*, the recursive partitioning of bit channels may terminate if each group of bit channels at the third stage of polarization 805-*c* includes a certain number of bit channels 'S' (e.g., a number of bit channels that is less than or equal to a threshold number of bit channels). The number of information bits that have propagated to each group may then be assigned to a specific bit channel of the group based on a fixed sequence. Using these techniques, the bit locations of each coded bit of a polar code may be described using N bits at stage 805-*a* and N/2 bits at stage 805-*b*. Then, at stage 805-*c*, the bit locations of each coded bit may be based on the fixed sequence which may be described using $S*\log_2 S$ bits. Thus, the number of bits used to describe the bit locations of all bits in the polar code may be equal to $S*\log_2 S+N+N/2$ bits, which may be less than the number of bits used to describe the bit locations of all bits in the polar code using the other conventional techniques described above. The technique can be extended as additional stages are present in the polar code to support higher values of N. The number of bits used for any given value of N may be given by $S*\log_2 S$ plus the sequence $$N + \frac{N}{2} + \frac{N}{4} \ldots + 2S,$$

which approaches the limit of 2N as N increases. Thus, the upper bound for describing the locations for information bits of the polar code having any of multiple code lengths satisfying $2^m$, where m is an integer, up to and including N, may be given by $S*\log_2 S+2N$.

Figure 9:
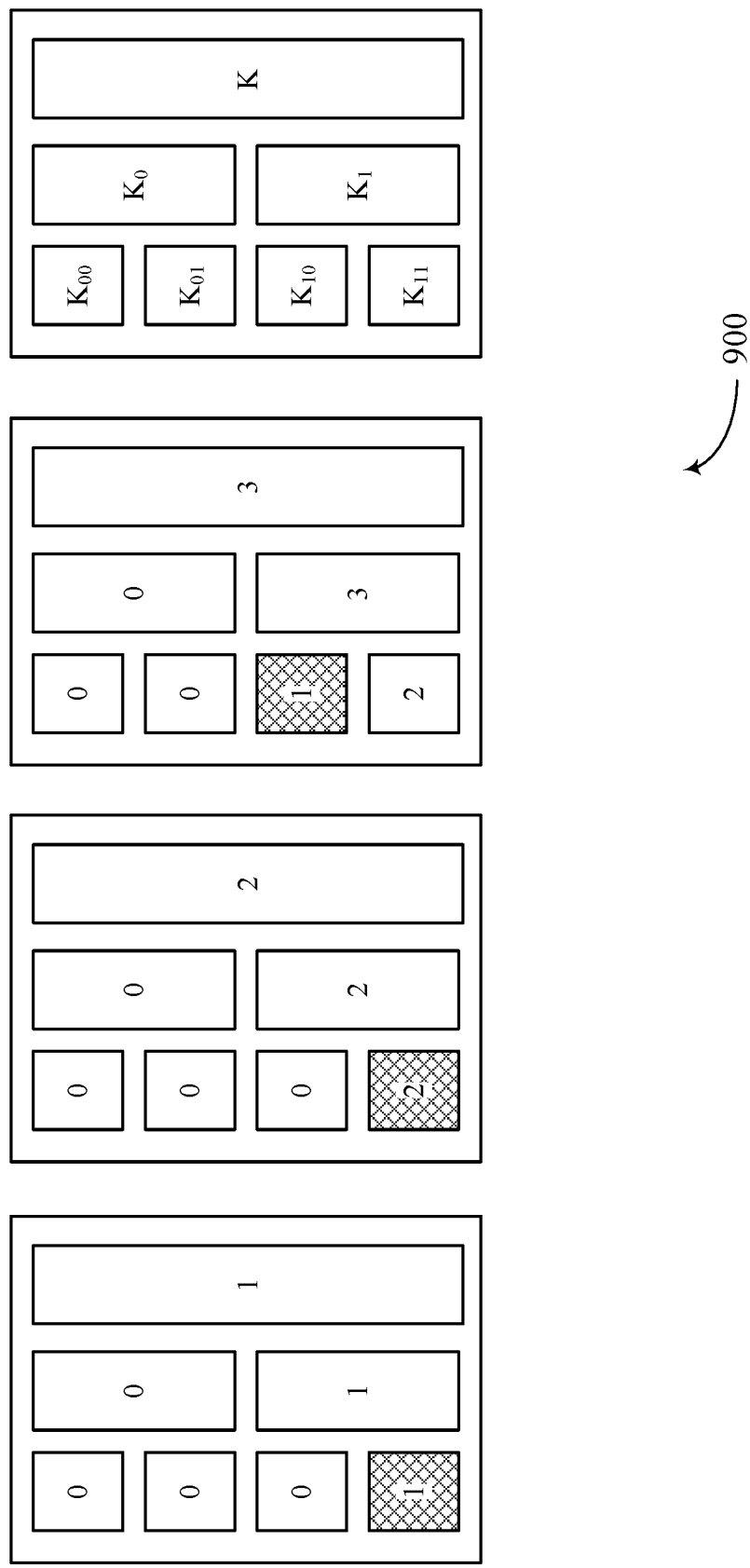
FIG. 9 illustrates an example of a polar code construction scheme that supports information bit distribution design in accordance with aspects of the present disclosure.

FIG. 9 illustrates an example of a polar code construction scheme 900 that supports information bit distribution design in accordance with various aspects of the present disclosure. In some examples, polar code construction scheme 900 may implement aspects of wireless communications system 100. The depicted example may provide a reduced description complexity scheme for constructing a polar code. Short sequence(s) may be used in the iterative polar code construction scheme of FIG. 8. For each information bit, an indication may be used to indicate which small sequence it is mapped to. The mapping may indicate whether each bit is mapped to the more reliable sequence(s) or less reliable sequence(s). In the depicted example, log(N/S) bits may be used for each increment of K.

As illustrated, in one specific example, if K=1, the one information bit may be mapped to the $K_{11}$ partition (e.g., the $K_{11}$ group of bit channels). Similarly, if K=2, the two information bits may be mapped to the $K_{11}$ partition. However, if K=3, two of the three information bits may be mapped to the $K_{11}$ partition, and one of the three information bits may be mapped to the $K_{10}$ partition. Which information bit is mapped to which of the allocated partitions may be based on priority values of the information bits, an order of the information bits in the information bit vector, or any other procedure for splitting the bits between the partitions. It is to be understood that further bit allocations may be defined for larger values of K, larger numbers of partitions, etc.

Figure 10:
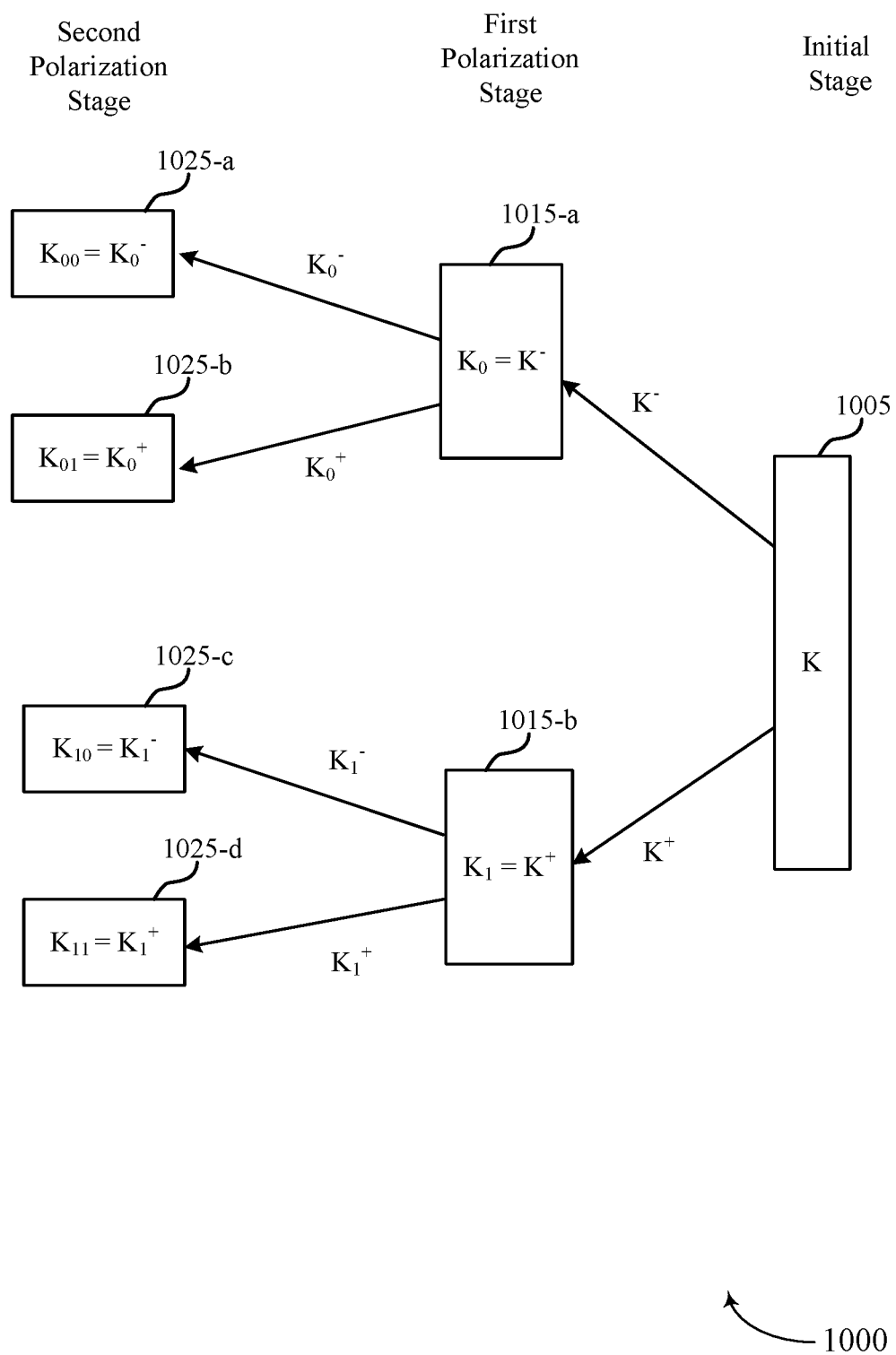
FIG. 10 illustrates an example of a polar code construction scheme that supports information bit distribution design in accordance with aspects of the present disclosure.

FIG. 10 illustrates an example of a polar code construction scheme 1000 that supports information bit distribution design in accordance with various aspects of the present disclosure. In some examples, aspects of wireless communications system 100 (e.g., UEs 115, base stations 105, etc.) may implement polar code construction scheme 1000.

Depicted on the right in an initial stage is an unpolarized bit sequence having K information bits 1005 and N total bits (e.g., information and frozen bits). The polar code construction scheme 1000 may partition the K information bits at first and second polarization stages. At the first polarization stage, $K_0$ of the K information bits may be allocated to partition 1015-a, and $K_1$ of the K information bits may be allocated to partition 1015-b. At the second polarization stage, $K_{00}$ of the $K_0$ information bits may be allocated to partition 1025-a, and $K_{01}$ of the $K_0$ information bits may be allocated to partition 1025-b. Also at the second polarization stage, $K_{10}$ of the $K_1$ information bits may be allocated to partition 1025-c, and $K_{11}$ of the $K_1$ information bits may be allocated to partition 1025-d. It should be understood that the techniques described herein may be applied to additional polarization stages than those illustrated in FIG. 10.

In a sequence based polar code description, a collective sum MI of $W_i^+$ and $W_i^-$ channels at a particular polarization stage may be defined as $R_i^+$ and $R_i^-$ respectively, where $R_i^+$ and $R_i^-$ are derived from the MI of channel $W_i$. Recursion using the following baseline rate allocation rule may be used for allocating information bits:

$$K_i^+ = \begin{cases} \lceil R_i^+ \times N_i/2 \rceil, & \text{when } K_i \leq 0.5N_i \\ \lfloor R_i^+ \times N_i/2 \rfloor, & \text{when } K_i > 0.5N_i \end{cases},$$

where i identifies a particular partition in a particular polarization stage, $K_i$ represents the number of information bits at partition i, and $N_i$ represents the total number of bits of partition i. It should be noted that the "⌈ ⌉" symbol represents a ceiling operation and the "⌊ ⌋" symbol represents a floor operation.

The total number of bits of a partition may decrease by half at each polarization stage. In such a case, the total number of bits at the initial stage is N bits, the total number of bits for each partition (e.g., partitions $K_0$, $K_1$) at the first polarization stage is N/2 bits, the total number of bits for each partition (e.g., partitions $K_{00}$, $K_{01}$, $K_{10}$, $K_{11}$) at the second polarization stage is N/4 bits, and so forth. As shown in FIG. 10, the number of information bits $K_1$ at partition 1015-b may be determined using the above equation based on the number of information bits K at the initial stage and the total number of information bits at the partition (e.g., $N_1$=N/2 bits). Similarly, the number of information bits $K_{11}$ at partition 1025-d may be determined using the above equation based on the number of information bits $K_1$ and the total number of information bits at partition 1025-d (e.g., $N_{11}$=$N_1$/2 bits=N/4 bits). Also, the number of information bits $K_{01}$ at partition 1025-b may be determined using the above equation based on the number of number of information bits $K_0$ and the total number of information bits at partition 1025-b (e.g., $N_{01}$=$N_0$/2 bits=N/4 bits). It follows that the number of information bits $K_{00}$ at partition 1025-a may be determined based on the output of the above equation, as $K_0^-$=$K_0$-$K_0^+$.

For an additive white Gaussian noise (AWGN) channel, the relationship between $R_i^+$, $R_i^-$ and $R_i$ may be defined as:

$$C_{awgn}^+ = 2C - C^2 - \alpha \text{ and } C_{awgn}^- = C^2 + \alpha,$$

where $$\alpha = -\frac{|C - 0.5|}{32} + \frac{1}{64},$$

or $\alpha$=0.

It should be noted that $R_i^+$ may correspond to or may be put into the above equations as the value of $C_{awgn}^+$, $R_i^-$ may correspond to or may be put into the above equations as the value of $C_{awgn}^-$, and $R_i$ may correspond to or may be put into the above equations as the value of C.

The above equation for determining $K_i^+$ may provide symmetric or substantially symmetric allocation of information bits and frozen bits to each partition. In some situations, introducing asymmetry may improve performance of the polar code, such as at a quantization boundary where symmetry may not be necessary or may be undesirable. A quantization boundary may occur where a bit could be allocated either to a $W^-$ or $W^+$ channel. Conventionally, low rate information bit allocation has been considered a dual of high rate frozen bit allocation. Thus, conventionally there has been a symmetric relationship between allocation of frozen bits and information bits. Information bits are considered to have a low rate (e.g., a low coding rate) when frozen bits have a high rate, and information bits are considered to have a high rate when frozen bits have a low rate. However, this may not always be the case. For low rate information bit allocation, the techniques described herein generally allocate an information bit to $W^+$ to be more conservative because over-allocating information bits to $W^-$ may cause large degradation and conservative $K^-$ allocation of information bits may be desirable. In some examples, up to all frozen bits may be allocated to $W^-$. For a low coding rate, it may be in general better to allocate information bit(s) to $W^+$ to be more conservative.

For high rate information bit allocation, the techniques described herein may allocate a frozen bit to $W^+$ to be more conservative because over-allocation of information bits to $W^+$ may cause large degradation and conservative $K^+$ allocation of information bits may be desirable. In some examples, allocation of up to all frozen bits to $W^-$ may be preferred. At the quantization boundary, symmetry may not hold and different quantization rules described below may be used to break the symmetry.

The examples described herein may provide one or more quantization rules to introduce asymmetry based on the baseline rate allocation rule. In the baseline rate allocation rule, the "$\lceil \ \rceil$" symbol represents a ceiling operation and the "$\lfloor \ \rfloor$" symbol represents a floor operation. As a result, at the quantization boundary, the number of information bits $K_i^+$ may approach $N_i/2$ as $R_i$ approaches 1, but $K_i^+$ may never reach $N_i/2$ under the baseline rate allocation rule. To introduce asymmetry, one or more quantization rules may be used for determining when to set the number of information bits $K_i^+$ to a fixed value. In some cases, the fixed value is a function of a number of bit channels of the partition and may be equal to the number of bit channels of the partition (e.g., $N_i/2$).

Below are examples of Rule 1 and Rule 2 of information bit allocation (asymmetric) quantization rules:

Rule 1:

$$K_i^+ = N_i/2, \text{ when } (1-R_i^+) \times N_i/2 \leq \Delta,$$

where, in one example, $$\Delta = \frac{1}{32} + \frac{1}{16}.$$

In a second example, $$\Delta = \frac{1}{16},$$

or it may be equal to other values (e.g., the value of $\Delta$, in some cases, may depend on $N_i$).

Rule 2:

$$K_i^+ = \frac{N_i}{2}, \text{ when } K_i \geq N_i - \log_2(N_i) + \delta,$$

where $\delta=0$, or $\delta$ may be a correction term (e.g., the value of $\delta$ may depend on $N_i$). In some examples, the values for $\Delta$, $\delta$, or both may be selected to generally ensure or enforce a UPO.

Rule 1 may be used to set the number of information bits $K_i^+$ to a fixed value when the collective capacity $R_i^+$ approaches 1 such that a corresponding difference (e.g., a difference between the collective capacity $R_i^+$ when multiplied by the total number of information bits in the partition and the total number of information bits in the partition $K_i^+$) is less than or equal to a threshold. The threshold may be dependent on the number of bit channels of the partition and/or may be selected to maintain a UPO of the bit channels of the partition.

Rule 2 may be used to set the number of information bits $K_i^+$ to a fixed value when the calculated number of information bits $K_i$ exceeds a difference between the total number of bits $N_i$ of a partition and $\log_2(N_i)$. Rule 2 may be a function of a code rate of the partition and/or may be selected to maintain a UPO of the bit channels of the partition.

The baseline rate allocation rule above may not indicate the number of information bits $K_i^-$, which may be determined as a function of $K_i^+$ by subtracting $K_i$ from $K_i^+$ (e.g., according to $K_i^- = K_i - K_i^+$). The baseline rate allocation rule and one or more of the quantization rules may be recursively applied to determine the number of information bits K for each partition in the polar code construction scheme 1000. For example, either one or the other quantization rule may be applied or some combination of the rules may be applied, and the number of information bits $K_i^+$ may be set to the fixed value if either rule is satisfied.

The examples provided herein may be utilized with other baseline rate allocation rules. For example, the baseline rate allocation rule described above may be generalized when MI of a set of bits is determined to be reliable (e.g., if the capacity exceeds a threshold). In this case, the set of bits may be allocated with R=1, while otherwise, bits may be allocated to other blocks (i.e., sets of bits).

When accumulative MI, R, is close enough (e.g., less than a threshold difference) to the number of coded bits, $K_i^+$ and $K_i^-$ may be directly saturated to the corresponding number of unpunctured coded bits, where the number of unpunctured coded bits of $W_i^+$ and $W_i^-$ may be defined as $M_i^+$ and $M_i^-$ using the following equations:

$$K_i^+ = \begin{cases} M_i^+, & \text{when } M_i^+ - I_i^+ \leq \Delta \\ K - M_i^-, & \text{when } M_i^+ - I_i^+ \leq \Delta, M_i^+ - I_i^+ > \Delta \end{cases}, \Delta = \frac{1}{32} + \frac{1}{16},$$

Like above, $K_i^-$ may be obtained by subtracting $K_i$ from $K_i^+$, such that $K_i^- = K_i - K_i^+$.

These techniques may be used for determining the number of information bits allocated to partitions at each polarization stage shown in FIG. 10, and the techniques may be extended to any desired number of polarization stages.

With reference again to FIG. 7, the wireless communications system 700 may implement these techniques. The following describes a base station 105 encoding a codeword using these techniques for transmission to a UE 115 and the UE 115 receiving and decoding the codeword. The roles may be reversed, and the UE 115 may encode a codeword using these techniques for transmission to the base station 105, with the base station 105 receiving and decoding the codeword.

In an example, an encoder 710 of transmitting device (e.g., a base station 105) may encode a codeword using a polar code for a transmission over a wireless channel, where the codeword includes an information bit vector including multiple information bits. The encoder 710 may identify a set of bit locations of a polar code for a set of information bits, where the set of bit locations is determined based on a recursive partitioning of multiple bit channels of the polar code for at least a subset of polarization stages of the polar code, as described in FIGS. 8 and 10. The encoder 710 may, for each partition of at least the subset of the polarization stages of the polar code, assign portions of a number of the information bits of each partition to bit channel sub-partitions. The encoder 710 may apply at least one quantization rule, such as Rule 1 and/or Rule 2, for determining whether to assign a first number of the information bits of a first bit channel sub-partition of the bit channel sub-partitions to a fixed value. In some cases, encoder 710 may, for a particular partition, assign a number of information bits of the particular partition based on the baseline allocation rule. In some examples, the encoder 710 may assign portions of a number of the information bits of each partition to bit channel sub-partitions by adjusting the information bit allocation derived based on the recursive partitioning to be compliant with a UPO. The encoder 710 may adjust the information bit allocation by constructing a sequence for a partition that is compliant with the UPO, generate a bit vector for assigning the number of the information bits according to an MI recursion equation, and compare an order resulting from the bit vector to the UPO. In some examples, the encoder 710 may determine, for a value of the bit vector for the partition, that the order resulting from the value of the bit vector violates the UPO and may swap the value of the bit vector with an adjacent value of the bit vector based on identifying that the value violates the UPO. In some examples, encoder 710 may determine the sequence is determined based on a binary bit weighting that applies multiple weighting factors for the bit channels of the partition, similar to that described above in FIG. 4. The encoder 710 may provide the codeword encoded according to the polar code based on the set of bit locations to the transmitter 715. The transmitter 715 of the transmitting device may transmit the encoded codeword over the wireless channel.

At a receiving device (e.g., a UE 115), a receiver 715 may receive the encoded codeword, and a decoder 715 may identify the set of bit locations of the polar code for the set of information bits using a similar process to that described above for the encoder 710. The decoder 710 may decode the received codeword according to the polar code to obtain an information bit vector at the set of bit locations. The UE 115 and the base station 105 may, in some examples, exchange a table that includes different sets of bit locations, and may exchange control information that includes an index indicating which set of bit locations to use for encoding and decoding of a codeword. In some cases, the devices may be pre-configured with a table (e.g., a lookup table), where the table is generated using one or more of the techniques described above. An encoding device and a decoding device may each use a lookup table stored in memory to determine bit indices for information bits (e.g., where the values in the lookup table are based on the quantization rules as described above).

In some instances, the baseline allocation rules or quantization rules may result in an allocation of information bits that may violate UPO. An additional bit-reordering step may be applied to provide a UPO compliant polar code information allocation.

Figure 11:
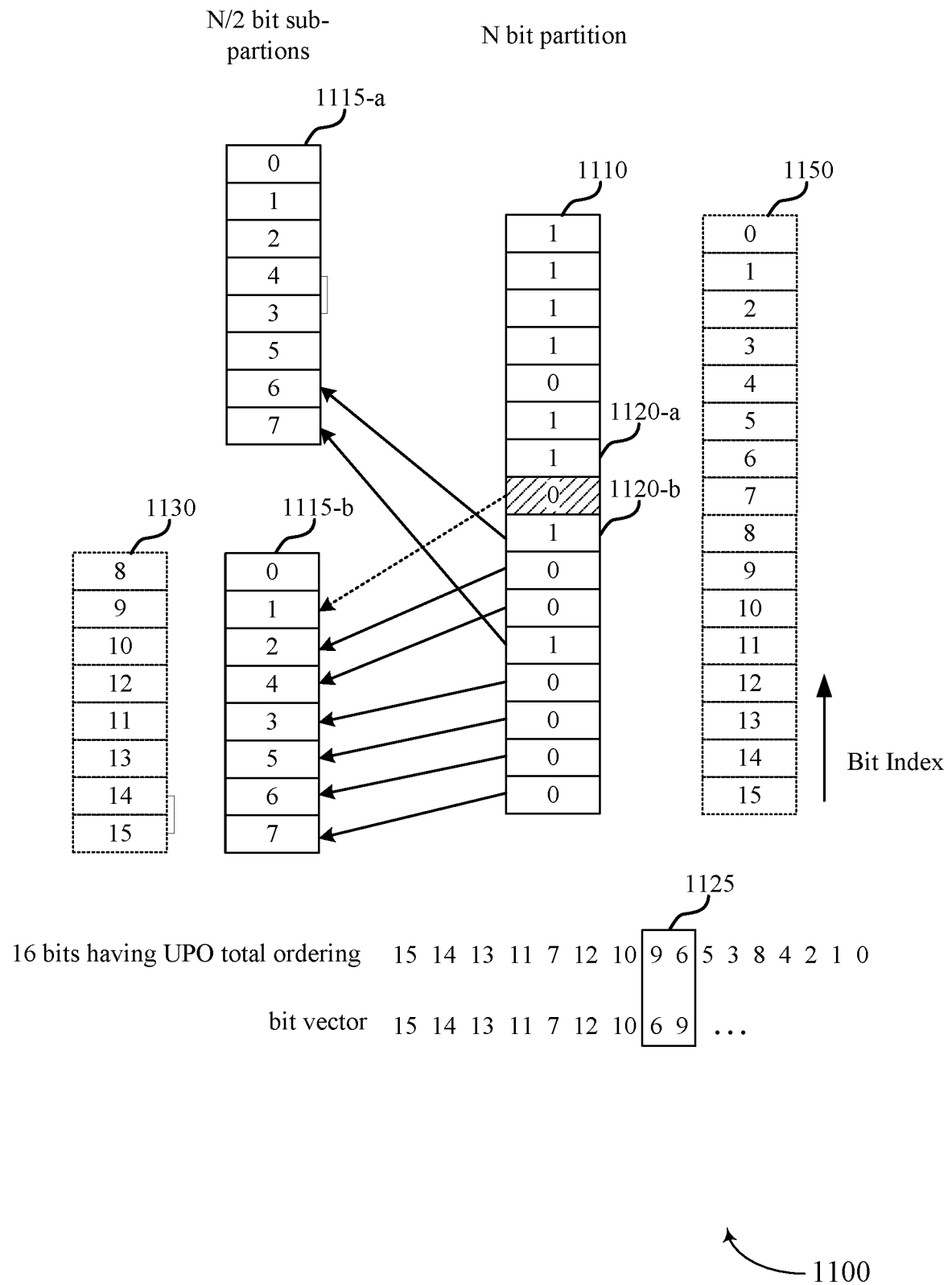
FIG. 11 illustrates an example of a bit sequence reordering diagram that supports information bit distribution design in accordance with aspects of the present disclosure.

FIG. 11 illustrates an example of diagram 1100 of bit sequence reordering that supports information bit distribution design in accordance with various aspects of the present disclosure. In some examples, bit sequence reordering diagram 1100 may correspond to processes or functions performed by aspects of wireless communications system 100 (e.g., base stations 105 or UEs 115).

For a large value of N, information bits may be distributed by updating the sequence information allocation and quantization of corner points based on the following operations.

In a first operation (e.g., Operation 1), a device or module may construct, sequences (e.g., N/2 short sequences) for both W⁻ and W⁺ that are UPO compliant. The sequences may be constructed by using a binary bit weighting for the bit channels of a partition that applies a set of weighting factors (e.g., the weighting factor for one sequence may be different than another sequence, or one of the sequences may be generated using more than one weighting factor), similar to the description provided above with reference to FIGS. 4 and 5.

In a second operation (e.g., Operation 2), the device or module may generate a bit-vector for assigning the information bits according to an MI recursion equation.

In a third operation (e.g., Operation 3), the device or module may compare an order resulting from the bit vector to the order corresponding to a UPO. For any value of the bit vector that violates the UPO, the device or module may swap the violating value of the bit vector with an adjacent value of the bit vector (e.g., allocate that particular bit point to the other partition to comply with the UPO).

The device or module may repeat Operations 2 and 3 until reaching the end of the N bit sequence. This process may be performed in order to generate a lookup table, or may be performed during encoding or decoding of a codeword.

In FIG. 11, an example of operations 1-3 is depicted. An N bit sequence in partition 1110 is being mapped to a N/2 bit sequence in partitions 1115-*a* and 1115-*b*. The N bit sequence and the N/2 bits sequences may each also be referred to as a binary array. In the illustrated example, N=16 bits. Column 1150 is provided as a reference to show an index of each bit in the sequence from 15 to 0. A value of "1" in the binary array of partition 1110 indicates that a bit in the N bit sequence is being allocated to partition 1115-*a*, and a "0" in the binary array of partition 1110 indicates that a bit in the N bit sequence is being allocated to partition 1115-*b*. Bit 15 has a value of 0, and, accordingly, is being allocated to bit 7 of partition 1115-*b*. Bit 11 has a value of 1, and is being allocated to bit 7 of partition 1115-*a*. Thus, bits 4, 7, 9, 10, and 12-15 are being allocated to partition 1115-*b*, and bits 0-3, 5, 6, 8, and 11 are being allocated to partition 1115-*a*.

In an example, a 16 bit sequence has the following UPO total ordering: [15, 14, 13, 11, 7, 12, 10, 9, 6, 5, 3, 8, 4, 2, 1, 0]. This sequence may be used in operation 1 to construct two 8 bit sequences. A bit vector generated in operation 2 has the following ordering: [15, 14, 13, 11, 7, 12, 10, 6, 9, 5, 3, 8, 4, 2, 1, 0]. As can be seen at 1125 (see FIG. 11), the order of bits 6 and 9 in the bit vector does not match the order of bits 9 and 6 under the UPO total ordering (e.g., the bits are reversed), and hence bits 6 and 9 in the bit vector violate the UPO. The bit causing the UPO violation in the N bit binary array of partition 1110 is shaded.

To remove the UPO violation, the shaded bit may be swapped with a bit in the N bit binary array having a value of '1' immediately above (1120-*a*) or immediately below (1120-*b*), or may be swapped with any other bit initially allocated for partition 1115-*a*. Swapping of a bit (e.g., an adjacent bit) is used to remedy the UPO violation. Thus, whenever a '0' or a '1' in the bit-vector results in a violation of the UPO, the violating bit may be swapped with the next '1' or '0' above or below the violating bit (e.g., swapping a '0' with a '1,' or a '1' with a '0'). In some examples, it may be preferred to swap the violating bit with a bit having the opposite value that is immediately below in the N bit binary array. In other examples, the violating bit may be swapped with the next bit having the opposite value that is anywhere below the violating bit in the N bit binary array. Beneficially, the techniques described herein may provide for an improved distribution of information bits.

Figure 12:
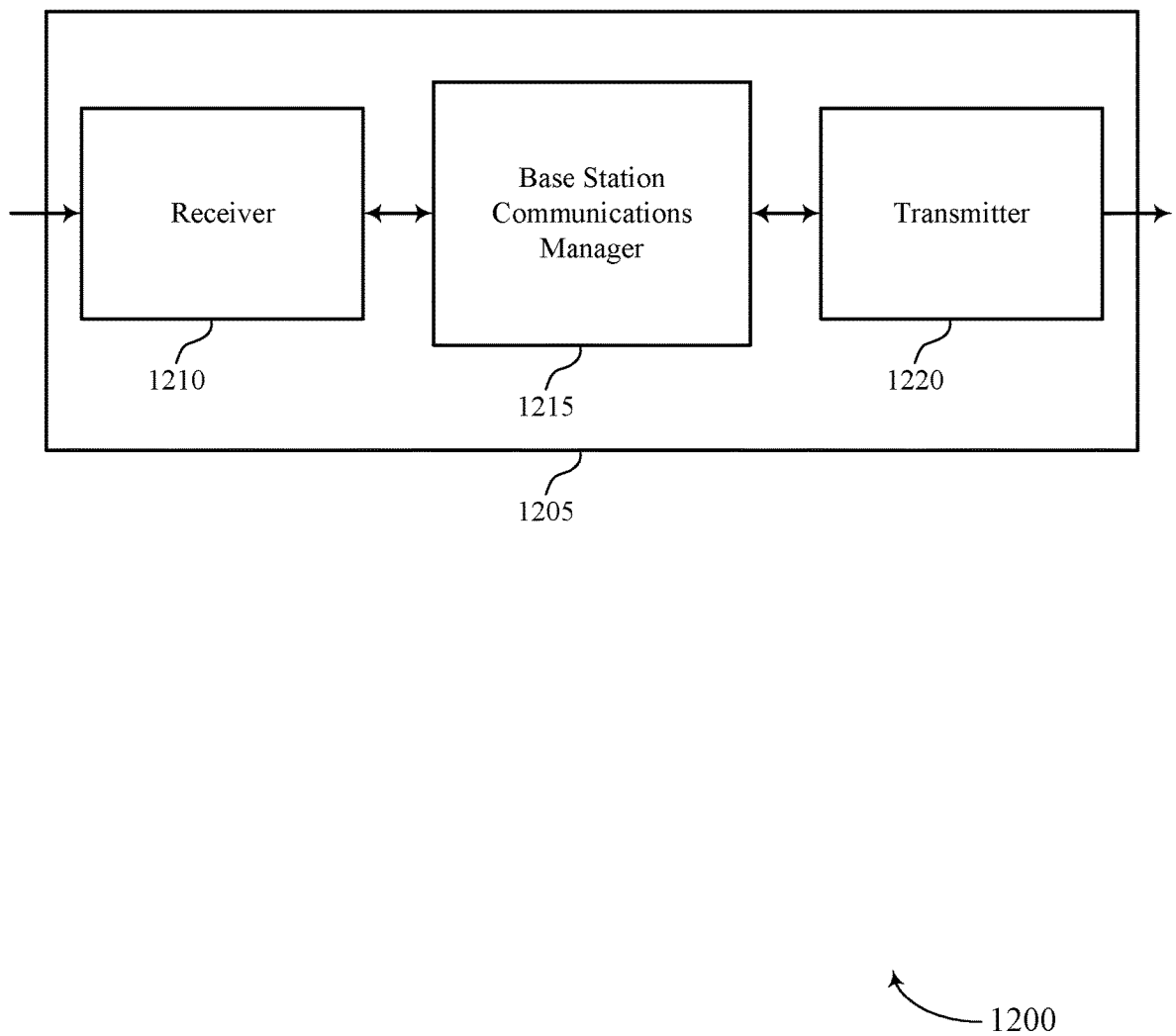
FIGS. 12 through 14 show block diagrams of a device that supports information bit distribution design in accordance with aspects of the present disclosure.

FIG. 12 shows a block diagram 1200 of a wireless device 1205 that supports information bit distribution design in accordance with aspects of the present disclosure. Wireless device 1205 may be an example of aspects of a base station 105 as described herein. Wireless device 1205 may include receiver 1210, base station communications manager 1215, and transmitter 1220. Wireless device 1205 may also include a processor. Each of these components may be in communication with one another (e.g., via one or more buses).

Receiver 1210 may receive information such as packets, user data, or control information associated with various information channels (e.g., control channels, data channels, and information related to information bit distribution design, etc.). Information may be passed on to other components of the device. The receiver 1210 may be an example of aspects of the transceiver 1535 described with reference to FIG. 15. The receiver 1210 may utilize a single antenna or a set of antennas.

Base station communications manager 1215 may be an example of aspects of the base station communications manager 1515 described with reference to FIG. 15.

Base station communications manager 1215 and/or at least some of its various sub-components may be implemented in hardware, software executed by a processor, firmware, or any combination thereof. If implemented in software executed by a processor, the functions of the base station communications manager 1215 and/or at least some of its various sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure. The base station communications manager 1215 and/or at least some of its various sub-components may be physically located at various positions, including being distributed such that portions of functions are implemented at different physical locations by one or more physical devices. In some examples, base station communications manager 1215 and/or at least some of its various sub-components may be a separate and distinct component in accordance with various aspects of the present disclosure. In other examples, base station communications manager 1215 and/or at least some of its various sub-components may be combined with one or more other hardware components, including but not limited to an input/output (I/O) component, a transceiver, a network server, another computing device, one or more other components described in the present disclosure, or a combination thereof in accordance with various aspects of the present disclosure.

Base station communications manager 1215 may encode a codeword using a polar code for a transmission over a wireless channel, where the codeword includes an information bit vector including a set of information bits, and may identify a set of bit locations of the polar code for the set of information bits. The set of bit locations may be determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel sub-partition of the bit channel sub-partitions to a fixed value. Base station communications manager 1215 may transmit the encoded codeword over the wireless channel according to the polar code based on the set of bit locations.

In some cases, the base station communications manager 1215 may also encode a codeword using a polar code for a transmission over a wireless channel, where the codeword includes an information bit vector including a set of information bits, and may identify a set of bit locations of the polar code for the set of information bits. The set of bit locations may be determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO. Base station communications manager 1215 may transmit the encoded codeword over the wireless channel according to the polar code based on the set of bit locations.

Transmitter 1220 may transmit signals generated by other components of the device. In some examples, the transmitter 1220 may be collocated with a receiver 1210 in a transceiver module. For example, the transmitter 1220 may be an example of aspects of the transceiver 1535 described with reference to FIG. 15. The transmitter 1220 may utilize a single antenna or a set of antennas.

Figure 13:
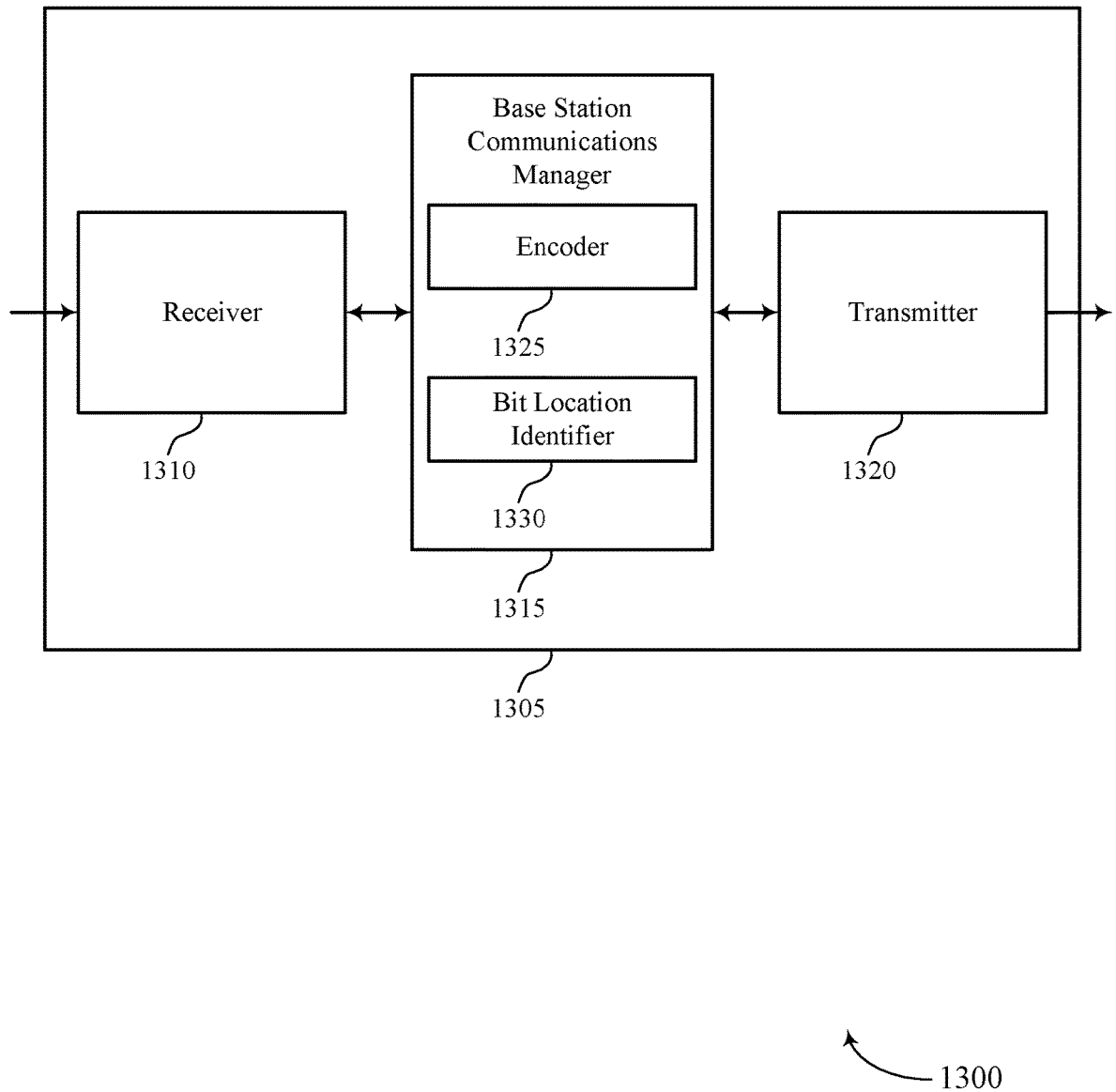

FIG. 13 shows a block diagram 1300 of a wireless device 1305 that supports information bit distribution design in accordance with aspects of the present disclosure. Wireless device 1305 may be an example of aspects of a wireless device 1205 or a base station 105 as described with reference to FIG. 12. Wireless device 1305 may include receiver 1310, base station communications manager 1315, and transmitter 1320. Wireless device 1305 may also include a processor. Each of these components may be in communication with one another (e.g., via one or more buses).

Receiver 1310 may receive information such as packets, user data, or control information associated with various information channels (e.g., control channels, data channels, and information related to information bit distribution design, etc.). Information may be passed on to other components of the device. The receiver 1310 may be an example of aspects of the transceiver 1535 described with reference to FIG. 15. The receiver 1310 may utilize a single antenna or a set of antennas.

Base station communications manager 1315 may be an example of aspects of the base station communications manager 1515 described with reference to FIG. 15.

Base station communications manager 1315 may also include encoder 1325 and bit location identifier 1330.

Encoder 1325 may encode a codeword using a polar code for a transmission over a wireless channel, where the codeword includes an information bit vector including a set of information bits and may transmit the encoded codeword over the wireless channel according to the polar code based on a set of bit locations.

Bit location identifier 1330 may identify the set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel sub-partition of the bit channel sub-partitions to a fixed value. Additionally or alternatively, bit location identifier 1330 may identify a set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO.

Transmitter 1320 may transmit signals generated by other components of the device. In some examples, the transmitter 1320 may be collocated with a receiver 1310 in a transceiver module. For example, the transmitter 1320 may be an example of aspects of the transceiver 1535 described with reference to FIG. 15. The transmitter 1320 may utilize a single antenna or a set of antennas.

Figure 14:
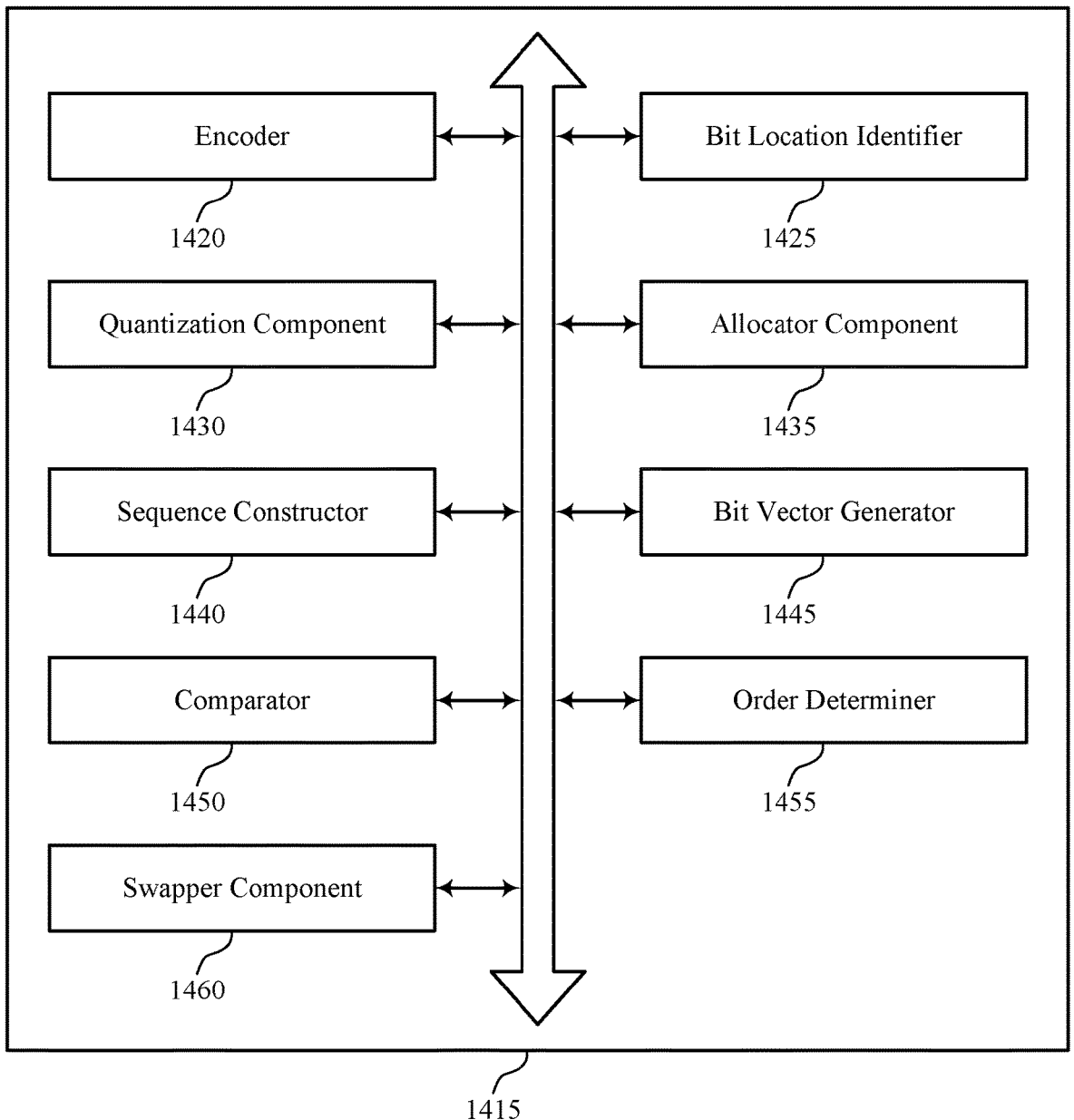

FIG. 14 shows a block diagram 1400 of a base station communications manager 1415 that supports information bit distribution design in accordance with aspects of the present disclosure. The base station communications manager 1415 may be an example of aspects of a base station communications manager 1215, 1315, or 1515 described with reference to FIGS. 12, 13, and 15. The base station communications manager 1415 may include encoder 1420, bit location identifier 1425, quantization component 1430, allocator component 1435, sequence constructor 1440, bit vector generator 1445, comparator 1450, order determiner 1455, and swapper component 1460. Each of these modules may communicate, directly or indirectly, with one another (e.g., via one or more buses).

Encoder 1420 may encode a codeword using a polar code for a transmission over a wireless channel, where the codeword includes an information bit vector including a set of information bits. Encoder 1420 may additionally transmit the encoded codeword over the wireless channel according to the polar code based on a set of bit locations.

In some cases, bit location identifier 1425 may identify the set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel sub-partition of the bit channel sub-partitions to a fixed value. In some cases, bit location identifier 1425 may identify a set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO.

Quantization component 1430 may determine a quantization rule. In some cases, a first quantization rule of the at least one quantization rule sets the first number to the fixed value as a function of a capacity of the first bit channel sub-partition. In some cases, the first quantization rule applies a threshold that is dependent on a number of bit channels of each partition. In some cases, the threshold is selected to maintain a UPO of the bit channels of each partition. In some cases, a first quantization rule of the at least one quantization rule sets the first number to the fixed value as a function of a code rate of each partition. In some cases, the function is selected to maintain a UPO of the bit channels of each partition. In some cases, the fixed value is a function of a number of bit channels of each partition. In some cases, the fixed value is equal to a number of bit channels of each partition.

Allocator component 1435 may assign, for a second partition of the each partitions, a second number of information bits of the second partition to a second bit channel sub-partition of the second partition based on a baseline allocation rule. In some cases, the baseline allocation rule applies a floor operation to a result of a function of a capacity of the second bit channel sub-partition and a number of bit channels in the second bit channel sub-partition when the second number of information bits is less than or equal to the number of bit channels in sub-partitions of the second partition. In some cases, the baseline allocation rule applies a ceiling operation to a result of a function of a capacity of the second bit channel sub-partition and a number of bit channels in the second bit channel sub-partition when the second number of information bits is greater than the number of bit channels in sub-partitions of the second partition.

Sequence constructor 1440 may construct a sequence for each partition that is compliant with the UPO. In some cases, the sequence is determined based on a binary bit weighting for the bit channels of each partition that applies a set of weighting factors.

Bit vector generator 1445 may generate a bit vector for assigning the information bits according to an MI recursion equation.

Comparator 1450 may compare an order resulting from the bit vector to the UPO.

Order determiner 1455 may determine, for a value of the bit vector for at least one of the partitions, that the order resulting from the value of the bit vector violates the UPO.

Swapper component 1460 may swap the value of the bit vector with an adjacent value of the bit vector based on identifying that the value violates the UPO.

Figure 15:
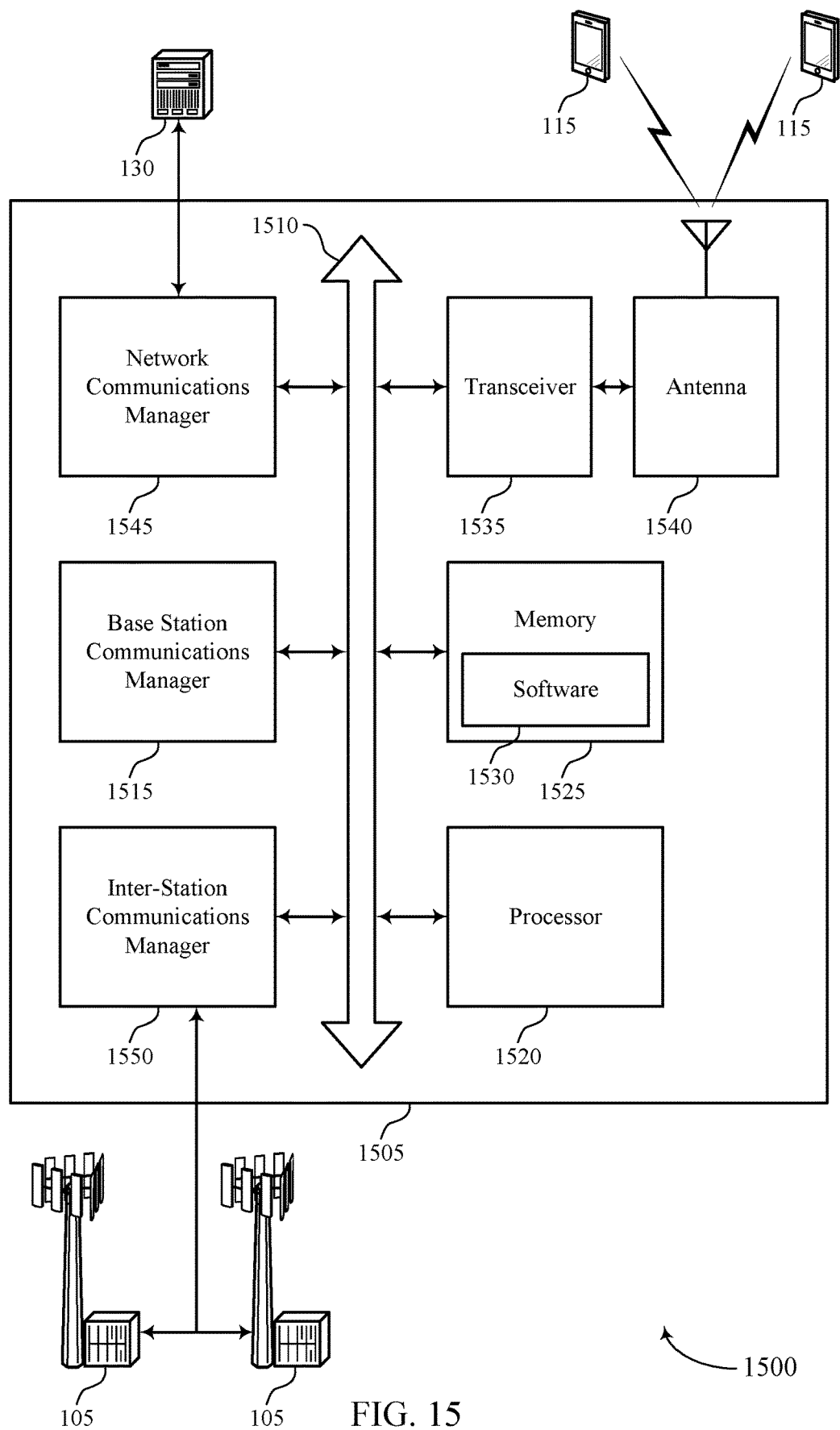
FIG. 15 illustrates a block diagram of a system including a base station that supports information bit distribution design in accordance with aspects of the present disclosure.

FIG. 15 shows a diagram of a system 1500 including a device 1505 that supports information bit distribution design in accordance with aspects of the present disclosure. Device 1505 may be an example of or include the components of wireless device 1205, wireless device 1305, or a base station 105 as described above, e.g., with reference to FIGS. 12 and 13. Device 1505 may include components for bi-directional voice and data communications including components for transmitting and receiving communications, including base station communications manager 1515, processor 1520, memory 1525, software 1530, transceiver 1535, antenna 1540, network communications manager 1545, and inter-station communications manager 1550. These components may be in electronic communication via one or more buses (e.g., bus 1510). Device 1505 may communicate wirelessly with one or more UEs 115.

Processor 1520 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1520 may be configured to operate a memory array using a memory controller. In other cases, a memory controller may be integrated into processor 1520. Processor 1520 may be configured to execute computer-readable instructions stored in a memory to perform various functions (e.g., functions or tasks supporting information bit distribution design).

Memory 1525 may include random access memory (RAM) and read only memory (ROM). The memory 1525 may store computer-readable, computer-executable software 1530 including instructions that, when executed, cause the processor to perform various functions described herein. In some cases, the memory 1525 may contain, among other things, a basic input/output system (BIOS) which may control basic hardware or software operation such as the interaction with peripheral components or devices.

Software 1530 may include code to implement aspects of the present disclosure, including code to support information bit distribution design. Software 1530 may be stored in a non-transitory computer-readable medium such as system memory or other memory. In some cases, the software 1530 may not be directly executable by the processor but may cause a computer (e.g., when compiled and executed) to perform functions described herein.

Transceiver 1535 may communicate bi-directionally, via one or more antennas, wired, or wireless links as described above. For example, the transceiver 1535 may represent a wireless transceiver and may communicate bi-directionally with another wireless transceiver. The transceiver 1535 may also include a modem to modulate the packets and provide the modulated packets to the antennas for transmission, and to demodulate packets received from the antennas.

In some cases, the wireless device may include a single antenna 1540. However, in some cases the device may have more than one antenna 1540, which may be capable of concurrently transmitting or receiving multiple wireless transmissions.

Network communications manager 1545 may manage communications with the core network (e.g., via one or more wired backhaul links). For example, the network communications manager 1545 may manage the transfer of data communications for client devices, such as one or more UEs 115.

Inter-station communications manager 1550 may manage communications with other base station 105, and may include a controller or scheduler for controlling communications with UEs 115 in cooperation with other base stations 105. For example, the inter-station communications manager 1550 may coordinate scheduling for transmissions to UEs 115 for various interference mitigation techniques such as beamforming or joint transmission. In some examples, inter-station communications manager 1550 may provide an X2 interface within an LTE/LTE-A wireless communication network technology to provide communication between base stations 105.

Figure 16:
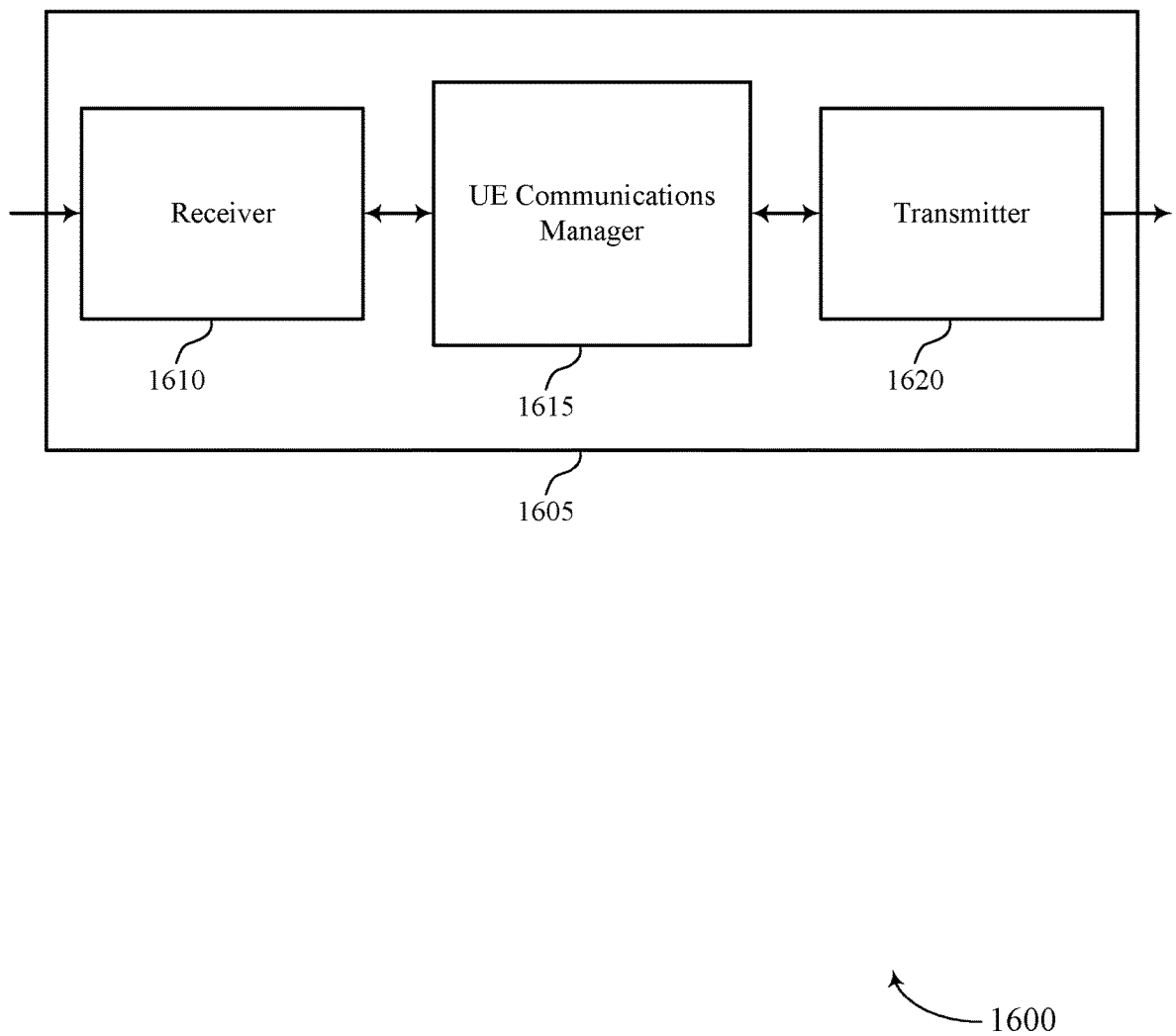
FIGS. 16 through 18 show block diagrams of a device that supports information bit distribution design in accordance with aspects of the present disclosure.

FIG. 16 shows a block diagram 1600 of a wireless device 1605 that supports information bit distribution design in accordance with aspects of the present disclosure. Wireless device 1605 may be an example of aspects of a UE 115 as described herein. Wireless device 1605 may include receiver 1610, UE communications manager 1615, and transmitter 1620. Wireless device 1605 may also include a processor.

Each of these components may be in communication with one another (e.g., via one or more buses).

Receiver 1610 may receive information such as packets, user data, or control information associated with various information channels (e.g., control channels, data channels, and information related to information bit distribution design, etc.). Information may be passed on to other components of the device. The receiver 1610 may be an example of aspects of the transceiver 1935 described with reference to FIG. 19. The receiver 1610 may utilize a single antenna or a set of antennas.

UE communications manager 1615 may be an example of aspects of the UE communications manager 1915 described with reference to FIG. 19.

UE communications manager 1615 and/or at least some of its various sub-components may be implemented in hardware, software executed by a processor, firmware, or any combination thereof. If implemented in software executed by a processor, the functions of the UE communications manager 1615 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The UE communications manager 1615 and/or at least some of its various sub-components may be physically located at various positions, including being distributed such that portions of functions are implemented at different physical locations by one or more physical devices. In some examples, UE communications manager 1615 and/or at least some of its various sub-components may be a separate and distinct component in accordance with various aspects of the present disclosure. In other examples, UE communications manager 1615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 1615 may receive a codeword over a wireless channel, where the codeword is based on a set of information bits encoded using a polar code having a set of bit channels, and may identify a set of bit locations of the polar code for the set of information bits. The set of bit locations may be determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel partition of the bit channel partitions to a fixed value. UE communications manager 1615 may decode the received codeword according to the polar code to obtain an information bit vector at the set of bit locations. Additionally or alternatively, UE communications manager 1615 may also receive a codeword over a wireless channel, where the codeword is based on a set of information bits encoded using a polar code having a set of bit channels, and may identify a set of bit locations of the polar code for the set of information bits. The set of bit locations may be determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO. UE communications manager 1615 may decode the received codeword according to the polar code to obtain an information bit vector at the set of bit locations.

Transmitter 1620 may transmit signals generated by other components of the device. In some examples, the transmitter 1620 may be collocated with a receiver 1610 in a transceiver module. For example, the transmitter 1620 may be an example of aspects of the transceiver 1935 described with reference to FIG. 19. The transmitter 1620 may utilize a single antenna or a set of antennas.

Figure 17:
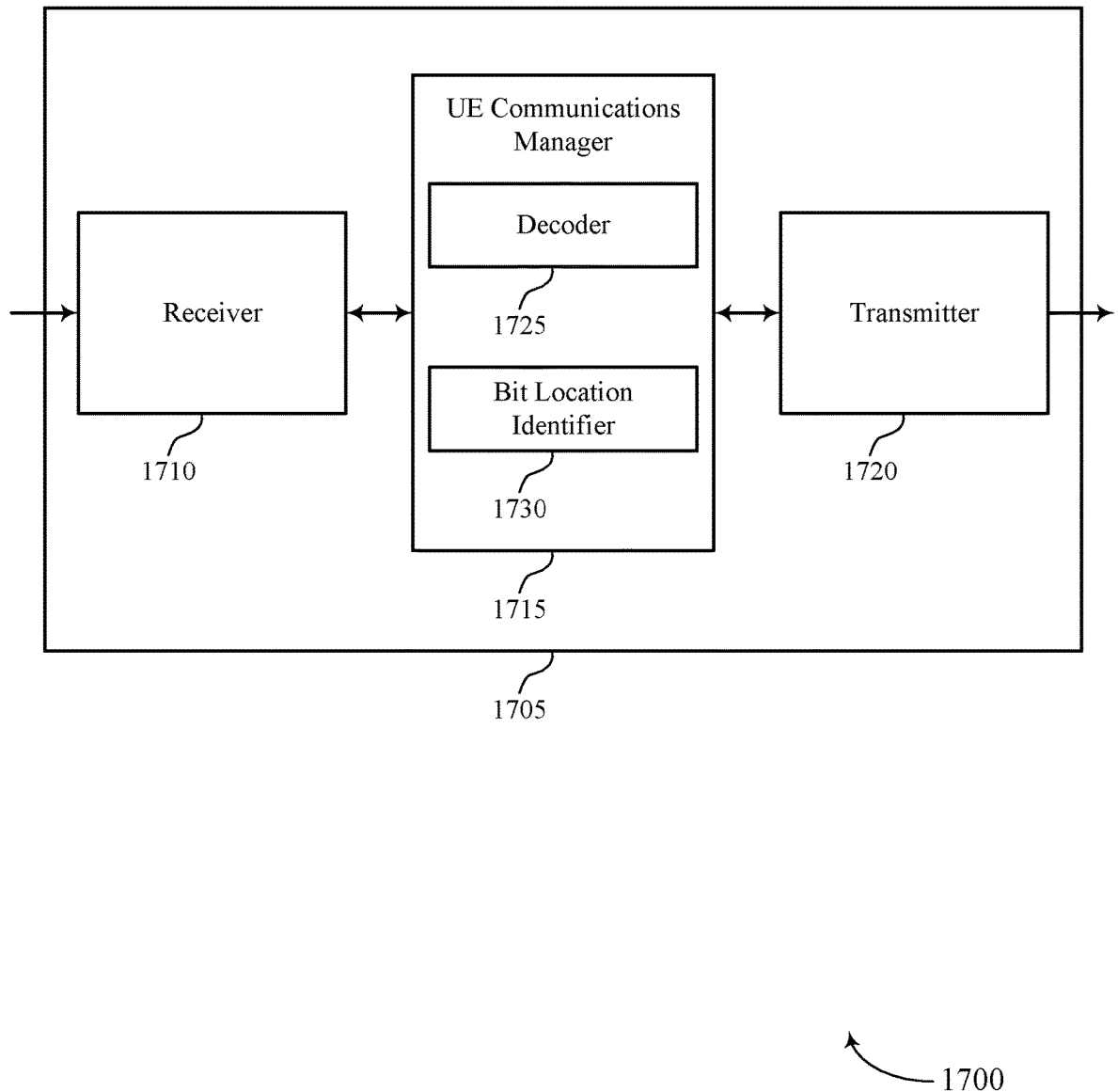

FIG. 17 shows a block diagram 1700 of a wireless device 1705 that supports information bit distribution design in accordance with aspects of the present disclosure. Wireless device 1705 may be an example of aspects of a wireless device 1605 or a UE 115 as described with reference to FIG. 16. Wireless device 1705 may include receiver 1710, UE communications manager 1715, and transmitter 1720. Wireless device 1705 may also include a processor. Each of these components may be in communication with one another (e.g., via one or more buses).

Receiver 1710 may receive information such as packets, user data, or control information associated with various information channels (e.g., control channels, data channels, and information related to information bit distribution design, etc.). Information may be passed on to other components of the device. The receiver 1710 may be an example of aspects of the transceiver 1935 described with reference to FIG. 19. The receiver 1710 may utilize a single antenna or a set of antennas.

UE communications manager 1715 may be an example of aspects of the UE communications manager 1915 described with reference to FIG. 19. UE communications manager 1715 may also include decoder 1725 and bit location identifier 1730.

Decoder 1725 may receive a codeword over a wireless channel, where the codeword is based on a set of information bits encoded using a polar code having a set of bit channels, and may decode the received codeword according to the polar code to obtain an information bit vector at a set of bit locations.

Bit location identifier 1730 may identify the set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel partition of the bit channel partitions to a fixed value. Additionally or alternatively, bit location identifier 1730 may identify a set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO.

Transmitter 1720 may transmit signals generated by other components of the device. In some examples, the transmitter 1720 may be collocated with a receiver 1710 in a transceiver module. For example, the transmitter 1720 may be an example of aspects of the transceiver 1935 described with reference to FIG. 19. The transmitter 1720 may utilize a single antenna or a set of antennas.

Figure 18:
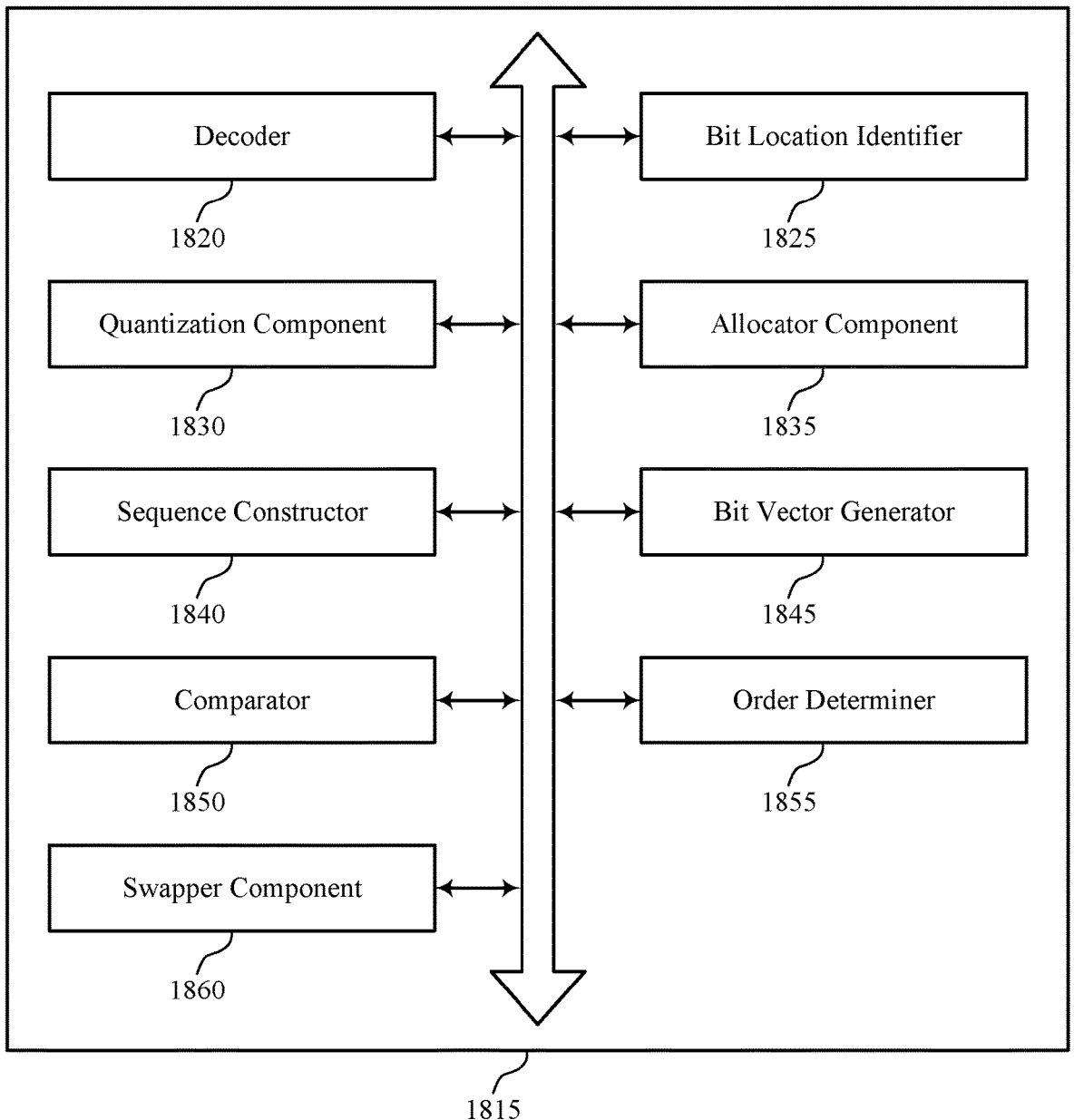

FIG. 18 shows a block diagram 1800 of a UE communications manager 1815 that supports information bit distribution design in accordance with aspects of the present disclosure. The UE communications manager 1815 may be an example of aspects of a UE communications manager 1615, 1715, or 1915 described with reference to FIGS. 16, 17, and 19. The UE communications manager 1815 may include decoder 1820, bit location identifier 1825, quantization component 1830, allocator component 1835, sequence constructor 1840, bit vector generator 1845, comparator 1850, order determiner 1855, and swapper component 1860. Each of these modules may communicate, directly or indirectly, with one another (e.g., via one or more buses).

Decoder 1820 may receive a codeword over a wireless channel, where the codeword is based on a set of information bits encoded using a polar code having a set of bit channels. Decoder 1820 may also decode the received codeword according to the polar code to obtain an information bit vector at a set of bit locations.

In some cases, bit location identifier 1825 may identify the set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel partition of the bit channel partitions to a fixed value. In some cases, bit location identifier 1825 may identify a set of bit locations of the polar code for the set of information bits, where the set of bit locations is determined based on a recursive partitioning of a set of bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO.

Quantization component 1830 may determine a quantization rule. In some cases, a first quantization rule of the at least one quantization rule sets the first number to the fixed value as a function of a capacity of the first bit channel partition. In some cases, the first quantization rule applies a threshold that is dependent on a number of bit channels of each partition. In some cases, the threshold is selected to maintain a UPO of the bit channels of each partition. In some cases, a first quantization rule of the at least one quantization rule sets the first number to the fixed value as a function of a code rate of each partition. In some cases, the function is selected to maintain a UPO of the bit channels of each partition. In some cases, the fixed value is a function of a number of bit channels of each partition. In some cases, the fixed value is equal to a number of bit channels of each partition.

Allocator component 1835 may assign, for a second partition of the partitions, a second number of information bits of the second partition to a second bit channel sub-partition of the second partition based on a baseline allocation rule. In some cases, the baseline allocation rule applies a floor operation to a result of a function of a capacity of the second bit channel sub-partition and a number of bit channels in the second bit channel sub-partition when the second number of information bits is less than or equal to the number of bit channels in sub-partitions of the second partition. In some cases, the baseline allocation rule applies a ceiling operation to a result of a function of a capacity of the second bit channel sub-partition and a number of bit channels in the second bit channel sub-partition when the second number of information bits is greater than the number of bit channels in sub-partitions of the second partition.

Sequence constructor 1840 may construct a sequence for each partition that is compliant with the UPO. In some cases, the sequence is determined based on a binary bit weighting for the bit channels of each partition that applies a set of weighting factors.

Bit vector generator 1845 may generate a bit vector for assigning the number of the information bits according to a MI recursion equation.

Comparator 1850 may compare an order resulting from the bit vector to the UPO.

Order determiner 1855 may determine, for a value of the bit vector for at least one of the partitions, that the order resulting from the value of the bit vector violates the UPO.

Swapper component 1860 may swap the value of the bit vector with an adjacent value of the bit vector based on the identifying that the value violates the UPO.

Figure 19:
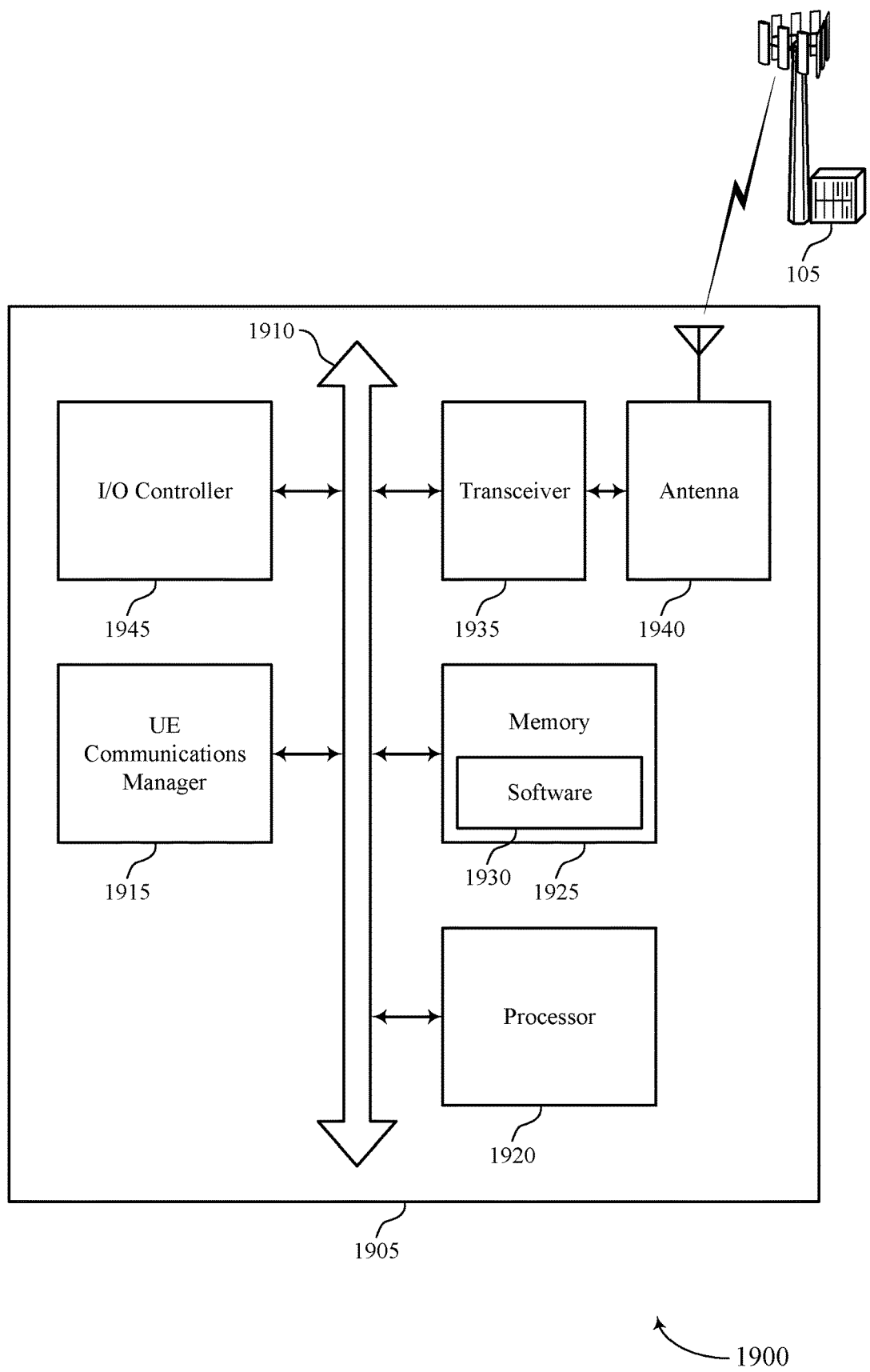
FIG. 19 illustrates a block diagram of a system including a user equipment (UE) that supports information bit distribution design in accordance with aspects of the present disclosure.

FIG. 19 shows a diagram of a system 1900 including a device 1905 that supports information bit distribution design in accordance with aspects of the present disclosure. Device 1905 may be an example of or include the components of UE 115 as described above, e.g., with reference to FIG. 1. Device 1905 may include components for bi-directional voice and data communications including components for transmitting and receiving communications, including UE communications manager 1915, processor 1920, memory 1925, software 1930, transceiver 1935, antenna 1940, and I/O controller 1945. These components may be in electronic communication via one or more buses (e.g., bus 1910). Device 1905 may communicate wirelessly with one or more base stations 105.

Processor 1920 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1920 may be configured to operate a memory array using a memory controller. In other cases, a memory controller may be integrated into processor 1920. Processor 1920 may be configured to execute computer-readable instructions stored in a memory to perform various functions (e.g., functions or tasks supporting information bit distribution design).

Memory 1925 may include RAM and ROM. The memory 1925 may store computer-readable, computer-executable software 1930 including instructions that, when executed, cause the processor to perform various functions described herein. In some cases, the memory 1925 may contain, among other things, a BIOS which may control basic hardware or software operation such as the interaction with peripheral components or devices.

Software 1930 may include code to implement aspects of the present disclosure, including code to support information bit distribution design. Software 1930 may be stored in a non-transitory computer-readable medium such as system memory or other memory. In some cases, the software 1930 may not be directly executable by the processor but may cause a computer (e.g., when compiled and executed) to perform functions described herein.

Transceiver 1935 may communicate bi-directionally, via one or more antennas, wired, or wireless links as described above. For example, the transceiver 1935 may represent a wireless transceiver and may communicate bi-directionally with another wireless transceiver. The transceiver 1935 may also include a modem to modulate the packets and provide the modulated packets to the antennas for transmission, and to demodulate packets received from the antennas.

In some cases, the wireless device may include a single antenna 1940. However, in some cases the device may have more than one antenna 1940, which may be capable of concurrently transmitting or receiving multiple wireless transmissions.

I/O controller 1945 may manage input and output signals for device 1905. I/O controller 1945 may also manage peripherals not integrated into device 1905. In some cases, I/O controller 1945 may represent a physical connection or port to an external peripheral. In some cases, I/O controller 1945 may utilize an operating system such as iOS®, ANDROID®, MS-DOS®, MS-WINDOWS®, OS/2®, UNIX®, LINUX®, or another known operating system. In other cases, I/O controller 1945 may represent or interact with a modem, a keyboard, a mouse, a touchscreen, or a similar device. In some cases, I/O controller 1945 may be implemented as part of a processor. In some cases, a user may interact with device 1905 via I/O controller 1945 or via hardware components controlled by I/O controller 1945.

Figure 20:
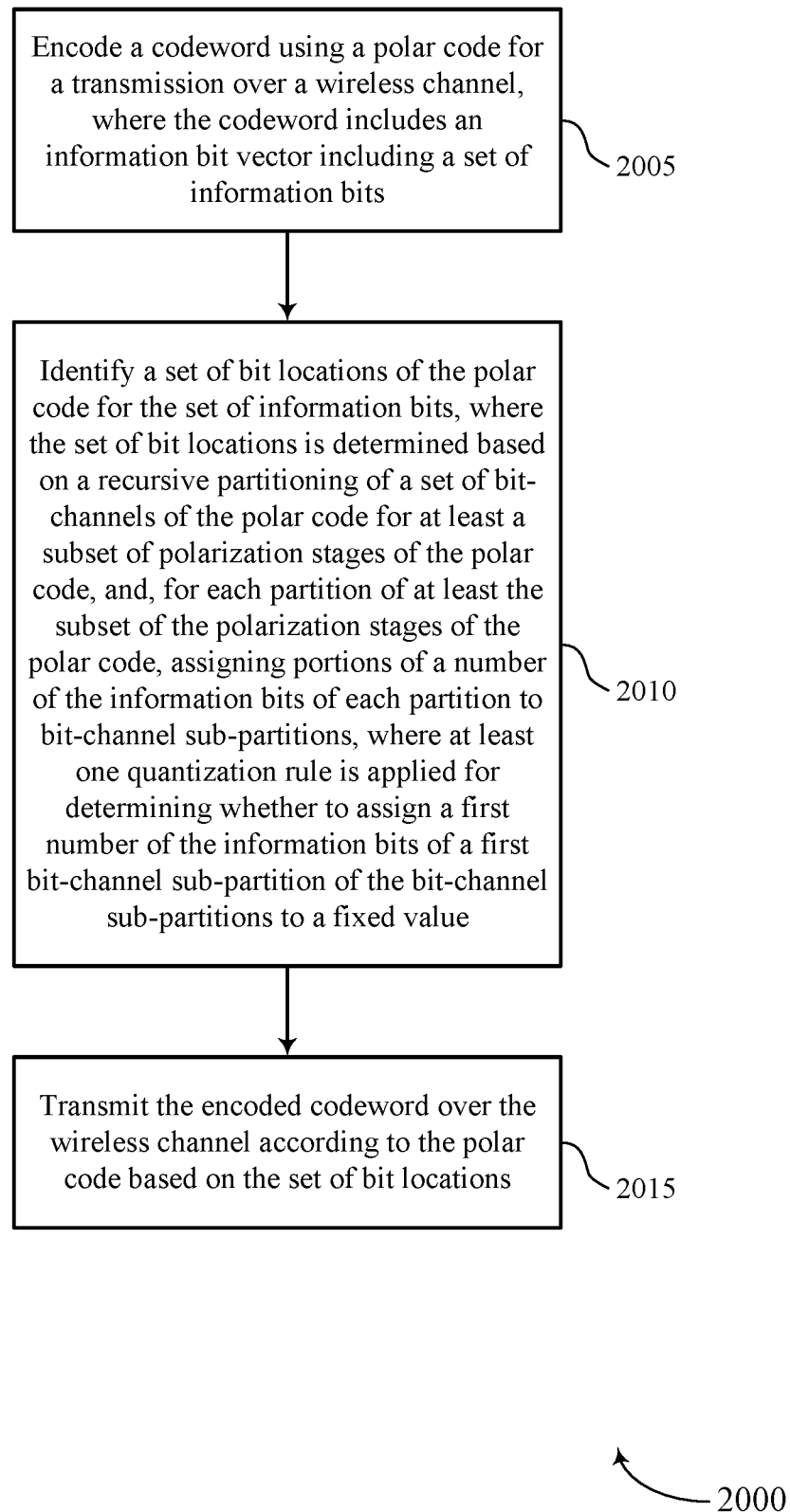
FIGS. 20 through 25 illustrate methods for information bit distribution design in accordance with aspects of the present disclosure.

FIG. 20 shows a flowchart illustrating a method 2000 for information bit distribution design in accordance with aspects of the present disclosure. The operations of method 2000 may be implemented by a base station 105 or its components as described herein. For example, the operations of method 2000 may be performed by a base station communications manager as described with reference to FIGS. 12 through 15. In some examples, a base station 105 may execute a set of codes to control the functional elements of the device to perform the functions described below. Additionally or alternatively, the base station 105 may perform aspects of the functions described below using special-purpose hardware.

At 2005 the base station 105 may encode a codeword using a polar code for a transmission over a wireless channel, where the codeword includes an information bit vector including multiple information bits. The operations of 2005 may be performed according to the methods described herein. In certain examples, aspects of the operations of 2005 may be performed by an encoder as described with reference to FIGS. 12 through 15.

At 2010 the base station 105 may identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel sub-partition of the bit channel sub-partitions to a fixed value. The operations of 2010 may be performed according to the methods described herein. In certain examples, aspects of the operations of 2010 may be performed by a bit location identifier as described with reference to FIGS. 12 through 15.

At 2015 the base station 105 may transmit the encoded codeword over the wireless channel according to the polar code based on the set of bit locations. The operations of 2015 may be performed according to the methods described herein. In certain examples, aspects of the operations of 2015 may be performed by an encoder as described with reference to FIGS. 12 through 15.

Figure 21:
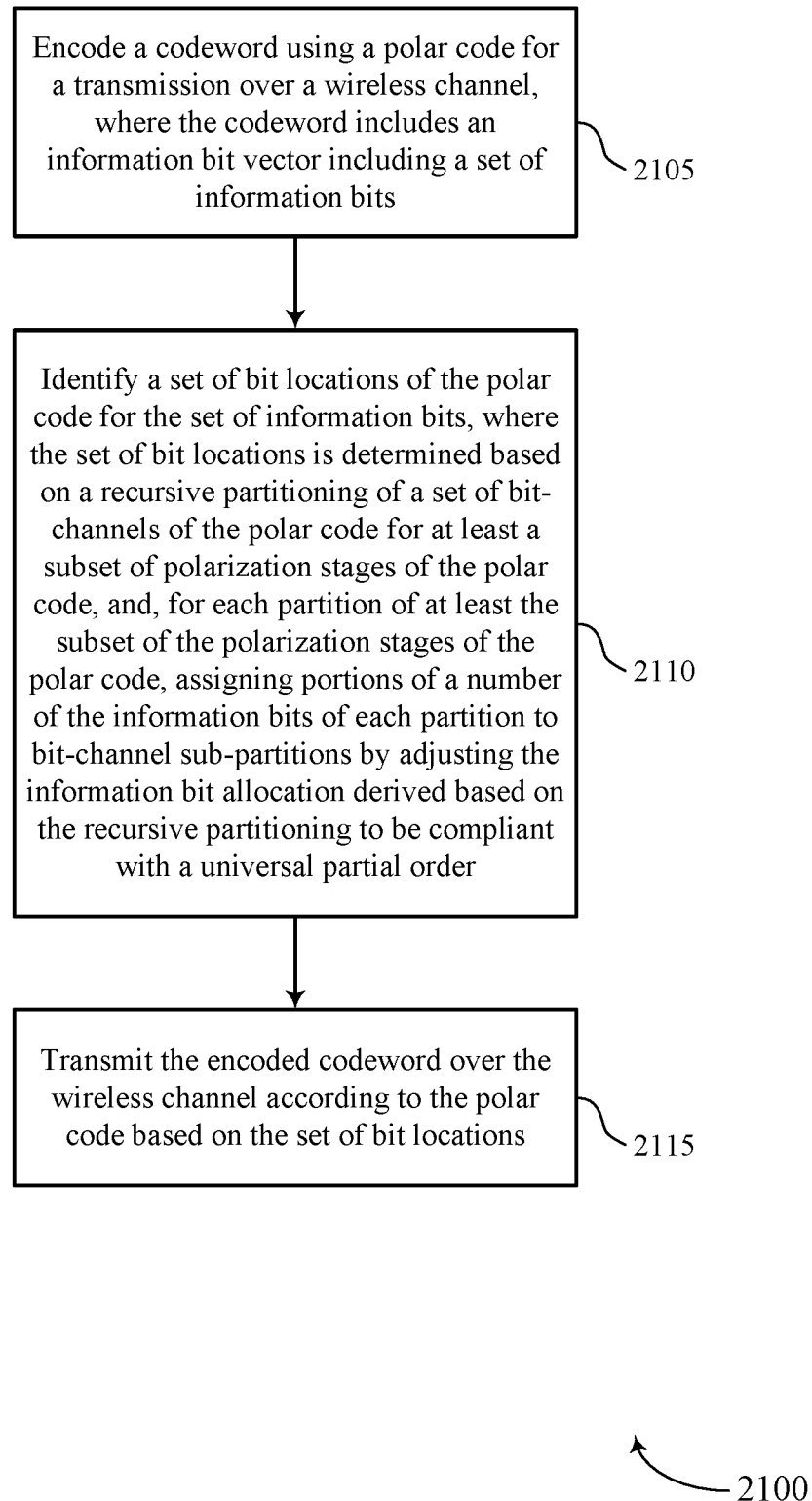

FIG. 21 shows a flowchart illustrating a method 2100 for information bit distribution design in accordance with aspects of the present disclosure. The operations of method 2100 may be implemented by a base station 105 or its components as described herein. For example, the operations of method 2100 may be performed by a base station communications manager as described with reference to FIGS. 12 through 15. In some examples, a base station 105 may execute a set of codes to control the functional elements of the device to perform the functions described below. Additionally or alternatively, the base station 105 may perform aspects of the functions described below using special-purpose hardware.

At 2105 the base station 105 may encode a codeword using a polar code for a transmission over a wireless channel, where the codeword includes an information bit vector including multiple information bits. The operations of 2105 may be performed according to the methods described herein. In certain examples, aspects of the operations of 2105 may be performed by an encoder as described with reference to FIGS. 12 through 15.

At 2110 the base station 105 may identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO. The operations of 2110 may be performed according to the methods described herein. In certain examples, aspects of the operations of 2110 may be performed by a bit location identifier as described with reference to FIGS. 12 through 15.

At 2115 the base station 105 may transmit the encoded codeword over the wireless channel according to the polar code based on the set of bit locations. The operations of 2115 may be performed according to the methods described herein. In certain examples, aspects of the operations of 2115 may be performed by an encoder as described with reference to FIGS. 12 through 15.

Figure 22:
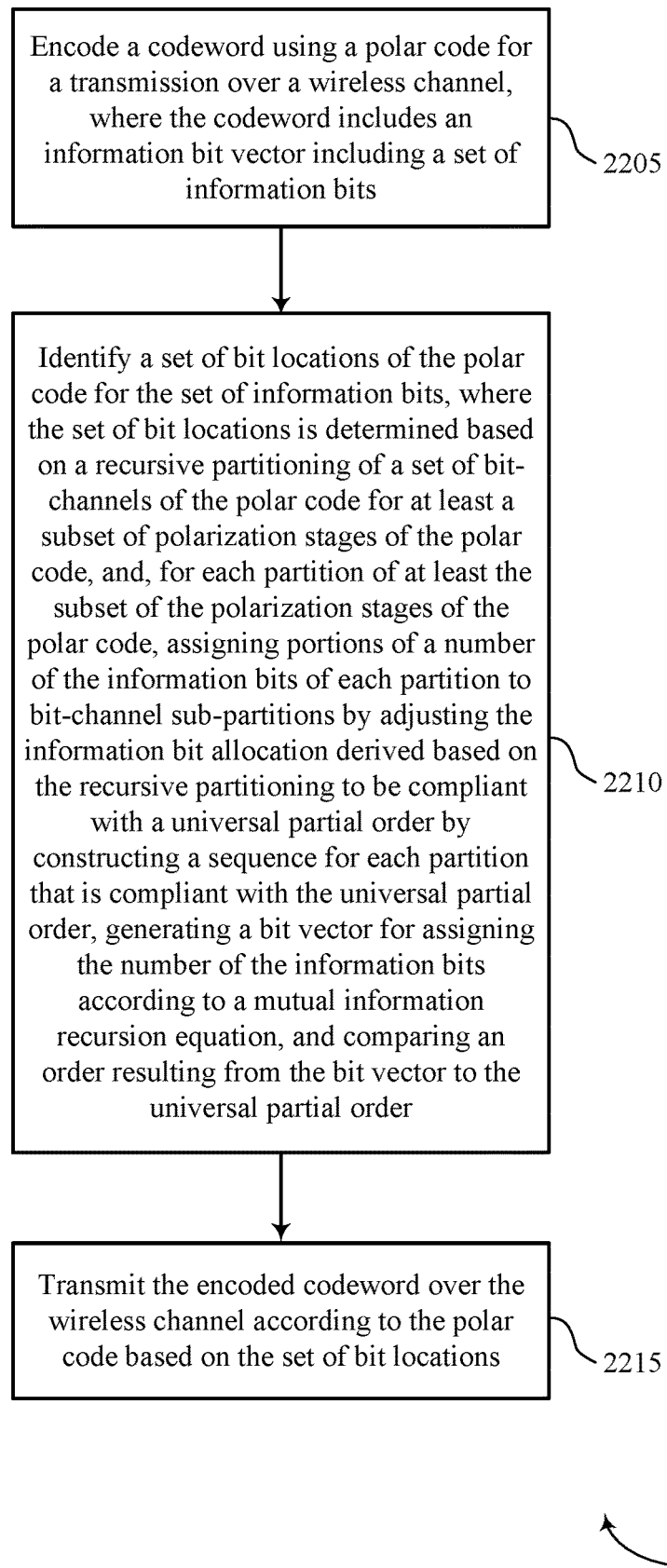

FIG. 22 shows a flowchart illustrating a method 2200 for information bit distribution design in accordance with aspects of the present disclosure. The operations of method 2200 may be implemented by a base station 105 or its components as described herein. For example, the operations of method 2200 may be performed by a base station communications manager as described with reference to FIGS. 12 through 15. In some examples, a base station 105 may execute a set of codes to control the functional elements of the device to perform the functions described below. Additionally or alternatively, the base station 105 may perform aspects of the functions described below using special-purpose hardware.

At 2205 the base station 105 may encode a codeword using a polar code for a transmission over a wireless channel, where the codeword includes an information bit vector including multiple information bits. The operations of 2205 may be performed according to the methods described herein. In certain examples, aspects of the operations of 2205 may be performed by an encoder as described with reference to FIGS. 12 through 15.

At 2210 the base station 105 may identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO by constructing a sequence for the each partition that is compliant with the UPO, generating a bit vector for assigning the number of the information bits according to an MI recursion equation, and comparing an order resulting from the bit vector to the UPO. The operations of 2210 may be performed according to the methods described herein. In certain examples, aspects of the operations of 2210 may be performed by a bit location identifier as described with reference to FIGS. 12 through 15.

At 2215 the base station 105 may transmit the encoded codeword over the wireless channel according to the polar code based on the set of bit locations. The operations of 2215 may be performed according to the methods described herein. In certain examples, aspects of the operations of 2215 may be performed by an encoder as described with reference to FIGS. 12 through 15.

Figure 23:
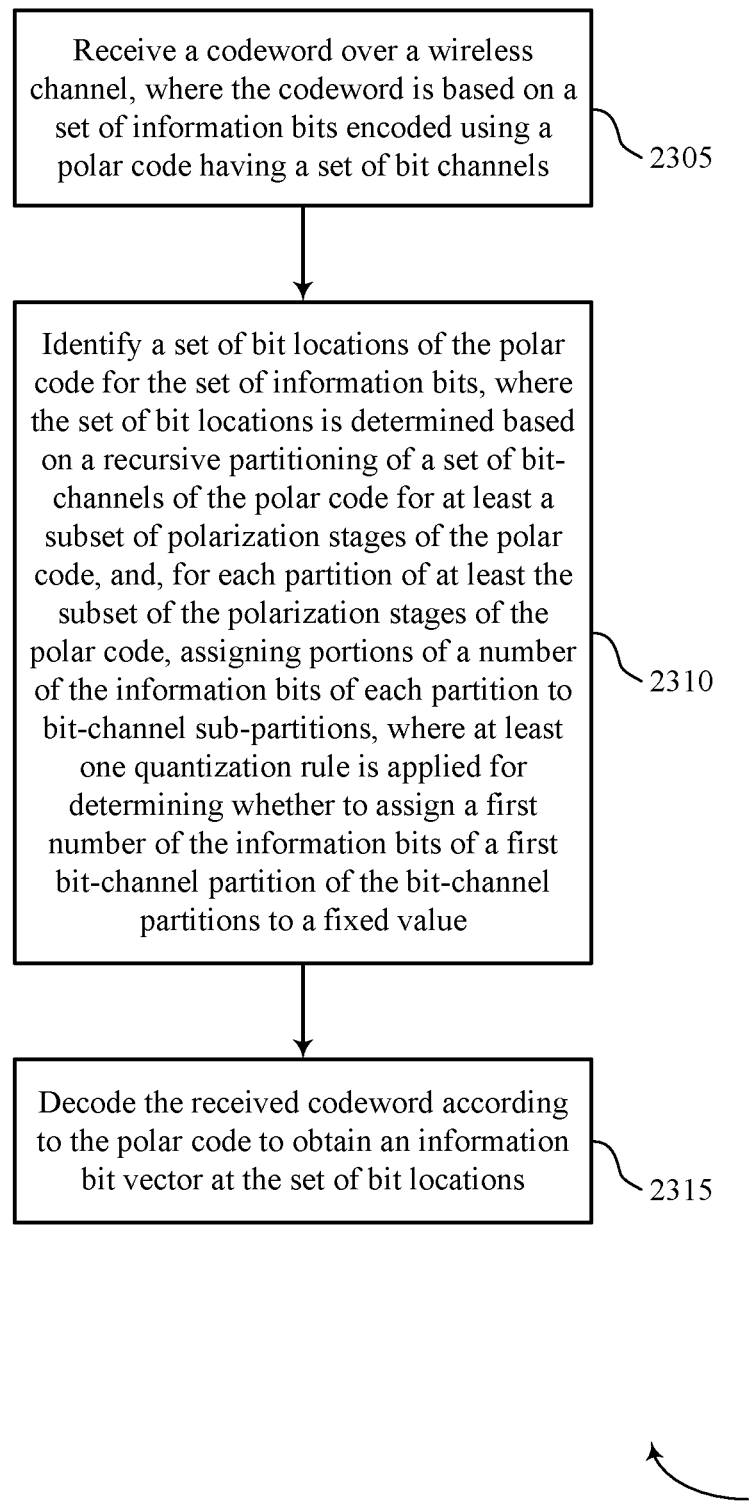

FIG. 23 shows a flowchart illustrating a method 2300 for information bit distribution design in accordance with aspects of the present disclosure. The operations of method 2300 may be implemented by a UE 115 or its components as described herein. For example, the operations of method 2300 may be performed by a UE communications manager as described with reference to FIGS. 16 through 19. In some examples, a UE 115 may execute a set of codes to control the functional elements of the device to perform the functions described below. Additionally or alternatively, the UE 115 may perform aspects of the functions described below using special-purpose hardware.

At 2305 the UE 115 may receive a codeword over a wireless channel, where the codeword is based on multiple information bits encoded using a polar code having multiple bit channels. The operations of 2305 may be performed according to the methods described herein. In certain examples, aspects of the operations of 2305 may be performed by a decoder as described with reference to FIGS. 16 through 19.

At 2310 the UE 115 may identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of the each partition to bit channel sub-partitions, where at least one quantization rule is applied for determining whether to assign a first number of the information bits of a first bit channel partition of the bit channel partitions to a fixed value. The operations of 2310 may be performed according to the methods described herein. In certain examples, aspects of the operations of 2310 may be performed by a bit location identifier as described with reference to FIGS. 16 through 19.

At 2315 the UE 115 may decode the received codeword according to the polar code to obtain an information bit vector at the set of bit locations. The operations of 2315 may be performed according to the methods described herein. In certain examples, aspects of the operations of 2315 may be performed by a decoder as described with reference to FIGS. 16 through 19.

Figure 24:
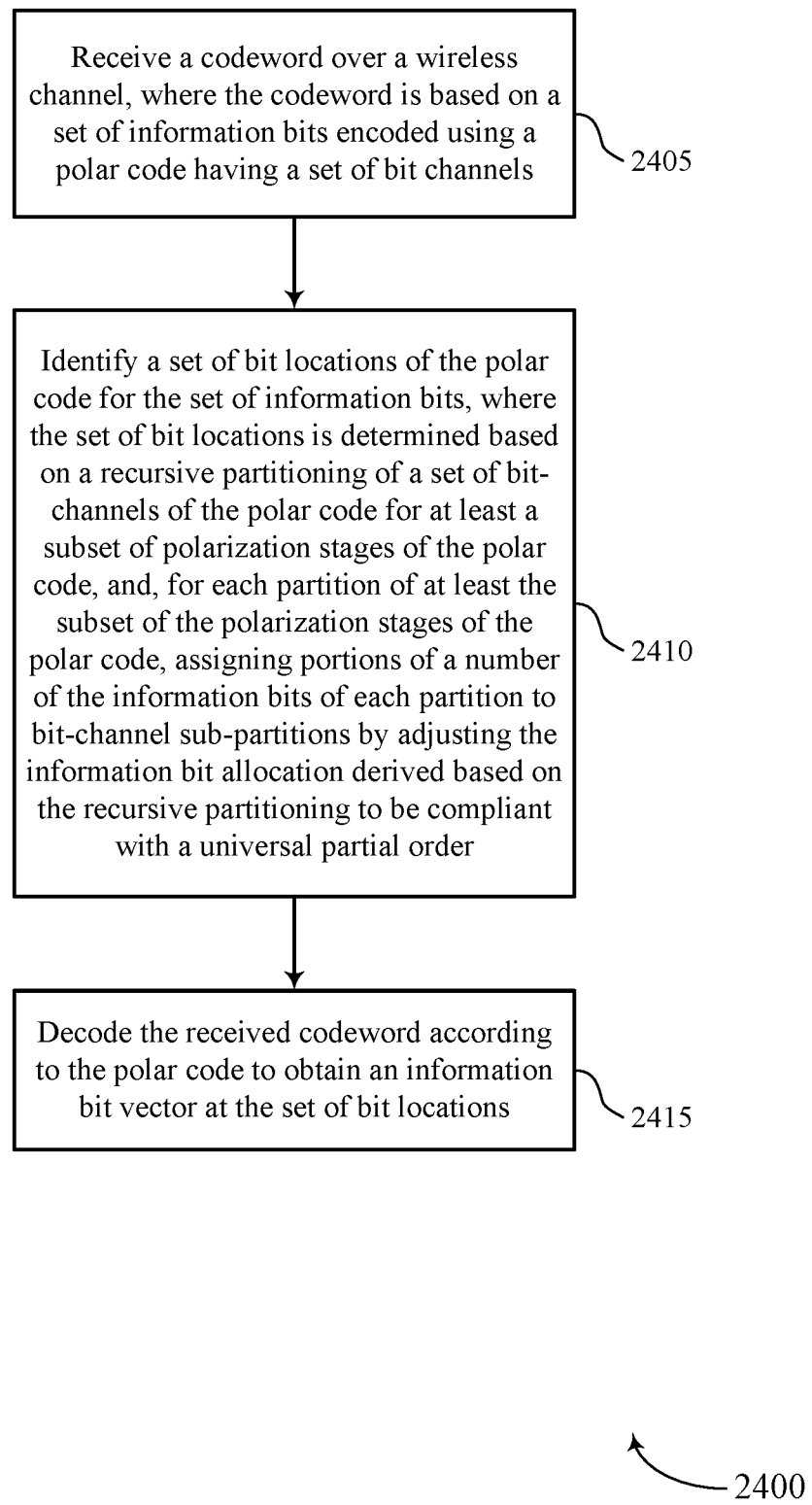

FIG. 24 shows a flowchart illustrating a method 2400 for information bit distribution design in accordance with aspects of the present disclosure. The operations of method 2400 may be implemented by a UE 115 or its components as described herein. For example, the operations of method 2400 may be performed by a UE communications manager as described with reference to FIGS. 16 through 19. In some examples, a UE 115 may execute a set of codes to control the functional elements of the device to perform the functions described below. Additionally or alternatively, the UE 115 may perform aspects of the functions described below using special-purpose hardware.

At 2405 the UE 115 may receive a codeword over a wireless channel, where the codeword is based on multiple information bits encoded using a polar code having multiple bit channels. The operations of 2405 may be performed according to the methods described herein. In certain examples, aspects of the operations of 2405 may be performed by a decoder as described with reference to FIGS. 16 through 19.

At 2410 the UE 115 may identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO. The operations of 2410 may be performed according to the methods described herein. In certain examples, aspects of the operations of 2410 may be performed by a bit location identifier as described with reference to FIGS. 16 through 19.

At 2415 the UE 115 may decode the received codeword according to the polar code to obtain an information bit vector at the set of bit locations. The operations of 2415 may be performed according to the methods described herein. In certain examples, aspects of the operations of 2415 may be performed by a decoder as described with reference to FIGS. 16 through 19.

Figure 25:
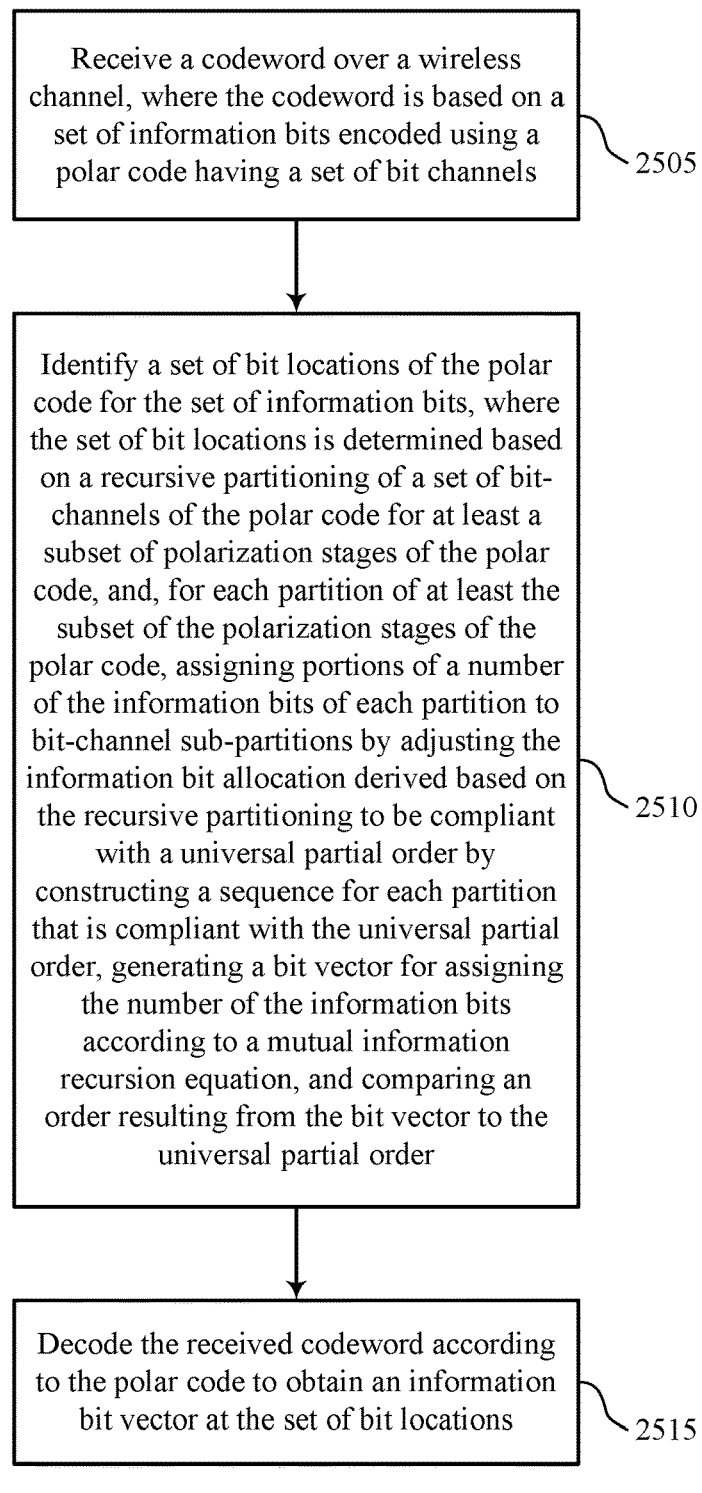

FIG. 25 shows a flowchart illustrating a method 2500 for information bit distribution design in accordance with aspects of the present disclosure. The operations of method 2500 may be implemented by a UE 115 or its components as described herein. For example, the operations of method 2500 may be performed by a UE communications manager as described with reference to FIGS. 16 through 19. In some examples, a UE 115 may execute a set of codes to control the functional elements of the device to perform the functions described below. Additionally or alternatively, the UE 115 may perform aspects of the functions described below using special-purpose hardware.

At 2505 the UE 115 may receive a codeword over a wireless channel, where the codeword is based on multiple information bits encoded using a polar code having multiple bit channels. The operations of 2505 may be performed according to the methods described herein. In certain examples, aspects of the operations of 2505 may be performed by a decoder as described with reference to FIGS. 16 through 19.

At 2510 the UE 115 may identify a set of bit locations of the polar code for the multiple information bits, where the set of bit locations is determined based on a recursive partitioning of multiple bit channels of the polar code for at least a subset of polarization stages of the polar code, and, for each partition of the at least the subset of the polarization stages of the polar code, assigning portions of a number of the information bits of the each partition to bit channel sub-partitions by adjusting the information bit allocation derived based on the recursive partitioning to be compliant with a UPO by constructing a sequence for the each partition that is compliant with the UPO, generating a bit vector for assigning the number of the information bits according to an MI recursion equation, and comparing an order resulting from the bit vector to the UPO. The operations of 2510 may be performed according to the methods described herein. In certain examples, aspects of the operations of 2510 may be performed by a bit location identifier as described with reference to FIGS. 16 through 19.

At 2515 the UE 115 may decode the received codeword according to the polar code to obtain an information bit vector at the set of bit locations. The operations of 2515 may be performed according to the methods described herein. In certain examples, aspects of the operations of 2515 may be performed by a decoder as described with reference to FIGS. 16 through 19.

Figure 26:
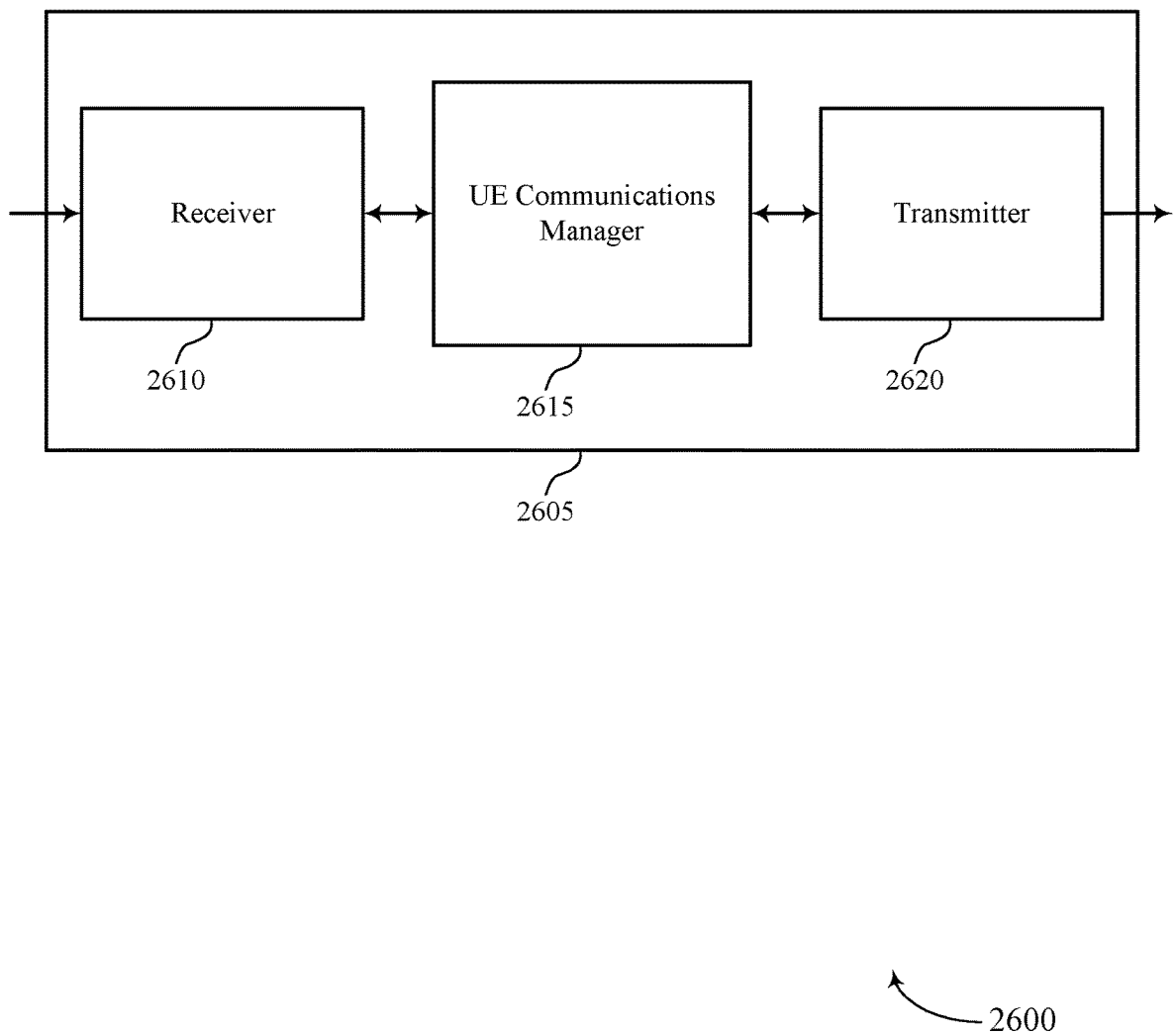
FIGS. 26 through 28 show block diagrams of a device that supports information bit distribution design in accordance with aspects of the present disclosure.

FIG. 26 shows a block diagram 2600 of a wireless device 2605 that supports polar sequence design based on coefficient reliability and improved information bit distribution in accordance with aspects of the present disclosure. Wireless device 2605 may be an example of aspects of a UE 115 as described herein. Wireless device 2605 may include receiver 2610, UE communications manager 2615, and transmitter 2620. Wireless device 2605 may also include a processor. Each of these components may be in communication with one another (e.g., via one or more buses).

Receiver 2610 may receive information such as packets, user data, or control information associated with various information channels (e.g., control channels, data channels, and information related to polar sequence design based on coefficient reliability and improved information bit distribution, etc.). Information may be passed on to other components of the device. The receiver 2610 may be an example of aspects of the transceiver 2935 described with reference to FIG. 29. The receiver 2610 may utilize a single antenna or a set of antennas.

UE communications manager 2615 may be an example of aspects of the UE communications manager 2915 described with reference to FIG. 29.

UE communications manager 2615 and/or at least some of its various sub-components may be implemented in hardware, software executed by a processor, firmware, or any combination thereof. If implemented in software executed by a processor, the functions of the UE communications manager 2615 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The UE communications manager 2615 and/or at least some of its various sub-components may be physically located at various positions, including being distributed such that portions of functions are implemented at different physical locations by one or more physical devices. In some examples, UE communications manager 2615 and/or at least some of its various sub-components may be a separate and distinct component in accordance with various aspects of the present disclosure. In other examples, UE communications manager 2615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 2615 may receive a codeword over a wireless channel, where the codeword is based on a set of information bits encoded using a polar code having a set of bit channels, identify a set of bit locations of the set of bit channels of the polar code for the set of information bits based on a bit index reliability sequence, where the bit index reliability sequence is determined based on a binary bit weighting for the set of bit channels that applies a set of weighting factors, and decode the received codeword according to the polar code to obtain an information bit vector at the set of bit locations. The UE communications manager 2615 may also receive a codeword over a wireless channel, where the codeword is based on a set of information bits encoded using a polar code having a set of bit channels, select a bit index reliability sequence for the set of bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders, and decode the codeword based on the bit index reliability sequence.

Transmitter 2620 may transmit signals generated by other components of the device. In some examples, the transmitter 2620 may be collocated with a receiver 2610 in a transceiver module. For example, the transmitter 2620 may be an example of aspects of the transceiver 2935 described with reference to FIG. 29. The transmitter 2620 may utilize a single antenna or a set of antennas.

Figure 27:
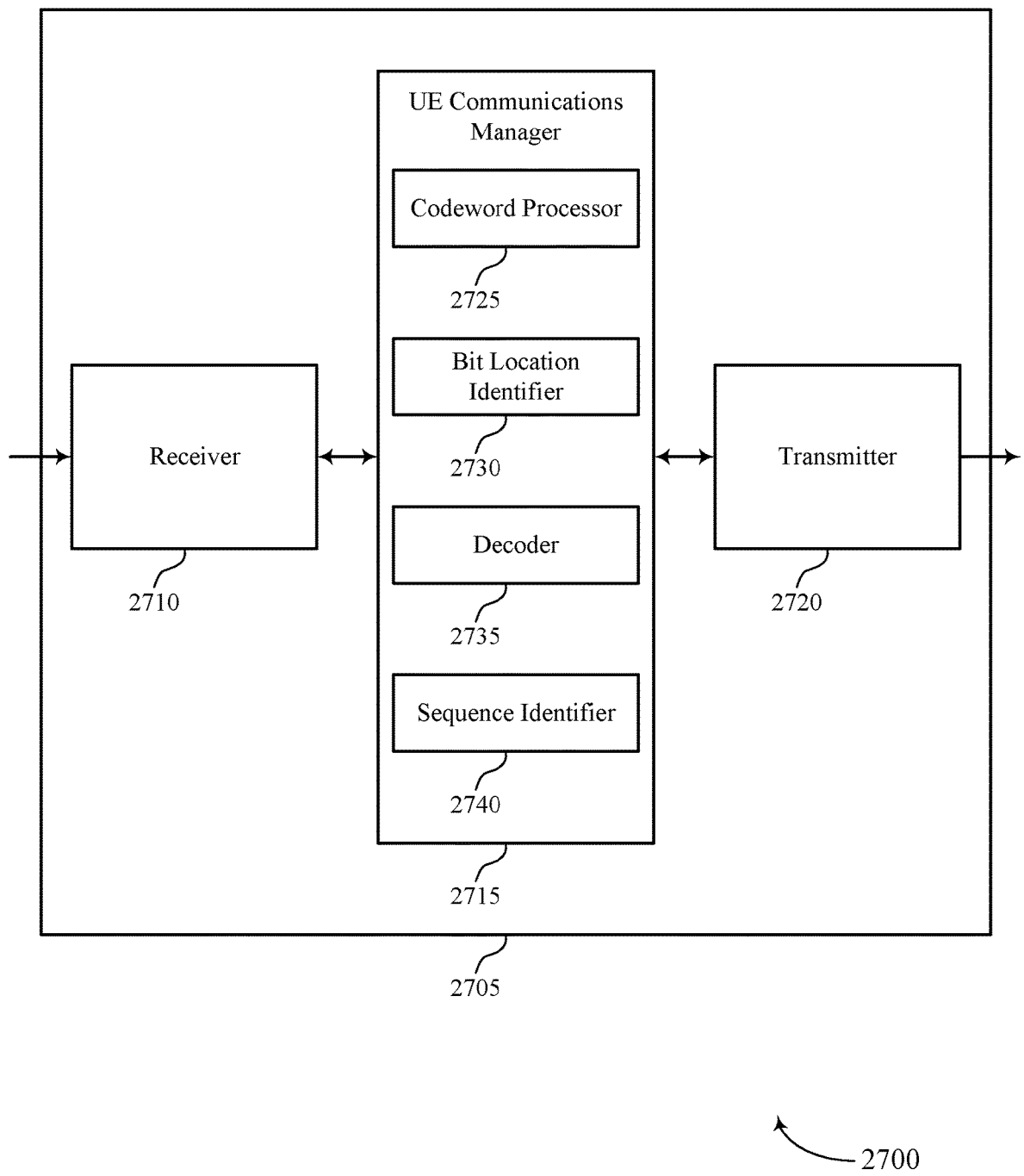

FIG. 27 shows a block diagram 2700 of a wireless device 2705 that supports polar sequence design based on coefficient reliability and improved information bit distribution in accordance with aspects of the present disclosure. Wireless device 2705 may be an example of aspects of a wireless device 2605 or a UE 115 as described with reference to FIG. 26. Wireless device 2705 may include receiver 2710, UE communications manager 2715, and transmitter 2720. Wireless device 2705 may also include a processor. Each of these components may be in communication with one another (e.g., via one or more buses).

Receiver 2710 may receive information such as packets, user data, or control information associated with various information channels (e.g., control channels, data channels, and information related to polar sequence design based on coefficient reliability and improved information bit distribu-tion, etc.). Information may be passed on to other components of the device. The receiver 2710 may be an example of aspects of the transceiver 2935 described with reference to FIG. 29. The receiver 2710 may utilize a single antenna or a set of antennas.

UE communications manager 2715 may be an example of aspects of the UE communications manager 2915 described with reference to FIG. 29. UE communications manager 2715 may also include codeword processor 2725, bit location identifier 2730, decoder 2735, and sequence identifier 2740.

Codeword processor 2725 may receive a codeword over a wireless channel, where the codeword is based on a set of information bits encoded using a polar code having a set of bit channels.

Bit location identifier 2730 may identify a set of bit locations of the set of bit channels of the polar code for the set of information bits based on a bit index reliability sequence, where the bit index reliability sequence is determined based on a binary bit weighting for the set of bit channels that applies a set of weighting factors.

Decoder 2735 may decode the received codeword according to the polar code to obtain an information bit vector at the set of bit locations. In some cases, decoder 2735 may decode the codeword based on the bit index reliability sequence. In some cases, decoding the codeword includes applying a successive cancellation list decoding algorithm to a signal that includes the codeword.

Sequence identifier 2740 may select a bit index reliability sequence for the set of bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders. In some cases, sequence identifier 2740 may add a selected bit index to the bit index reliability sequence, calculate a second partial order under the UPO of an input search subsequence, and/or select a bit index from the input search subsequence based on the second partial order. In some cases, the UPO includes a first property and a second property, where the calculated relative orders of bit indices violate at least one of the first property or the second property. In some cases, the simulation is a link-level performance simulation.

In some cases, the simulation is based on a list size applied by the successive cancellation list decoding algorithm. In some cases, the order of bit indices in the bit index reliability sequence is determined based on selecting a bit index from the input search sequence based on the partial order. In some cases, the analytical method is an index polarization weight rule, or a Reed-Muller rule, or a DE rule, or an MI-DE rule, or any combination thereof.

Transmitter 2720 may transmit signals generated by other components of the device. In some examples, the transmitter 2720 may be collocated with a receiver 2710 in a transceiver module. For example, the transmitter 2720 may be an example of aspects of the transceiver 2935 described with reference to FIG. 29. The transmitter 2720 may utilize a single antenna or a set of antennas.

Figure 28:
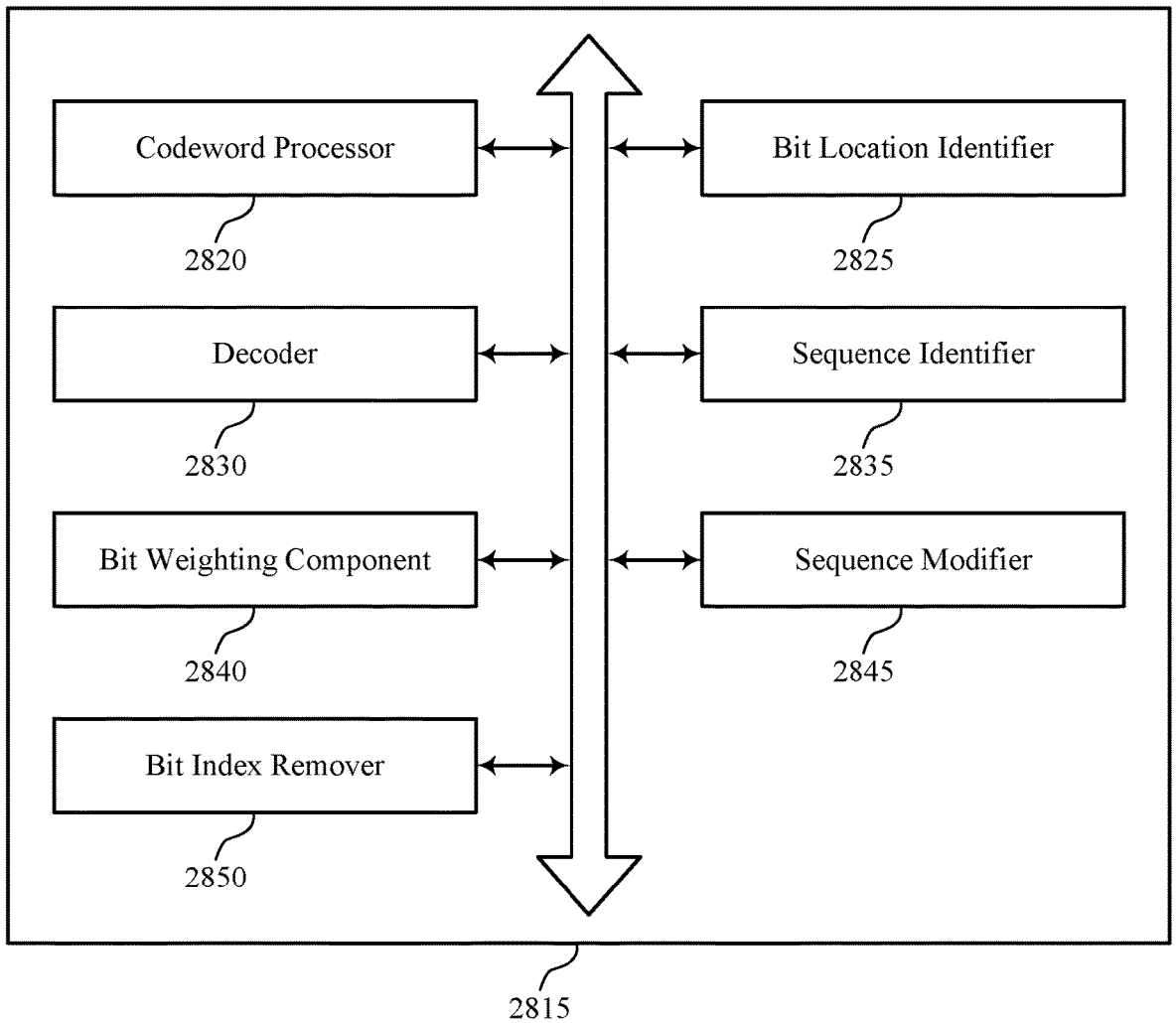

FIG. 28 shows a block diagram 2800 of a UE communications manager 2815 that supports polar sequence design based on coefficient reliability and improved information bit distribution in accordance with aspects of the present disclosure. The UE communications manager 2815 may be an example of aspects of a UE communications manager 2615, 2715, or 2915 described with reference to FIGS. 26, 27, and 29. The UE communications manager 2815 may include codeword processor 2820, bit location identifier 2825, decoder 2830, sequence identifier 2835, bit weighting component 2840, sequence modifier 2845, and bit index remover 2850. Each of these modules may communicate, directly or indirectly, with one another (e.g., via one or more buses).

Codeword processor 2820 may receive a codeword over a wireless channel, where the codeword is based on a set of information bits encoded using a polar code having a set of bit channels.

Bit location identifier 2825 may identify a set of bit locations of the set of bit channels of the polar code for the set of information bits based on a bit index reliability sequence, where the bit index reliability sequence may be determined based on a binary bit weighting for the set of bit channels that applies a set of weighting factors.

Decoder 2830 may decode the received codeword according to the polar code to obtain an information bit vector at the set of bit locations and/or may decode the codeword based on the bit index reliability sequence. In some cases, decoding the codeword includes applying successive cancellation list decoding algorithm(s) to a signal that includes the codeword.

Sequence identifier 2835 may select a bit index reliability sequence for the set of bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders. In some cases, sequence identifier 2835 may add a selected bit index to the bit index reliability sequence, calculate a second partial order under the UPO of the input search subsequence, and/or select a bit index from the input search subsequence based on the second partial order. In some cases, the UPO includes a first property and a second property, where the calculated relative orders of bit indices violate at least one of the first property or the second property. In some cases, the simulation is a link-level performance simulation.

In some cases, the simulation is based on a list size applied by the successive cancellation list decoding algorithm. In some cases, the order of bit indices in the reliability sequence is determined based on selecting a bit index from the input search sequence based on the partial order. In some cases, the analytical method is an index polarization weight rule, or a Reed-Muller rule, or a DE rule, or an MI-DE rule, or any combination thereof.

Bit weighting component 2840 may determine the bit index reliability sequence by performing the binary bit weighting using a first weighting factor to obtain a first reliability sequence for the set of bit channels. In some cases, the bit index reliability sequence is determined by performing the binary bit weighting using a first weighting factor for a first subset of bit indices and a second weighting factor for a second subset of bit indices. In some cases, the bit index reliability sequence is determined by performing the binary bit weighting using a third weighting factor for a third subset of bit indices.

Sequence modifier 2845 may modify a subset of the first reliability sequence by performing the binary bit weighting using a second weighting factor to obtain a second reliability sequence for the subset of the first reliability sequence. In some cases, the bit index reliability sequence is determined by modifying a subset of the second reliability sequence by performing the binary bit weighting using a third weighting factor to obtain a third reliability sequence for the subset of the second reliability sequence. In some cases, the subset of the first reliability sequence includes the set of bit channels having lowest bit-channel indices in the first reliability sequence. In some cases, the subset of the first reliability sequence includes the set of bit channels having highest bit-channel indices in the first reliability sequence. In some cases, sequence modifier 2845 may modify a portion of the bit index reliability sequence using a second sequence to generate a modified bit index reliability sequence, where decoding the codeword includes decoding the codeword based on the modified bit index reliability sequence.

Bit index remover 2850 may remove the selected bit index from the input search sequence to generate an input search subsequence.

Figure 29:
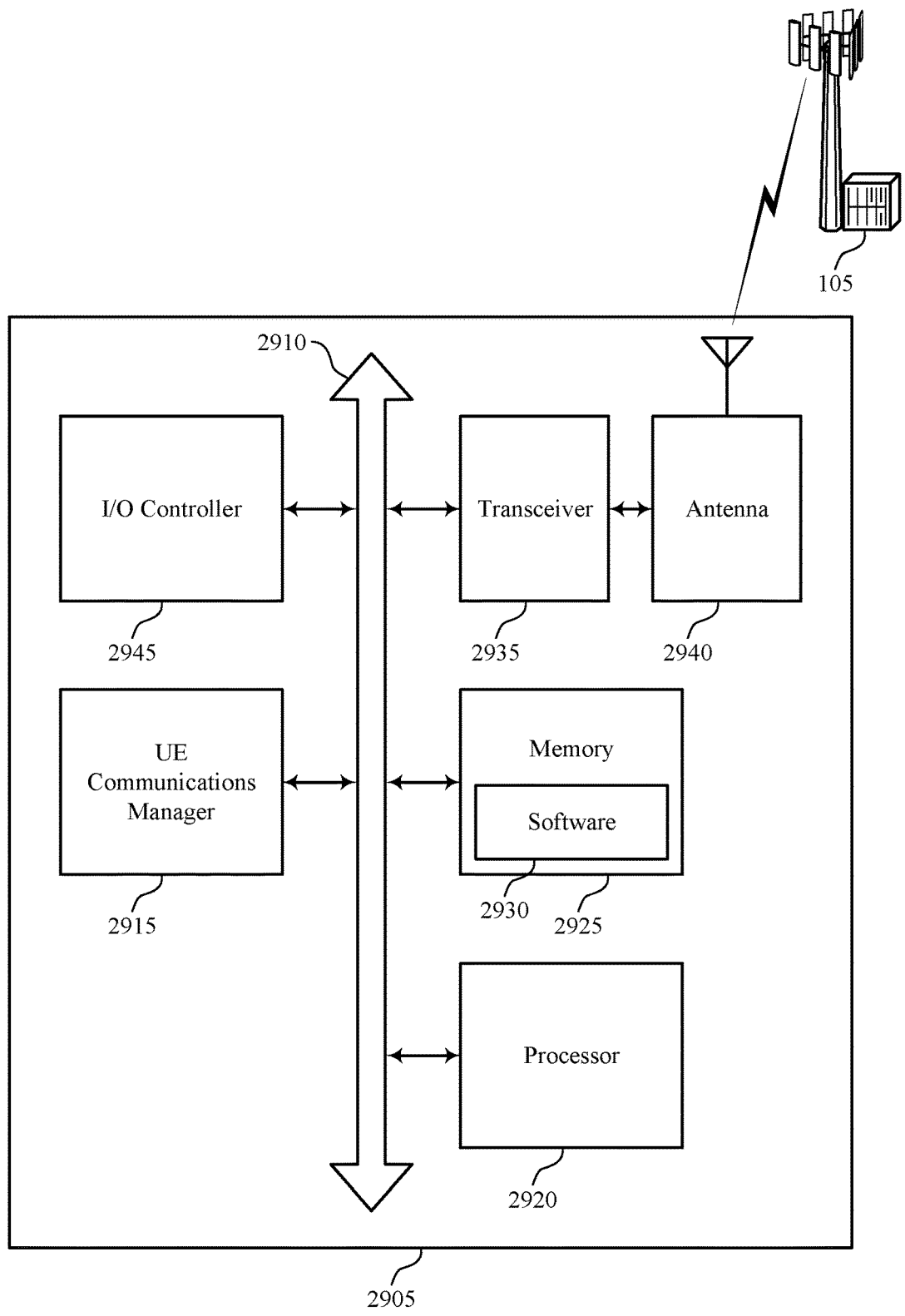
FIG. 29 illustrates a block diagram of a system including a UE that supports information bit distribution design in accordance with aspects of the present disclosure.

FIG. 29 shows a diagram of a system 2900 including a device 2905 that supports polar sequence design based on coefficient reliability and improved information bit distribution in accordance with aspects of the present disclosure. Device 2905 may be an example of or include the components of wireless device 2605, wireless device 2705, or a UE 115 as described above, e.g., with reference to FIGS. 26 and 27. Device 2905 may include components for bi-directional voice and data communications including components for transmitting and receiving communications, including UE communications manager 2915, processor 2920, memory 2925, software 2930, transceiver 2935, antenna 2940, and I/O controller 2945. These components may be in electronic communication via one or more buses (e.g., bus 2910). Device 2905 may communicate wirelessly with one or more base stations 105.

Processor 2920 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 2920 may be configured to operate a memory array using a memory controller. In other cases, a memory controller may be integrated into processor 2920. Processor 2920 may be configured to execute computer-readable instructions stored in a memory to perform various functions (e.g., functions or tasks supporting polar sequence design based on coefficient reliability and improved information bit distribution).

Memory 2925 may include RAM and ROM. The memory 2925 may store computer-readable, computer-executable software 2930 including instructions that, when executed, cause the processor to perform various functions described herein. In some cases, the memory 2925 may contain, among other things, a BIOS which may control basic hardware or software operation such as the interaction with peripheral components or devices.

Software 2930 may include code to implement aspects of the present disclosure, including code to support polar sequence design based on coefficient reliability and improved information bit distribution. Software 2930 may be stored in a non-transitory computer-readable medium such as system memory or other memory. In some cases, the software 2930 may not be directly executable by the processor but may cause a computer (e.g., when compiled and executed) to perform functions described herein.

Transceiver 2935 may communicate bi-directionally, via one or more antennas, wired, or wireless links as described above. For example, the transceiver 2935 may represent a wireless transceiver and may communicate bi-directionally with another wireless transceiver. The transceiver 2935 may also include a modem to modulate the packets and provide the modulated packets to the antennas for transmission, and to demodulate packets received from the antennas.

In some cases, the wireless device may include a single antenna 2940. However, in some cases the device may have more than one antenna 2940, which may be capable of concurrently transmitting or receiving multiple wireless transmissions.

I/O controller 2945 may manage input and output signals for device 2905. I/O controller 2945 may also manage peripherals not integrated into device 2905. In some cases, I/O controller 2945 may represent a physical connection or port to an external peripheral. In some cases, I/O controller 2945 may utilize an operating system such as iOS®, ANDROID®, MS-DOS®, MS-WINDOWS®, OS/2®, UNIX®, LINUX®, or another known operating system. In other cases, I/O controller 2945 may represent or interact with a modem, a keyboard, a mouse, a touchscreen, or a similar device. In some cases, I/O controller 2945 may be implemented as part of a processor. In some cases, a user may interact with device 2905 via I/O controller 2945 or via hardware components controlled by I/O controller 2945.

Figure 30:
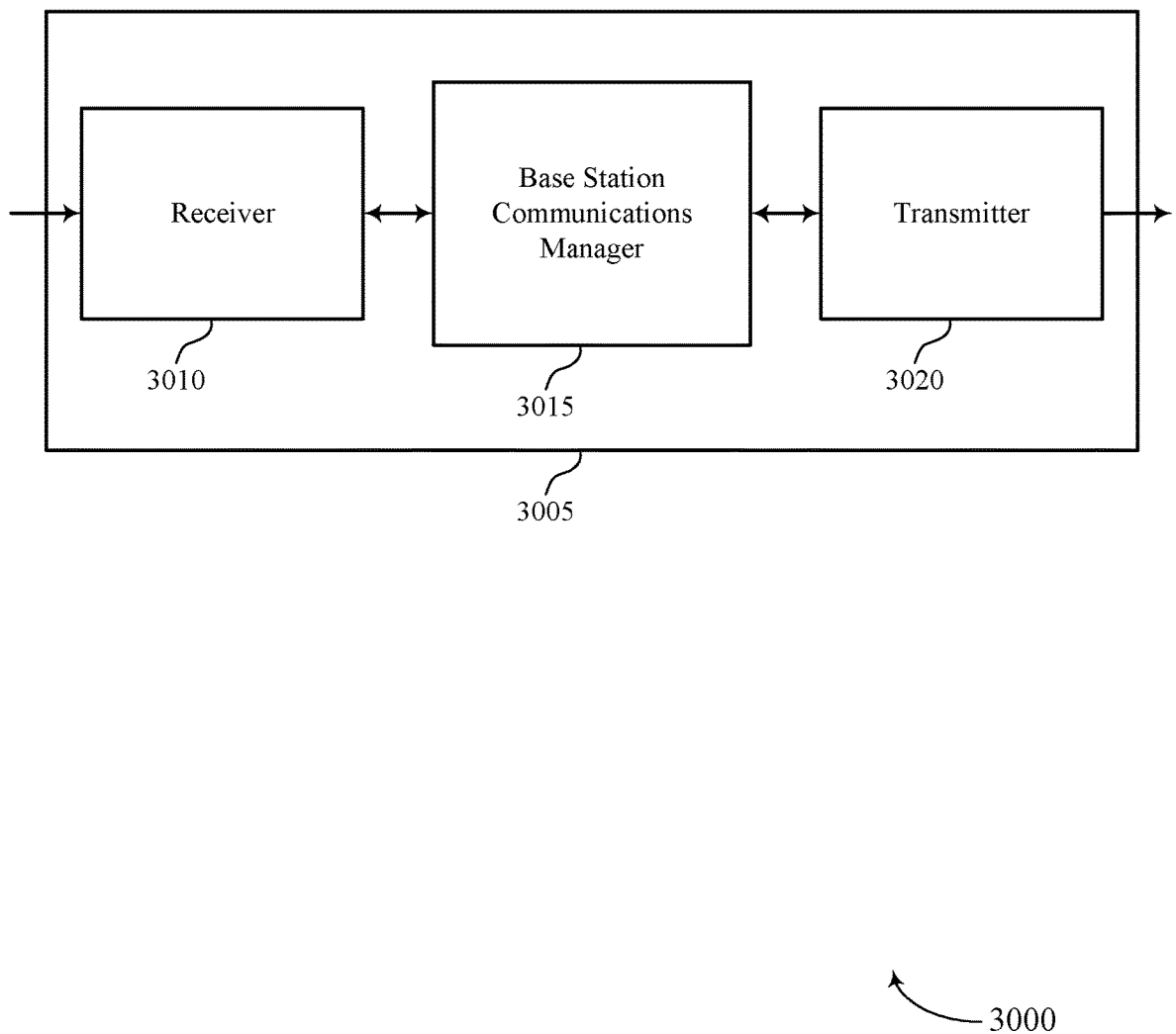
FIGS. 30 through 32 show block diagrams of a device that supports information bit distribution design in accordance with aspects of the present disclosure.

FIG. 30 shows a block diagram 3000 of a wireless device 3005 that supports polar sequence design based on coefficient reliability and improved information bit distribution in accordance with aspects of the present disclosure. Wireless device 3005 may be an example of aspects of a base station 105 as described herein. Wireless device 3005 may include receiver 3010, base station communications manager 3015, and transmitter 3020. Wireless device 3005 may also include a processor. Each of these components may be in communication with one another (e.g., via one or more buses).

Receiver 3010 may receive information such as packets, user data, or control information associated with various information channels (e.g., control channels, data channels, and information related to polar sequence design based on coefficient reliability and improved information bit distribution, etc.). Information may be passed on to other components of the device. The receiver 3010 may be an example of aspects of the transceiver 3335 described with reference to FIG. 33. The receiver 3010 may utilize a single antenna or a set of antennas.

Base station communications manager 3015 may be an example of aspects of the base station communications manager 3315 described with reference to FIG. 33.

Base station communications manager 3015 and/or at least some of its various sub-components may be implemented in hardware, software executed by a processor, firmware, or any combination thereof. If implemented in software executed by a processor, the functions of the base station communications manager 3015 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The base station communications manager 3015 and/or at least some of its various sub-components may be physically located at various positions, including being distributed such that portions of functions are implemented at different physical locations by one or more physical devices. In some examples, base station communications manager 3015 and/or at least some of its various sub-components may be a separate and distinct component in accordance with various aspects of the present disclosure. In other examples, base station communications manager 3015 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station communications manager 3015 may identify a set of information bits for encoding using a polar code having a set of bit channels, and may identify a set of bit locations of the set of bit channels of the polar code for the set of information bits based on a bit index reliability sequence, where the bit index reliability sequence may be determined based on a binary bit weighting for the set of bit channels that applies a set of weighting factors. Base station communications manager 3015 may generate a codeword according to the polar code based on the bit index reliability sequence and the set of information bits, and transmit the codeword. Additionally or alternatively, base station communications manager 3015 may determine a bit index reliability sequence for a set of bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders. Base station communications manager 3015 may generate the codeword according to the polar code based on the bit index reliability sequence and a set of information bits encoded using the polar code, and may transmit the codeword.

Transmitter 3020 may transmit signals generated by other components of the device. In some examples, the transmitter 3020 may be collocated with a receiver 3010 in a transceiver module. For example, the transmitter 3020 may be an example of aspects of the transceiver 3335 described with reference to FIG. 33. The transmitter 3020 may utilize a single antenna or a set of antennas.

Figure 31:
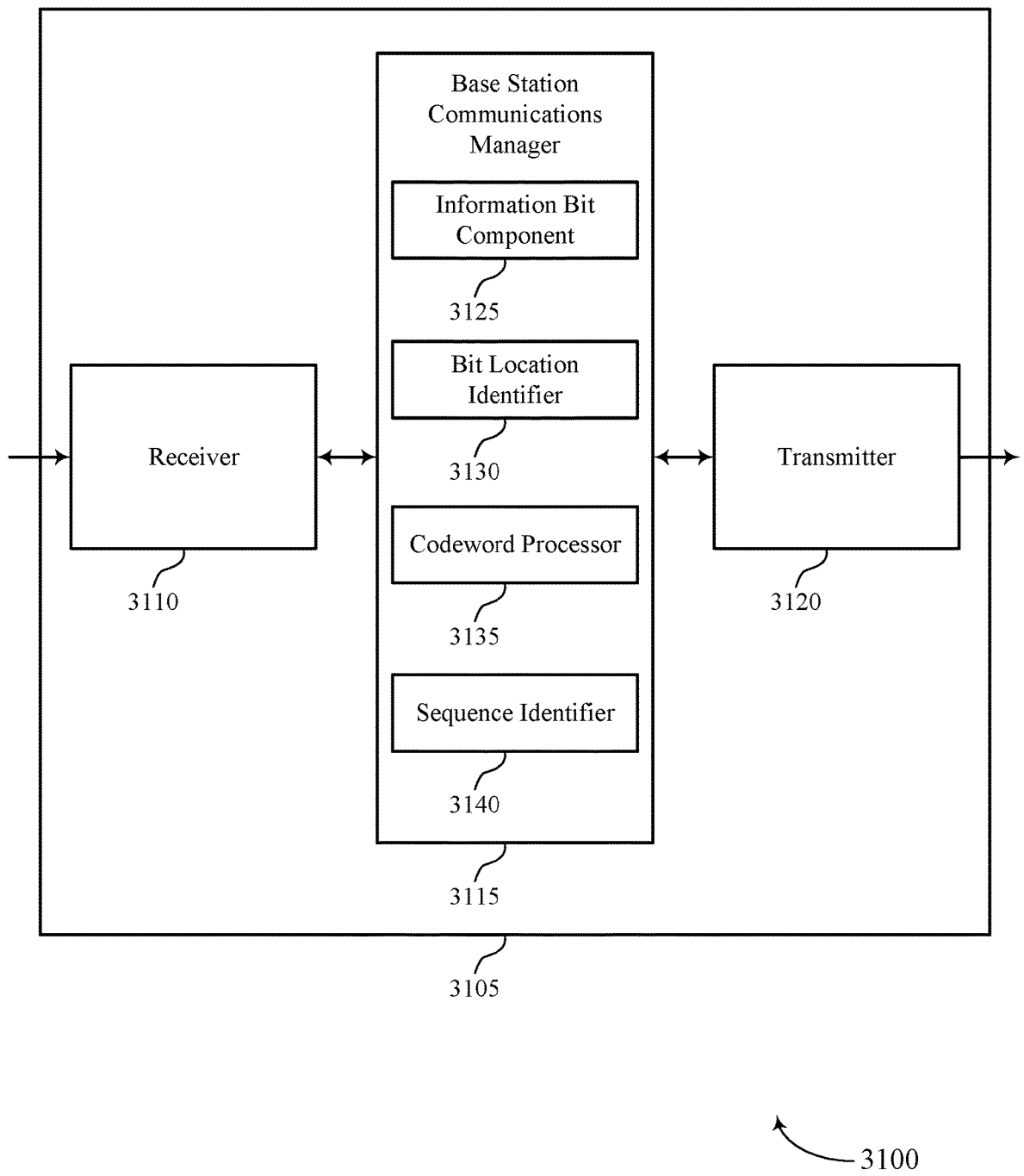

FIG. 31 shows a block diagram 3100 of a wireless device 3105 that supports polar sequence design based on coefficient reliability and improved information bit distribution in accordance with aspects of the present disclosure. Wireless device 3105 may be an example of aspects of a wireless device 3005 or a base station 105 as described with reference to FIG. 30. Wireless device 3105 may include receiver 3110, base station communications manager 3115, and transmitter 3120. Wireless device 3105 may also include a processor. Each of these components may be in communication with one another (e.g., via one or more buses).

Receiver 3110 may receive information such as packets, user data, or control information associated with various information channels (e.g., control channels, data channels, and information related to polar sequence design based on coefficient reliability and improved information bit distribution, etc.). Information may be passed on to other components of the device. The receiver 3110 may be an example of aspects of the transceiver 3335 described with reference to FIG. 33. The receiver 3110 may utilize a single antenna or a set of antennas.

Base station communications manager 3115 may be an example of aspects of the base station communications manager 3315 described with reference to FIG. 33. Base station communications manager 3115 may also include information bit component 3125, bit location identifier 3130, codeword processor 3135, and sequence identifier 3140.

Information bit component 3125 may identify a set of information bits for encoding using a polar code having a set of bit channels.

Bit location identifier 3130 may identify a set of bit locations of the set of bit channels of the polar code for the set of information bits based on a bit index reliability sequence, where the bit index reliability sequence is determined based on a binary bit weighting for the set of bit channels that applies a set of weighting factors.

In some cases, codeword processor 3135 may generate a codeword according to the polar code based on the bit index reliability sequence and the set of information bits, and may transmit the codeword. In other cases, codeword processor 3135 may generate the codeword according to the polar code based on the bit index reliability sequence and a set of information bits encoded using the polar code, and may transmit the codeword.

Sequence identifier 3140 may determine a bit index reliability sequence for a set of bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders.

Transmitter 3120 may transmit signals generated by other components of the device. In some examples, the transmitter 3120 may be collocated with a receiver 3110 in a transceiver module. For example, the transmitter 3120 may be an example of aspects of the transceiver 3335 described with reference to FIG. 33. The transmitter 3120 may utilize a single antenna or a set of antennas.

Figure 32:
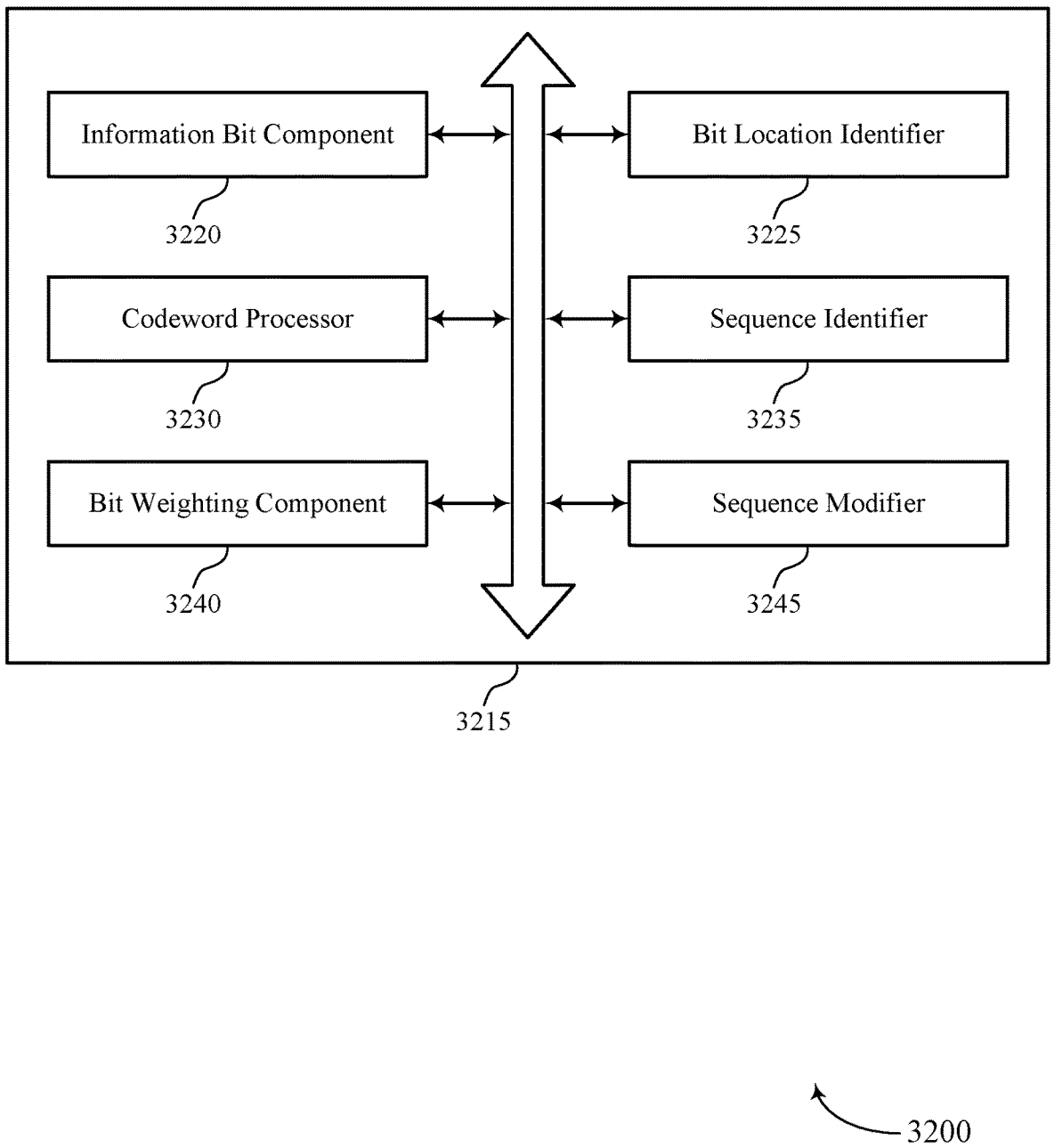

FIG. 32 shows a block diagram 3200 of a base station communications manager 3215 that supports polar sequence design based on coefficient reliability and improved information bit distribution in accordance with aspects of the present disclosure. The base station communications manager 3215 may be an example of aspects of a base station communications manager 3315 described with reference to FIGS. 30, 31, and 33. The base station communications manager 3215 may include information bit component 3220, bit location identifier 3225, codeword processor 3230, sequence identifier 3235, bit weighting component 3240, and sequence modifier 3245. Each of these modules may communicate, directly or indirectly, with one another (e.g., via one or more buses).

Information bit component 3220 may identify a set of information bits for encoding using a polar code having a set of bit channels.

Bit location identifier 3225 may identify a set of bit locations of the set of bit channels of the polar code for the set of information bits based on a bit index reliability sequence, where the bit index reliability sequence is determined based on a binary bit weighting for the set of bit channels that applies a set of weighting factors.

Codeword processor 3230 may generate a codeword according to the polar code based on the bit index reliability sequence and the set of information bits, and may transmit the codeword.

Sequence identifier 3235 may determine a bit index reliability sequence for a set of bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders.

Bit weighting component 3240 may determine the bit index reliability sequence by performing the binary bit weighting using a first weighting factor to obtain a first reliability sequence for the set of bit channels. In some cases, the bit index reliability sequence is determined by performing the binary bit weighting using a first weighting factor for a first subset of bit indices and a second weighting factor for a second subset of bit indices. In some cases, the bit index reliability sequence is determined by performing the binary bit weighting using a third weighting factor for a third subset of bit indices.

Sequence modifier 3245 may modify a subset of the first reliability sequence by performing the binary bit weighting using a second weighting factor to obtain a second reliability sequence for the subset of the first reliability sequence. In some cases, the bit index reliability sequence is determined by modifying a subset of the second reliability sequence by performing the binary bit weighting using a third weighting factor to obtain a third reliability sequence for the subset of the second reliability sequence. In some cases, the subset of the first reliability sequence includes the set of bit channels having lowest bit-channel indices in the first reliability sequence. In other cases, the subset of the first reliability sequence includes the set of bit channels having highest bit-channel indices in the first reliability sequence.

Figure 33:
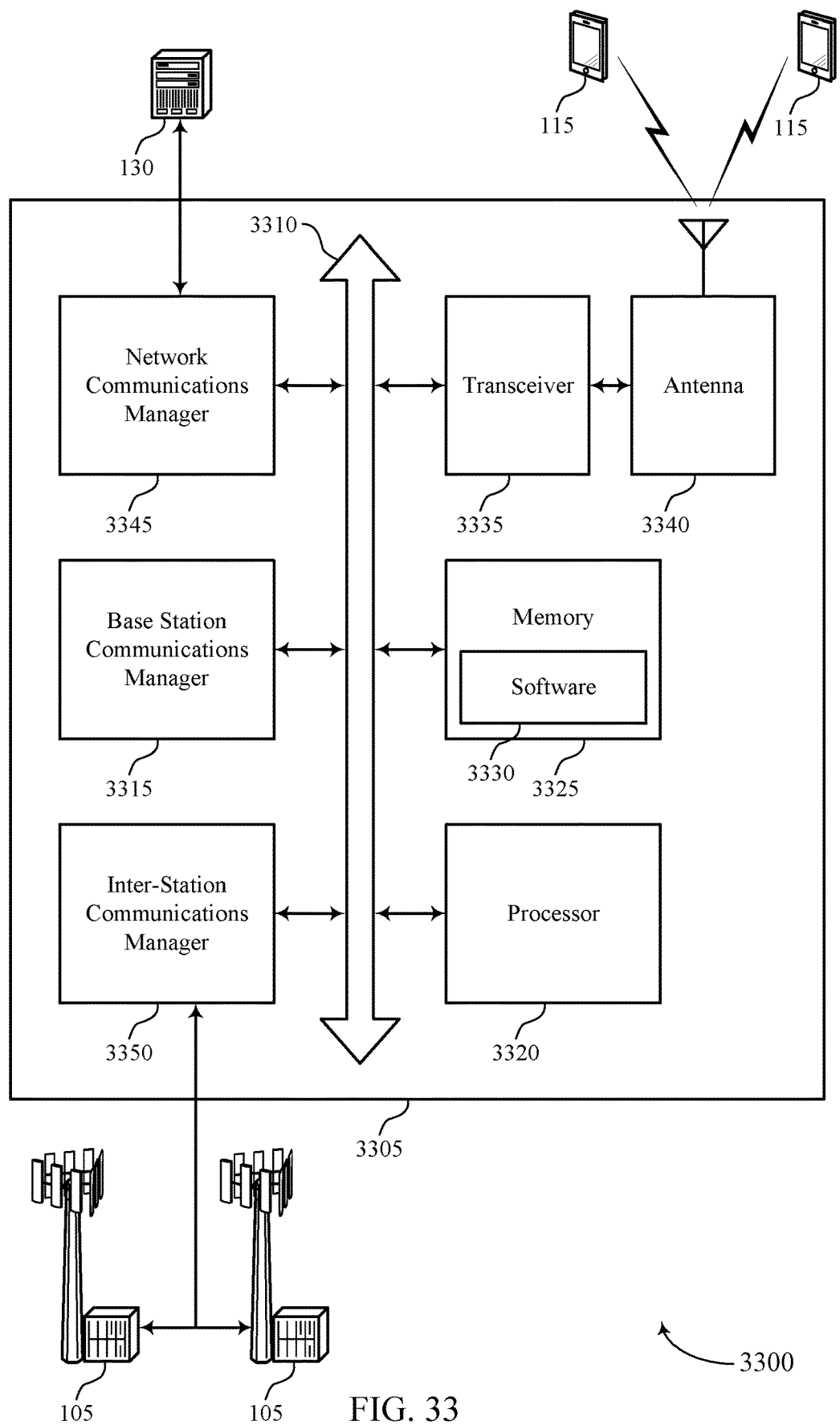
FIG. 33 illustrates a block diagram of a system including a base station that supports information bit distribution design in accordance with aspects of the present disclosure.

FIG. 33 shows a diagram of a system 3300 including a device 3305 that supports polar sequence design based on coefficient reliability and improved information bit distribution in accordance with aspects of the present disclosure. Device 3305 may be an example of or include the components of base station 105 as described above, e.g., with reference to FIG. 1. Device 3305 may include components for bi-directional voice and data communications including components for transmitting and receiving communications, including base station communications manager 3315, processor 3320, memory 3325, software 3330, transceiver 3335, antenna 3340, network communications manager 3345, and inter-station communications manager 3350. These components may be in electronic communication via one or more buses (e.g., bus 3310). Device 3305 may communicate wirelessly with one or more UEs 115.

Processor 3320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 3320 may be configured to operate a memory array using a memory controller. In other cases, a memory controller may be integrated into processor 3320. Processor 3320 may be configured to execute computer-readable instructions stored in a memory to perform various functions (e.g., functions or tasks supporting polar sequence design based on coefficient reliability and improved information bit distribution).

Memory 3325 may include RAM and ROM. The memory 3325 may store computer-readable, computer-executable software 3330 including instructions that, when executed, cause the processor to perform various functions described herein. In some cases, the memory 3325 may contain, among other things, a BIOS which may control basic hardware or software operation such as the interaction with peripheral components or devices.

Software 3330 may include code to implement aspects of the present disclosure, including code to support polar sequence design based on coefficient reliability and improved information bit distribution. Software 3330 may be stored in a non-transitory computer-readable medium such as system memory or other memory. In some cases, the software 3330 may not be directly executable by the processor but may cause a computer (e.g., when compiled and executed) to perform functions described herein.

Transceiver 3335 may communicate bi-directionally, via one or more antennas, wired, or wireless links as described above. For example, the transceiver 3335 may represent a wireless transceiver and may communicate bi-directionally with another wireless transceiver. The transceiver 3335 may also include a modem to modulate the packets and provide the modulated packets to the antennas for transmission, and to demodulate packets received from the antennas.

In some cases, the wireless device may include a single antenna 3340. However, in some cases the device may have more than one antenna 3340, which may be capable of concurrently transmitting or receiving multiple wireless transmissions.

Network communications manager 3345 may manage communications with the core network (e.g., via one or more wired backhaul links). For example, the network communications manager 3345 may manage the transfer of data communications for client devices, such as one or more UEs 115.

Inter-station communications manager 3350 may manage communications with other base station 105, and may include a controller or scheduler for controlling communications with UEs 115 in cooperation with other base stations 105. For example, the inter-station communications manager 3350 may coordinate scheduling for transmissions to UEs 115 for various interference mitigation techniques such as beamforming or joint transmission. In some examples, inter-station communications manager 3350 may provide an X2 interface within an LTE/LTE-A wireless communication network technology to provide communication between base stations 105.

Figure 34:
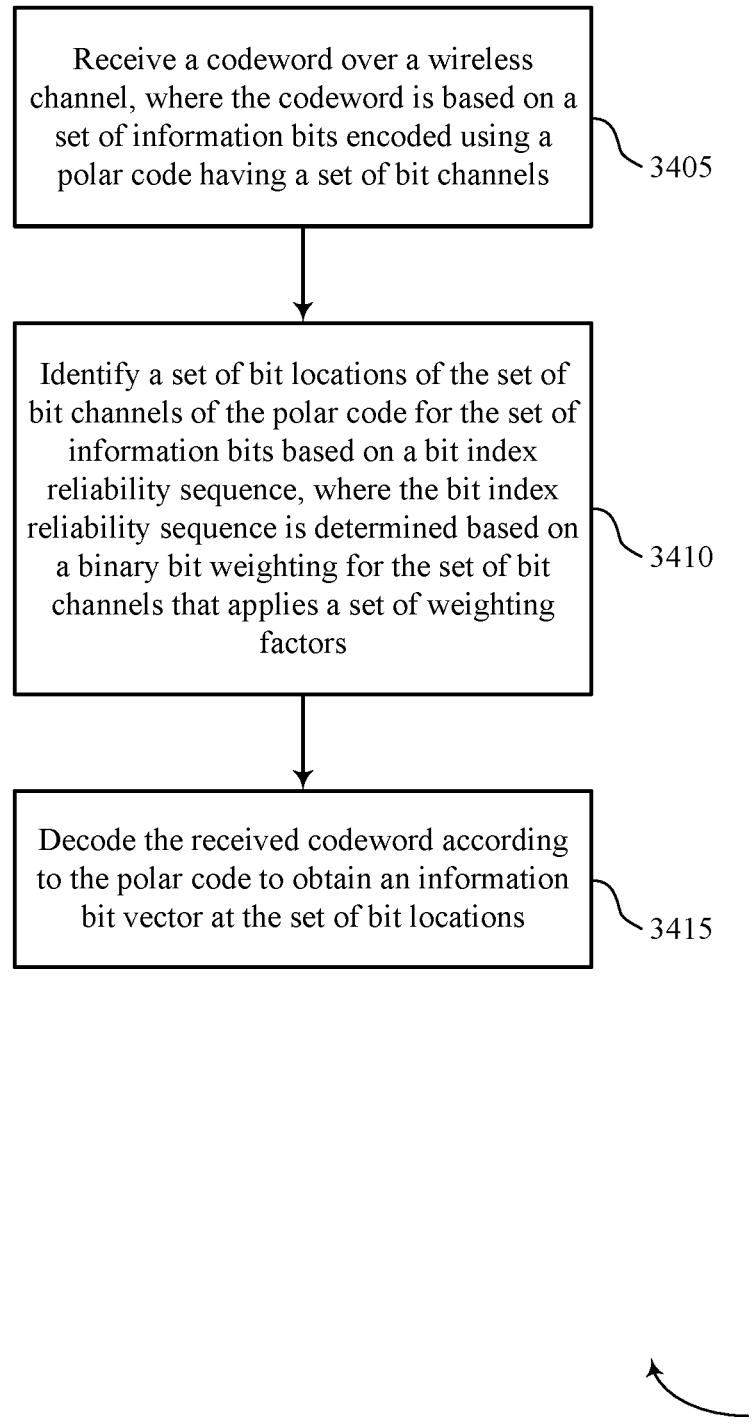
FIGS. 34 through 37 illustrate methods for information bit distribution design in accordance with aspects of the present disclosure.

FIG. 34 shows a flowchart illustrating a method 3400 for polar sequence design based on coefficient reliability and improved information bit distribution in accordance with aspects of the present disclosure. The operations of method 3400 may be implemented by a UE 115 or its components as described herein. For example, the operations of method 3400 may be performed by a UE communications manager as described with reference to FIGS. 26 through 29. In some examples, a UE 115 may execute a set of codes to control the functional elements of the device to perform the functions described below. Additionally or alternatively, the UE 115 may perform aspects of the functions described below using special-purpose hardware.

At 3405 the UE 115 may receive a codeword over a wireless channel, where the codeword is based on multiple information bits encoded using a polar code having multiple bit channels. The operations of 3405 may be performed according to the methods described herein. In certain examples, aspects of the operations of 3405 may be performed by a codeword processor as described with reference to FIGS. 26 through 29.

At 3410 the UE 115 may identify a set of bit locations of the multiple bit channels of the polar code for the multiple information bits based on a bit index reliability sequence, where the bit index reliability sequence is determined based on a binary bit weighting for the multiple bit channels that applies multiple weighting factors. The operations of 3410 may be performed according to the methods described herein. In certain examples, aspects of the operations of 3410 may be performed by a bit location identifier as described with reference to FIGS. 26 through 29.

At 3415 the UE 115 may decode the received codeword according to the polar code to obtain an information bit vector at the set of bit locations. The operations of 3415 may be performed according to the methods described herein. In certain examples, aspects of the operations of 3415 may be performed by a decoder as described with reference to FIGS. 26 through 29.

Figure 35:
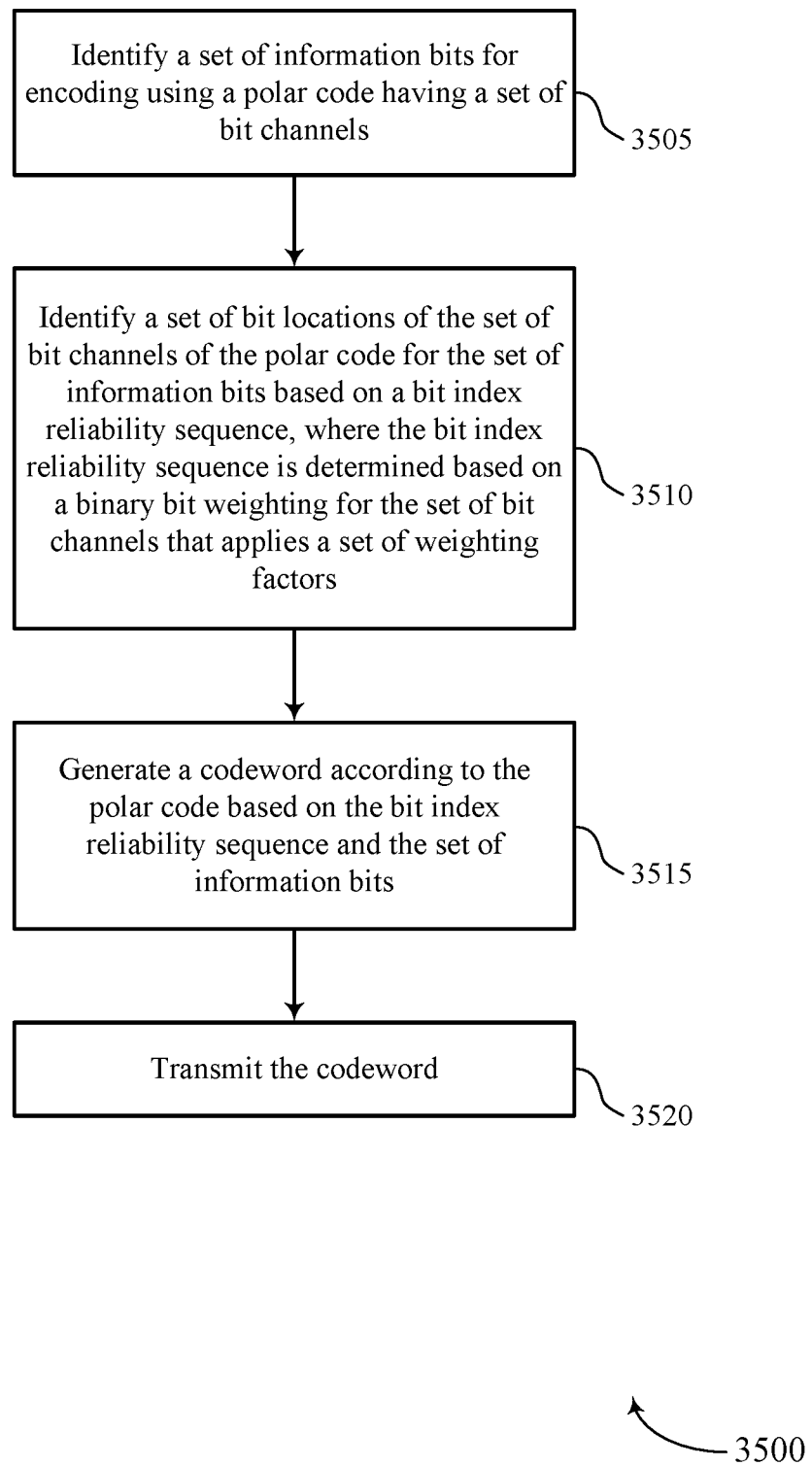

FIG. 35 shows a flowchart illustrating a method 3500 for polar sequence design based on coefficient reliability and improved information bit distribution in accordance with aspects of the present disclosure. The operations of method 3500 may be implemented by a base station 105 or its components as described herein. For example, the operations of method 3500 may be performed by a base station communications manager as described with reference to FIGS. 30 through 33. In some examples, a base station 105 may execute a set of codes to control the functional elements of the device to perform the functions described below. Additionally or alternatively, the base station 105 may perform aspects of the functions described below using special-purpose hardware.

At 3505 the base station 105 may identify multiple information bits for encoding using a polar code having multiple bit channels. The operations of 3505 may be performed according to the methods described herein. In certain examples, aspects of the operations of 3505 may be performed by an information bit component as described with reference to FIGS. 30 through 33.

At 3510 the base station 105 may identify a set of bit locations of the multiple bit channels of the polar code for the multiple information bits based on a bit index reliability sequence, where the bit index reliability sequence is determined based on a binary bit weighting for the multiple bit channels that applies multiple weighting factors. The operations of 3510 may be performed according to the methods described herein. In certain examples, aspects of the operations of 3510 may be performed by a bit location identifier as described with reference to FIGS. 30 through 33.

At 3515 the base station 105 may generate a codeword according to the polar code based on the bit index reliability sequence and the multiple information bits. The operations of 3515 may be performed according to the methods described herein. In certain examples, aspects of the operations of 3515 may be performed by a codeword processor as described with reference to FIGS. 30 through 33.

At 3520 the base station 105 may transmit the codeword. The operations of 3520 may be performed according to the methods described herein. In certain examples, aspects of the operations of 3520 may be performed by a codeword processor as described with reference to FIGS. 30 through 33.

Figure 36:
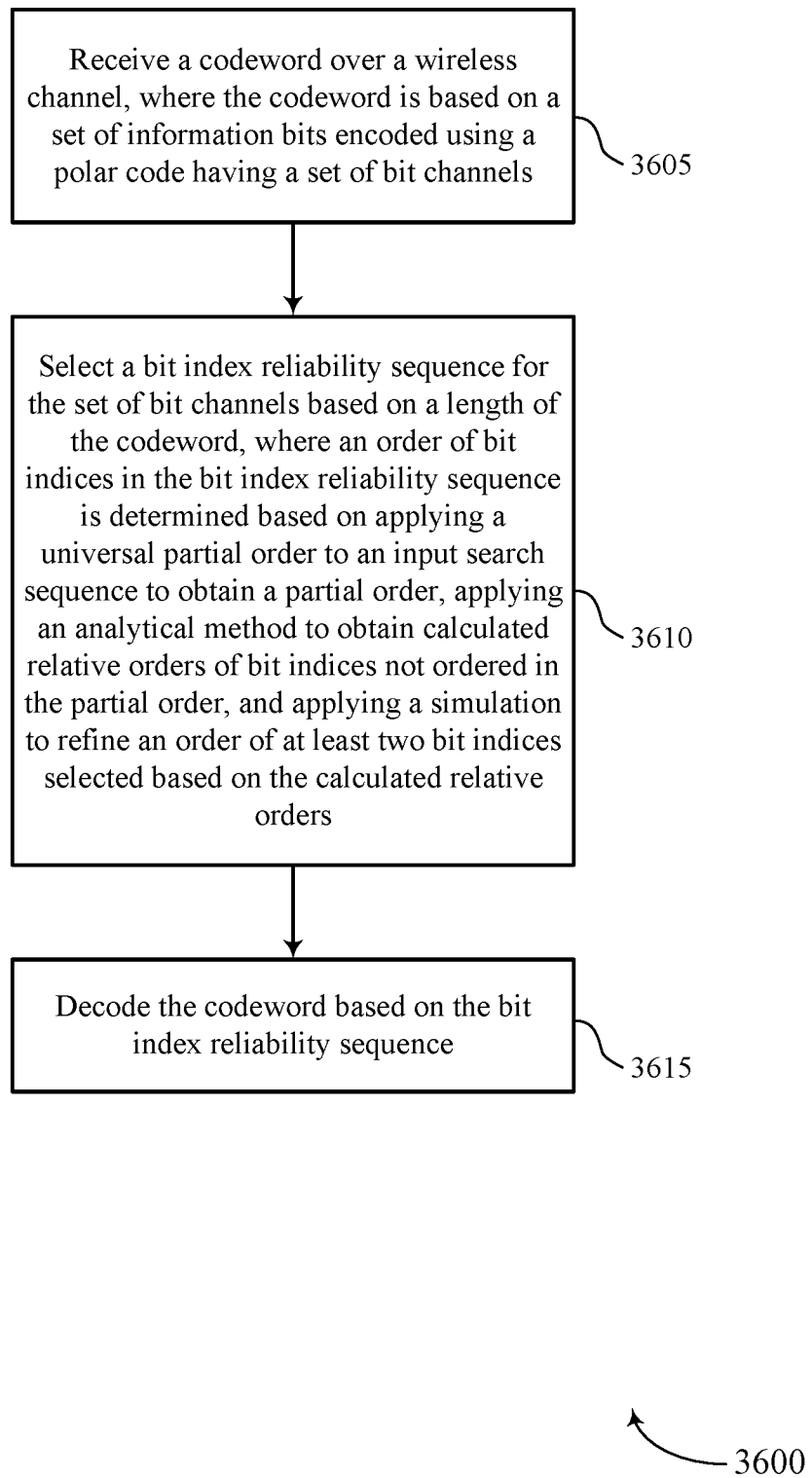

FIG. 36 shows a flowchart illustrating a method 3600 for polar sequence design based on coefficient reliability and improved information bit distribution in accordance with aspects of the present disclosure. The operations of method 3600 may be implemented by a UE 115 or its components as described herein. For example, the operations of method 3600 may be performed by a UE communications manager as described with reference to FIGS. 26 through 29. In some examples, a UE 115 may execute a set of codes to control the functional elements of the device to perform the functions described below. Additionally or alternatively, the UE 115 may perform aspects of the functions described below using special-purpose hardware.

At 3605 the UE 115 may receive a codeword over a wireless channel, where the codeword is based on multiple information bits encoded using a polar code having multiple bit channels. The operations of 3605 may be performed according to the methods described herein. In certain examples, aspects of the operations of 3605 may be performed by a codeword processor as described with reference to FIGS. 26 through 29.

At 3610 the UE 115 may select a bit index reliability sequence for the multiple bit channels based on a length of the codeword, where an order of bit indices in the bit index reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders. The operations of 3610 may be performed according to the methods described herein. In certain examples, aspects of the operations of 3610 may be performed by a sequence identifier as described with reference to FIGS. 26 through 29.

At 3615 the UE 115 may decode the codeword based on the bit index reliability sequence. The operations of 3615 may be performed according to the methods described herein. In certain examples, aspects of the operations of 3615 may be performed by a decoder as described with reference to FIGS. 26 through 29.

Figure 37:
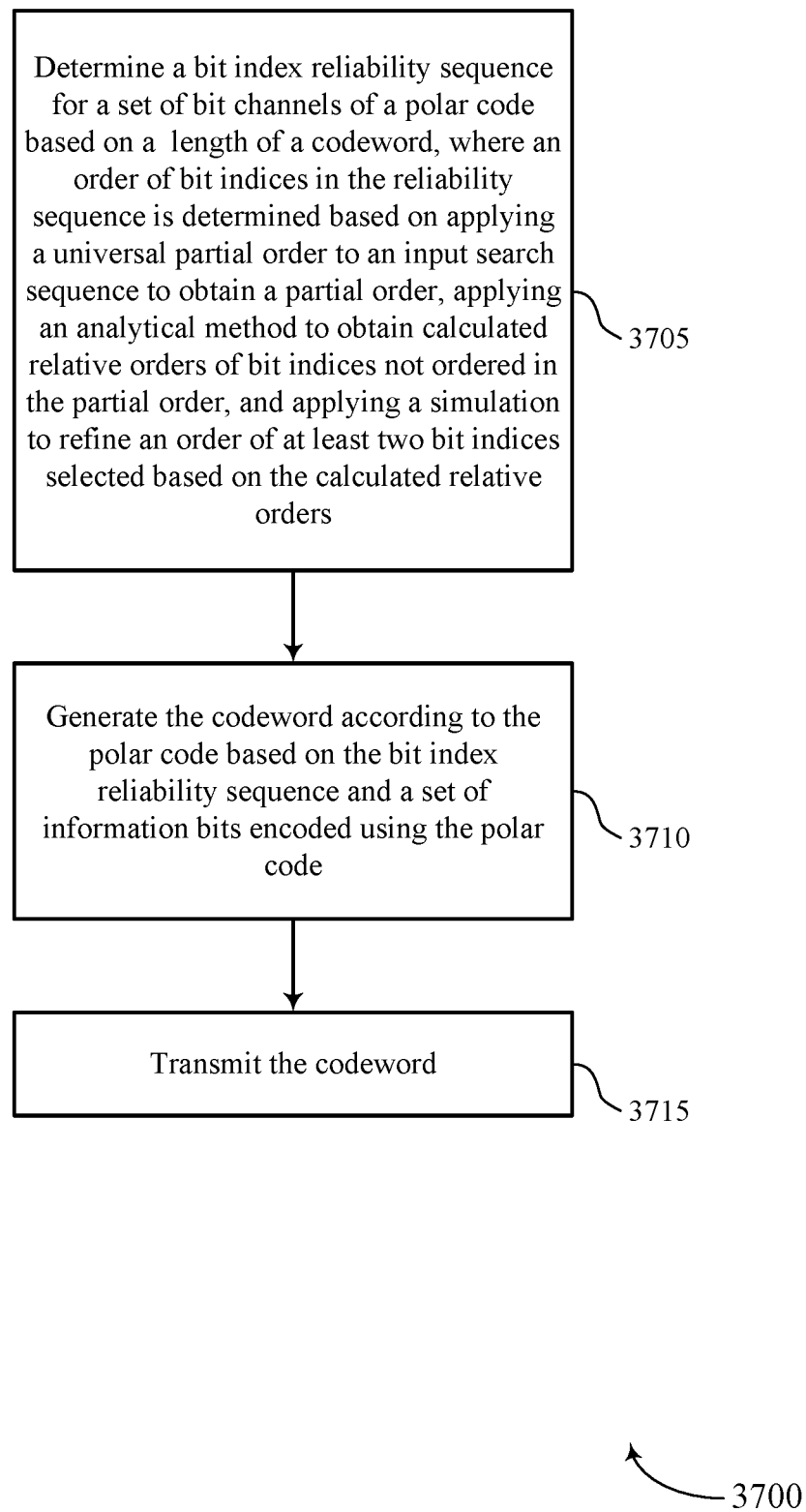

FIG. 37 shows a flowchart illustrating a method 3700 for polar sequence design based on coefficient reliability and improved information bit distribution in accordance with aspects of the present disclosure. The operations of method 3700 may be implemented by a base station 105 or its components as described herein. For example, the operations of method 3700 may be performed by a base station communications manager as described with reference to FIGS. 30 through 33. In some examples, a base station 105 may execute a set of codes to control the functional elements of the device to perform the functions described below. Additionally or alternatively, the base station 105 may perform aspects of the functions described below using special-purpose hardware.

At 3705 the base station 105 may determine a bit index reliability sequence for multiple bit channels of a polar code based on a length of a codeword, where an order of bit indices in the reliability sequence is determined based on applying a UPO to an input search sequence to obtain a partial order, applying an analytical method to obtain calculated relative orders of bit indices not ordered in the partial order, and applying a simulation to refine an order of at least two bit indices selected based on the calculated relative orders. The operations of 3705 may be performed according to the methods described herein. In certain examples, aspects of the operations of 3705 may be performed by a sequence identifier as described with reference to FIGS. 30 through 33.

At 3710 the base station 105 may generate the codeword according to the polar code based on the bit index reliability sequence and multiple information bits encoded using the polar code. The operations of 3710 may be performed according to the methods described herein. In certain examples, aspects of the operations of 3710 may be performed by a codeword processor as described with reference to FIGS. 30 through 33.

At 3715 the base station 105 may transmit the codeword. The operations of 3715 may be performed according to the methods described herein. In certain examples, aspects of the operations of 3715 may be performed by a codeword processor as described with reference to FIGS. 30 through 33.

It is to be understood that although the diagrams, devices, and modules described above often describe a base station 105 encoding a signal and a UE 115 decoding a signal, the roles of these devices may be reversed or interchanged. For example, a UE 115 may contain one or more of the components and/or modules described above with respect to a base station 105 in order to encode a codeword according to the described techniques. Similarly, a base station 105 may contain one or more of the components and/or modules described above with respect to a UE 115 in order to decode a received codeword.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
receiving a codeword over a wireless channel, wherein the codeword is based on a plurality of information bits encoded using a polar code having a plurality of bit channels;
selecting a bit index reliability sequence for the plurality of bit channels based on a length of the codeword, wherein an order of bit indices in the bit index reliability sequence is determined based on applying a universal partial order (UPO) to an input search sequence to obtain a partial order, applying an analytical method to obtain calculated orders of bit indices that are unordered relative to one another in the partial order, and applying a simulation to refine an order of at least two bit indices selected based on the calculated orders; and
decoding the codeword based on the bit index reliability sequence.

2. The method of claim 1, wherein decoding the codeword comprises:
applying a successive cancellation list decoding algorithm to a signal that comprises the codeword.

3. The method of claim 2, wherein the simulation is based on a list size applied by the successive cancellation list decoding algorithm.

4. The method of claim 1, wherein the simulation is a link-level performance simulation.

5. The method of claim 1, wherein the length of the codeword is 128 bits, and the bit index reliability sequence is:
[127, 126, 125, 123, 119, 111, 124, 95, 122, 121, 118, 63, 117, 110, 115, 109, 94, 107, 93, 62, 103, 120, 91, 116, 61, 87, 114, 59, 108, 79, 113, 55, 106, 92, 47, 105, 102, 31, 90, 101, 89, 60, 86, 99, 58, 85, 78, 112, 57, 54, 83, 77, 104, 53, 46, 75, 100, 51, 45, 71, 88, 30, 98, 43, 84, 29, 97, 39, 27, 56, 82, 76, 23, 52, 15, 81, 74, 44, 50, 73, 70, 42, 49, 69, 28, 96, 41, 67, 38, 26, 37, 25, 22, 80, 35, 21, 72, 14, 48, 19, 13, 68, 40, 11, 7, 66, 36, 24, 65, 34, 20, 33, 18, 12, 17, 10, 9, 6, 64, 5, 3, 32, 16, 8, 4, 2, 1, 0].

6. The method of claim 1, wherein the length of the codeword is 256 bits, and the bit index reliability sequence is:
[255, 254, 253, 251, 247, 239, 252, 223, 250, 249, 246, 191, 245, 238, 243, 237, 127, 222, 235, 221, 248, 190, 231, 219, 244, 189, 215, 242, 126, 187, 236, 207, 241, 125, 234, 183, 220, 233, 123, 230, 175, 218, 229, 119, 159, 214, 217, 111, 188, 227, 186, 213, 95, 206, 240, 185, 211, 182, 124, 205, 203, 232, 181, 63, 174, 122, 228, 179, 199, 121, 173, 216, 158, 118, 226, 117, 171, 212, 110, 157, 225, 115, 167, 184, 204, 109, 155, 210, 94, 180, 107, 151, 209, 202, 93, 143, 178, 62, 172, 103, 201, 61, 198, 120, 177, 91, 170, 197, 87, 116, 156, 195, 114, 169, 79, 59, 166, 224, 108, 154, 113, 165, 55, 153, 106, 208, 150, 92, 163, 47, 102, 149, 200, 105, 90, 142, 31, 101, 176, 147, 89, 141, 196, 86, 60, 99, 139, 168, 85, 58, 194, 78, 135, 57, 164, 83, 112, 54, 77, 152, 193, 46, 53, 162, 104, 75, 148, 51, 100, 71, 45, 161, 30, 146, 140, 88, 43, 98, 29, 145, 138, 84, 39, 97, 27, 137, 82, 56, 76, 23, 134, 192, 133, 52, 15, 81, 74, 50, 44, 131, 73, 70, 160, 42, 49, 69, 28, 144, 41, 67, 26, 38, 96, 136, 37, 25, 22, 132, 35, 80, 21, 14, 72, 130, 19, 13, 48, 68, 11, 129, 40, 7, 66, 36, 24, 65, 34, 20, 33, 18, 12, 17, 10, 128, 6, 9, 5, 64, 3, 32, 16, 8, 4, 2, 1, 0].

7. The method of claim 1, wherein the length of the codeword is 512 bits, and at least a portion of the bit index reliability sequence is:
[511, 510, 509, 507, 503, 495, 508, 479, 506, 505, 502, 447, 501, 494, 499, 493, 383, 478, 491, 477, 504, 487, 475, 446, 500, 255, 445, 471, 498, 492, 443, 497, 382, 463, 490, 439, 381, 476, 489, 486, 379, 474, 431, 485, 473, 254, 444, 375, 470, 483, 253, 415, 442, 469, 496, 367, 462, 251, 441, 467, 438, 380, 461, 247, 351, 488, 430, 459, 239, 437, 378, 319, 435, 484, 223, 429, 455, 377, 472, 374, 414, 482, 252, 427, 373, 191, 468, 366, 413, 466, 423, 250, 481, 371, 440, 365, 411, 460, 249, 350, 246, 436, 407, 349, 458, 465, 363, 238, 399, 127, 434, 428, 245, 359, 454, 318, 457, 376, 347, 243, 433, 237, 426, 453, 222, 343, 372, 412, 317, 235, 425, 451, 370, 315, 422, 221, 480, 364, 335, 410, 231, 190, 369, 421, 311, 409, 219, 248, 464, 362, 406, 348, 419, 189, 244, 303, 358, 215, 405, 456, 361, 398, 126, 242, 346, 187, 236, 403, 357, 316, 432, 207, 287, 397, 452, 342, 125, 345, 234, 241, 123, 355, 395, 424, 183, 314, 341, 220, 450, 233, 391, 334, 230, 420, 175, 313, 218, 119, 339, 368, 310, 408, 229, 333, 449, 214, 159, 217, 309, 360, 331, 418, 188, 227, 302, 404, 111, 213, 307].

8. The method of claim 1, wherein the analytical method comprises an index polarization weight rule, or a Reed-Muller rule, or a density evolution (DE) rule, or a mutual information-DE (MI-DE) rule, or any combination thereof.

9. The method of claim 1, wherein the order of bit indices in the bit index reliability sequence is further determined based on selecting a bit index from the input search sequence based on the partial order, the method further comprising:
adding the selected bit index to the bit index reliability sequence.

10. The method of claim 9, further comprising:
removing the selected bit index from the input search sequence to generate an input search subsequence;
calculating a second partial order under the UPO of the input search subsequence; and
selecting a bit index from the input search subsequence based on the second partial order.

11. The method of claim 1, wherein the UPO comprises a first property and a second property, and wherein the calculated orders of bit indices violate at least one of the first property or the second property.

12. The method of claim 1, further comprising:
modifying a portion of the bit index reliability sequence using a second sequence to generate a modified bit index reliability sequence, wherein decoding the codeword comprises:
decoding the codeword based on the modified bit index reliability sequence.

13. A method for wireless communication, comprising:
determining a bit index reliability sequence for a plurality of bit channels of a polar code based on a length of a codeword, wherein an order of bit indices in the bit index reliability sequence is determined based on applying a universal partial order (UPO) to an input search sequence to obtain a partial order, applying an analytical method to obtain calculated orders of bit indices that are unordered relative to one another in the partial order, and applying a simulation to refine an order of at least two bit indices selected based on the calculated orders;

generating the codeword according to the polar code based on the bit index reliability sequence and a plurality of information bits encoded using the polar code; and transmitting the codeword.

14. The method of claim 13, wherein the simulation is a link-level performance simulation.

15. The method of claim 13, wherein the length of the codeword is 128 bits, and the bit index reliability sequence is:

[127, 126, 125, 123, 119, 111, 124, 95, 122, 121, 118, 63, 117, 110, 115, 109, 94, 107, 93, 62, 103, 120, 91, 116, 61, 87, 114, 59, 108, 79, 113, 55, 106, 92, 47, 105, 102, 31, 90, 101, 89, 60, 86, 99, 58, 85, 78, 112, 57, 54, 83, 77, 104, 53, 46, 75, 100, 51, 45, 71, 88, 30, 98, 43, 84, 29, 97, 39, 27, 56, 82, 76, 23, 52, 15, 81, 74, 44, 50, 73, 70, 42, 49, 69, 28, 96, 41, 67, 38, 26, 37, 25, 22, 80, 35, 21, 72, 14, 48, 19, 13, 68, 40, 11, 7, 66, 36, 24, 65, 34, 20, 33, 18, 12, 17, 10, 9, 6, 64, 5, 3, 32, 16, 8, 4, 2, 1, 0].

16. The method of claim 13, wherein the length of the codeword is 256 bits, and the bit index reliability sequence is:

[255, 254, 253, 251, 247, 239, 252, 223, 250, 249, 246, 191, 245, 238, 243, 237, 127, 222, 235, 221, 248, 190, 231, 219, 244, 189, 215, 242, 126, 187, 236, 207, 241, 125, 234, 183, 220, 233, 123, 230, 175, 218, 229, 119, 159, 214, 217, 111, 188, 227, 186, 213, 95, 206, 240, 185, 211, 182, 124, 205, 203, 232, 181, 63, 174, 122, 228, 179, 199, 121, 173, 216, 158, 118, 226, 117, 171, 212, 110, 157, 225, 115, 167, 184, 204, 109, 155, 210, 94, 180, 107, 151, 209, 202, 93, 143, 178, 62, 172, 103, 201, 61, 198, 120, 177, 91, 170, 197, 87, 116, 156, 195, 114, 169, 79, 59, 166, 224, 108, 154, 113, 165, 55, 153, 106, 208, 150, 92, 163, 47, 102, 149, 200, 105, 90, 142, 31, 101, 176, 147, 89, 141, 196, 86, 60, 99, 139, 168, 85, 58, 194, 78, 135, 57, 164, 83, 112, 54, 77, 152, 193, 46, 53, 162, 104, 75, 148, 51, 100, 71, 45, 161, 30, 146, 140, 88, 43, 98, 29, 145, 138, 84, 39, 97, 27, 137, 82, 56, 76, 23, 134, 192, 133, 52, 15, 81, 74, 50, 44, 131, 73, 70, 160, 42, 49, 69, 28, 144, 41, 67, 26, 38, 96, 136, 37, 25, 22, 132, 35, 80, 21, 14, 72, 130, 19, 13, 48, 68, 11, 129, 40, 7, 66, 36, 24, 65, 34, 20, 33, 18, 12, 17, 10, 128, 6, 9, 5, 64, 3, 32, 16, 8, 4, 2, 1, 0].

17. The method of claim 13, wherein the length of the codeword is 512 bits, and a portion of the bit index reliability sequence is:

[511, 510, 509, 507, 503, 495, 508, 479, 506, 505, 502, 447, 501, 494, 499, 493, 383, 478, 491, 477, 504, 487, 475, 446, 500, 255, 445, 471, 498, 492, 443, 497, 382, 463, 490, 439, 381, 476, 489, 486, 379, 474, 431, 485, 473, 254, 444, 375, 470, 483, 253, 415, 442, 469, 496, 367, 462, 251, 441, 467, 438, 380, 461, 247, 351, 488, 430, 459, 239, 437, 378, 319, 435, 484, 223, 429, 455, 377, 472, 374, 414, 482, 252, 427, 373, 191, 468, 366, 413, 466, 423, 250, 481, 371, 440, 365, 411, 460, 249, 350, 246, 436, 407, 349, 458, 465, 363, 238, 399, 127, 434, 428, 245, 359, 454, 318, 457, 376, 347, 243, 433, 237, 426, 453, 222, 343, 372, 412, 317, 235, 425, 451, 370, 315, 422, 221, 480, 364, 335, 410, 231, 190, 369, 421, 311, 409, 219, 248, 464, 362, 406, 348, 419, 189, 244, 303, 358, 215, 405, 456, 361, 398, 126, 242, 346, 187, 236, 403, 357, 316, 432, 207, 287, 397, 452, 342, 125, 345, 234, 241, 123, 355, 395, 424, 183, 314, 341, 220, 450, 233, 391, 334, 230, 420, 175, 313, 218, 119, 339, 368, 310, 408, 229, 333, 449, 214, 159, 217, 309, 360, 331, 418, 188, 227, 302, 404, 111, 213, 307].

18. The method of claim 13, wherein the analytical method comprises an index polarization weight rule, or a Reed-Muller rule, or a density evolution (DE) rule, or a mutual information-DE (MI-DE) rule, or any combination thereof.

19. The method of claim 13, wherein the order of bit indices in the bit index reliability sequence is further determined based on selecting a bit index from the input search sequence based on the partial order, the method further comprising:

adding the selected bit index to the bit index reliability sequence.

20. The method of claim 19, further comprising:

removing the selected bit index from the input search sequence to generate an input search subsequence;

calculating a second partial order under the UPO of the input search subsequence; and selecting a bit index from the input search subsequence based on the second partial order.

21. The method of claim 13, wherein the UPO comprises a first property and a second property, and wherein the calculated orders of bit indices violate at least one of the first property or the second property.

22. The method of claim 13, further comprising:

modifying a portion of the bit index reliability sequence using a second sequence to generate a modified bit index reliability sequence, wherein generating the codeword comprises:

generating the codeword based on the modified bit index reliability sequence.

23. A method for wireless communication, comprising:

identifying a plurality of information bits for encoding using a polar code having a plurality of bit channels;

identifying a set of bit locations of the plurality of bit channels of the polar code for the plurality of information bits based on a bit index reliability sequence, wherein the bit index reliability sequence is determined based on a binary bit weighting for the plurality of bit channels that applies a plurality of weighting factors;

generating a codeword according to the polar code based on the bit index reliability sequence and the plurality of information bits; and transmitting the codeword.

24. The method of claim 23, wherein the bit index reliability sequence is determined based on performing the binary bit weighting using a first weighting factor to obtain a first reliability sequence for the plurality of bit channels, the method further comprising:

modifying a subset of the first reliability sequence by performing the binary bit weighting using a second weighting factor to obtain a second reliability sequence for the subset of the first reliability sequence.

25. The method of claim 24, wherein the bit index reliability sequence is determined based on:

modifying a subset of the second reliability sequence by performing the binary bit weighting using a third weighting factor to obtain a third reliability sequence for the subset of the second reliability sequence.

26. The method of claim 24, wherein the subset of the first reliability sequence comprises a plurality of bit channels having lowest bit channel indices in the first reliability sequence.

27. The method of claim 24, wherein the subset of the first reliability sequence comprises a plurality of bit channels having highest bit channel indices in the first reliability sequence.

28. The method of claim 23, wherein the bit index reliability sequence is determined based on:
performing the binary bit weighting using a first weighting factor for a first subset of bit indices and a second weighting factor for a second subset of bit indices.

29. The method of claim 28, wherein the bit index reliability sequence is determined based on:
performing the binary bit weighting using a third weighting factor for a third subset of bit indices.

30. A memory of an apparatus, instructions stored in the memory and operable, when executed by a processor of the apparatus, to cause the apparatus to receive, over a wireless channel, a codeword that is based on a plurality of information bits encoded using a polar code having a plurality of bit channels, select a bit index reliability sequence for the plurality of bit channels based on a length of the codeword, and decode the codeword based on the bit index reliability sequence, wherein an order of bit indices in the bit index reliability sequence is determined by a process comprising:
applying a universal partial order (UPO) to an input search sequence to obtain a partial order;
applying an analytical method to obtain calculated orders of bit indices that are unordered relative to one another in the partial order; and
applying a simulation to refine an order of at least two bit indices selected based on the calculated orders.

\* \* \* \* \*